(12) United States Patent
Gross et al.

(10) Patent No.: US 11,963,320 B2
(45) Date of Patent: *Apr. 16, 2024

(54) GLASS-BASED ARTICLES INCLUDING A STRESS PROFILE COMPRISING TWO REGIONS

(71) Applicant: CORNING INCORPORATED, Corning, NY (US)

(72) Inventors: Timothy Michael Gross, Painted Post, NY (US); Xiaoju Guo, Pittsford, NY (US); Pascale Oram, Hammondsport, NY (US); Kevin Barry Reiman, Horseheads, NY (US); Rostislav Vatchev Roussev, Painted Post, NY (US); Vitor Marino Schneider, Painted Post, NY (US); Trevor Edward Wilantewicz, Sunnyvale, CA (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/961,188

(22) Filed: Oct. 6, 2022

(65) Prior Publication Data

US 2023/0057346 A1 Feb. 23, 2023

Related U.S. Application Data

(62) Division of application No. 16/294,022, filed on Mar. 6, 2019, now abandoned, which is a division of
(Continued)

(51) Int. Cl.
*H05K 5/02* (2006.01)
*C03C 3/093* (2006.01)
(Continued)

(52) U.S. Cl.
CPC ............ *H05K 5/0217* (2013.01); *C03C 3/093* (2013.01); *C03C 3/097* (2013.01); *C03C 21/002* (2013.01);
(Continued)

(58) Field of Classification Search
None
See application file for complete search history.

(56) References Cited

U.S. PATENT DOCUMENTS

| 1,960,121 A | 5/1934 | Moulton |
| 3,107,196 A | 10/1963 | Acloque |

(Continued)

FOREIGN PATENT DOCUMENTS

| AU | 6452265 A | 10/1965 |
| AU | 2011212982 A1 | 8/2012 |

(Continued)

OTHER PUBLICATIONS

Shen et al; "Variable-temperature ion-exchanged engineered stress profile (ESP) glasses"; J. Am. Ceram. Soc., 86 [11] 1979-81 (2003).
(Continued)

*Primary Examiner* — Anthony J Frost
(74) *Attorney, Agent, or Firm* — Jeffrey A. Schmidt

(57) ABSTRACT

Glass-based article including a first surface and a second surface opposing the first surface defining a thickness (t), and a stress profile are disclosed having a thickness (t) of about 3 millimeters or less, and wherein all points of the stress profile between a thickness range from about 0·t up to 0.3·t and from greater than 0.7·t, comprise a tangent with a slope that is less than about −0.1 MPa/micrometers or greater than about 0.1 MPa/micrometers. Also disclosed are glass-based articles having a thickness (t) in a range of 0.1 mm and 2 mm; and wherein at least one point of the stress profile in a first thickness range from about 0·t up to 0.020·t
(Continued)

and greater than 0.98·t comprises a tangent with a slope of from about −200 MPa/micrometer to about −25 MPa/micrometer or about 25 MPa/micrometer to about 200 MPa/micrometer, and wherein all points of the stress profile in a second thickness range from about 0.035·t and less than 0.965·t comprise a tangent with a slope of from about −15 MPa/micrometer to about 15 MPa/micrometer.

20 Claims, 41 Drawing Sheets

Related U.S. Application Data application No. 15/482,160, filed on Apr. 7, 2017, now Pat. No. 10,271,442.

(60) Provisional application No. 62/320,109, filed on Apr. 8, 2016.

(51) Int. Cl.
C03C 3/097 (2006.01)
C03C 21/00 (2006.01)
H05K 5/00 (2006.01)
H05K 5/03 (2006.01)
H04B 1/3888 (2015.01)
H04M 1/02 (2006.01)

(52) U.S. Cl.
CPC ............ *H05K 5/0017* (2013.01); *H05K 5/03* (2013.01); *H04B 1/3888* (2013.01); *H04M 1/0266* (2013.01)

(56) References Cited

U.S. PATENT DOCUMENTS

| | | | |
|---|---|---|---|
| 3,287,200 A | 11/1966 | Hess et al. |
| 3,357,876 A | 12/1967 | Rinehart |
| 3,380,818 A | 4/1968 | Smith |
| 3,404,015 A | 10/1968 | Dumbaugh, Jr. |
| 3,410,673 A | 11/1968 | Marusak |
| 3,433,611 A | 3/1969 | Saunders et al. |
| 3,464,880 A | 9/1969 | Rinehart |
| 3,489,097 A | 1/1970 | Gemeinhardt |
| 3,490,984 A | 1/1970 | Petticrew et al. |
| 3,597,305 A | 8/1971 | Giffen |
| 3,625,718 A | 12/1971 | Petticrew |
| 3,639,198 A | 2/1972 | Plumat et al. |
| 3,656,923 A | 4/1972 | Garfinkel et al. |
| 3,660,060 A | 5/1972 | Spanoudis |
| 3,673,049 A | 6/1972 | Giffen et al. |
| 3,737,294 A | 6/1973 | Dumbaugh et al. |
| 3,746,526 A | 7/1973 | Giffon |
| 3,765,855 A | 10/1973 | Larrick |
| 3,798,013 A | 3/1974 | Hasegawa et al. |
| 3,811,855 A | 5/1974 | Stockdale et al. |
| 3,833,388 A | 9/1974 | Ohlberg et al. |
| 3,844,754 A | 10/1974 | Grubb et al. |
| 3,879,183 A | 4/1975 | Carlson |
| 3,907,577 A | 9/1975 | Kiefer et al. |
| 3,931,438 A | 1/1976 | Beall et al. |
| 3,936,287 A | 2/1976 | Beall et al. |
| 3,958,052 A | 5/1976 | Galusha et al. |
| 3,959,000 A | 5/1976 | Nakagawa et al. |
| 4,042,405 A | 8/1977 | Krohn et al. |
| 4,053,679 A | 10/1977 | Rinehart |
| 4,055,703 A | 10/1977 | Rinehart |
| 4,102,664 A | 7/1978 | Dumbaugh, Jr. |
| 4,130,437 A | 12/1978 | Mazeau et al. |
| 4,148,661 A | 4/1979 | Kerko et al. |
| 4,156,755 A | 5/1979 | Rinehart |
| 4,190,451 A | 2/1980 | Hares et al. |
| 4,192,688 A | 3/1980 | Babcock |
| 4,214,886 A | 7/1980 | Shay et al. |
| 4,240,836 A | 12/1980 | Borrelli et al. |
| 4,242,117 A | 12/1980 | Van Ass |
| 4,358,542 A | 11/1982 | Hares et al. |
| 4,407,966 A | 10/1983 | Kerko et al. |
| 4,468,534 A | 8/1984 | Boddicker |
| 4,471,024 A | 9/1984 | Pargamin et al. |
| 4,483,700 A | 11/1984 | Forker et al. |
| 4,537,612 A | 8/1985 | Borrelli et al. |
| 4,608,349 A | 8/1986 | Kerko et al. |
| 4,702,042 A | 10/1987 | Herrington et al. |
| 4,726,981 A | 2/1988 | Pierson et al. |
| 4,736,981 A | 4/1988 | Barton et al. |
| 4,757,162 A | 7/1988 | Dumora et al. |
| 4,857,485 A | 8/1989 | Brennan et al. |
| 5,270,269 A | 12/1993 | Hares et al. |
| 5,273,827 A | 12/1993 | Francis |
| 5,322,819 A | 6/1994 | Araujo et al. |
| 5,342,426 A | 8/1994 | Dumbaugh, Jr. |
| 5,350,607 A | 9/1994 | Tyson et al. |
| 5,559,060 A | 9/1996 | Dumbaugh et al. |
| 5,763,343 A | 6/1998 | Brix et al. |
| 5,773,148 A | 6/1998 | Charrue et al. |
| 5,804,317 A | 9/1998 | Charrue |
| 5,895,768 A | 4/1999 | Speit |
| 5,972,460 A | 10/1999 | Tachiwana |
| 6,111,821 A | 8/2000 | Bach |
| 6,187,441 B1 | 2/2001 | Takeuchi et al. |
| 6,333,286 B1 | 12/2001 | Kurachi et al. |
| 6,376,402 B1 | 4/2002 | Pannhorst et al. |
| 6,413,892 B1 | 7/2002 | Koyama et al. |
| 6,440,531 B1 | 8/2002 | Kurachi et al. |
| 6,472,068 B1 | 10/2002 | Glass et al. |
| 6,514,149 B2 | 2/2003 | Yoon |
| 6,516,634 B1 | 2/2003 | Green et al. |
| 6,518,211 B1 | 2/2003 | Bradshaw et al. |
| 6,528,440 B1 | 3/2003 | Vilato et al. |
| 6,537,938 B1 | 3/2003 | Miyazaki |
| 6,607,999 B2 | 8/2003 | Hachitani |
| 6,689,704 B2 | 2/2004 | Ota et al. |
| 6,846,760 B2 | 1/2005 | Siebers et al. |
| 7,007,512 B2 | 3/2006 | Kamada et al. |
| 7,091,141 B2 | 8/2006 | Horsfall et al. |
| 7,176,528 B2 | 2/2007 | Couillard et al. |
| 7,476,633 B2 | 1/2009 | Comte et al. |
| 7,514,149 B2 | 4/2009 | Bocko et al. |
| 7,531,475 B2 | 5/2009 | Kishimoto et al. |
| 7,619,283 B2 | 11/2009 | Gadkaree |
| 7,666,511 B2 | 2/2010 | Ellison et al. |
| 7,687,419 B2 | 3/2010 | Kawai |
| 7,727,917 B2 | 6/2010 | Shelestak et al. |
| 7,838,136 B2 | 11/2010 | Nakashima et al. |
| 7,891,212 B2 | 2/2011 | Isono |
| 8,007,913 B2 | 8/2011 | Coppola et al. |
| 8,075,999 B2 | 12/2011 | Barefoot et al. |
| 8,099,982 B2 | 1/2012 | Takagi et al. |
| 8,143,179 B2 | 3/2012 | Aitken et al. |
| 8,158,543 B2 | 4/2012 | Dejneka et al. |
| 8,193,128 B2 | 6/2012 | Hellmann et al. |
| 8,232,218 B2 | 7/2012 | Dejneka et al. |
| 8,252,708 B2 | 8/2012 | Morena et al. |
| 8,312,739 B2 | 11/2012 | Lee et al. |
| 8,312,789 B2 | 11/2012 | Beck |
| 8,327,666 B2 | 12/2012 | Harvey et al. |
| 8,347,651 B2 | 1/2013 | Abramov et al. |
| 8,349,455 B2 | 1/2013 | Kondo et al. |
| 8,415,013 B2 | 4/2013 | Barefoot et al. |
| 8,431,502 B2 | 4/2013 | Dejneka et al. |
| 8,561,429 B2 | 10/2013 | Allan et al. |
| 8,580,411 B2 | 11/2013 | Endo et al. |
| 8,586,492 B2 | 11/2013 | Barefoot et al. |
| 8,623,776 B2 | 1/2014 | Dejneka et al. |
| 8,652,978 B2 | 2/2014 | Dejneka et al. |
| 8,656,734 B2 | 2/2014 | Zou et al. |
| 8,691,711 B2 | 4/2014 | Nakashima et al. |
| 8,697,592 B2 | 4/2014 | Ikenishi et al. |
| 8,713,972 B2 | 5/2014 | Lakota et al. |
| 8,756,262 B2 | 6/2014 | Zhang |
| 8,759,238 B2 | 6/2014 | Chapman et al. |

(56) References Cited

U.S. PATENT DOCUMENTS

| | | |
|---|---|---|
| 8,765,262 B2 | 7/2014 | Gross |
| 8,778,820 B2 | 7/2014 | Gomez et al. |
| 8,783,063 B2 | 7/2014 | Osakabe et al. |
| 8,802,581 B2 | 8/2014 | Dejneka et al. |
| 8,854,623 B2 | 10/2014 | Fontaine et al. |
| 8,932,510 B2 | 1/2015 | Li et al. |
| 8,943,855 B2 | 2/2015 | Gomez et al. |
| 8,946,103 B2 | 2/2015 | Dejneka et al. |
| 8,950,215 B2 | 2/2015 | Rappoport et al. |
| 8,951,927 B2 | 2/2015 | Dejneka et al. |
| 8,957,374 B2 | 2/2015 | Liu et al. |
| 8,969,226 B2 | 3/2015 | Dejneka et al. |
| 8,975,374 B2 | 3/2015 | Kimura |
| 9,003,835 B2 | 4/2015 | Lock |
| 9,007,878 B2 | 4/2015 | Matsumoto et al. |
| 9,139,469 B2 | 9/2015 | Comte et al. |
| 9,140,543 B1 | 9/2015 | Allan et al. |
| 9,145,329 B2 | 9/2015 | Drake et al. |
| 9,156,724 B2 | 10/2015 | Gross |
| 9,193,625 B2 | 11/2015 | Bookbinder et al. |
| 9,212,288 B2 | 12/2015 | Fujiwara et al. |
| 9,272,945 B2 | 3/2016 | Smith |
| 9,290,407 B2 | 3/2016 | Barefoot et al. |
| 9,290,413 B2 | 3/2016 | Dejneka et al. |
| 9,339,993 B2 | 5/2016 | Cites et al. |
| 9,346,703 B2 | 5/2016 | Bookbinder et al. |
| 9,359,251 B2 | 6/2016 | Bookbinder et al. |
| 9,487,434 B2 | 11/2016 | Amin et al. |
| 9,498,822 B2 | 11/2016 | Brandt et al. |
| 9,499,431 B2 | 11/2016 | Barefoot et al. |
| 9,567,254 B2 | 2/2017 | Amin et al. |
| 9,593,042 B2 | 3/2017 | Hu et al. |
| 9,604,876 B2 | 3/2017 | Gy et al. |
| 9,676,663 B2 | 6/2017 | Amin et al. |
| 9,701,569 B2 | 7/2017 | Demartino et al. |
| 9,751,802 B2 | 9/2017 | Allan et al. |
| 9,840,435 B2 | 12/2017 | Ohara et al. |
| 9,902,648 B2 | 2/2018 | Amin et al. |
| 9,908,810 B2 | 3/2018 | Amin et al. |
| 9,908,811 B2 | 3/2018 | Gross et al. |
| 9,977,470 B2 | 5/2018 | Demartino et al. |
| 10,017,417 B2 | 7/2018 | Dejneka et al. |
| 10,118,858 B2 | 11/2018 | Amin et al. |
| 10,144,670 B2 | 12/2018 | Akatsuka et al. |
| 10,150,698 B2 | 12/2018 | Amin et al. |
| 10,160,688 B2 | 12/2018 | Amin et al. |
| 10,239,784 B2 | 3/2019 | Oram et al. |
| 10,259,746 B2 | 4/2019 | Hu et al. |
| 10,271,442 B2 * | 4/2019 | Gross .................. C03C 3/097 |
| 10,570,059 B2 | 2/2020 | Dejneka et al. |
| 10,579,106 B2 | 3/2020 | Demartino et al. |
| 10,787,387 B2 | 9/2020 | Gross et al. |
| 11,174,197 B2 | 11/2021 | Dejneka et al. |
| 11,279,652 B2 | 3/2022 | Dejneka et al. |
| 2002/0023463 A1 | 2/2002 | Siebers et al. |
| 2005/0090377 A1 | 4/2005 | Shelestak et al. |
| 2005/0099618 A1 | 5/2005 | Difoggio et al. |
| 2005/0143247 A1 | 6/2005 | Siebers et al. |
| 2005/0215414 A1 | 9/2005 | Kawai |
| 2005/0221044 A1 | 10/2005 | Gaume et al. |
| 2005/0250639 A1 | 11/2005 | Siebers et al. |
| 2006/0127679 A1 | 6/2006 | Gulati et al. |
| 2006/0279217 A1 | 12/2006 | Peuchert et al. |
| 2007/0060465 A1 | 3/2007 | Varshneya et al. |
| 2007/0122580 A1 | 5/2007 | Krall et al. |
| 2007/0123410 A1 | 5/2007 | Morena et al. |
| 2007/0218262 A1 | 9/2007 | Degand et al. |
| 2008/0026927 A1 | 1/2008 | Monique Comte |
| 2008/0128953 A1 | 6/2008 | Nagai et al. |
| 2008/0241603 A1 | 10/2008 | Isono |
| 2008/0286548 A1 | 11/2008 | Ellison et al. |
| 2009/0142568 A1 | 6/2009 | Dejneka et al. |
| 2009/0197088 A1 | 8/2009 | Murata |
| 2009/0215607 A1 | 8/2009 | Dejneka et al. |
| 2009/0220761 A1 | 9/2009 | Dejneka et al. |
| 2009/0286091 A1 | 11/2009 | Danielson et al. |
| 2010/0003508 A1 | 1/2010 | Arrouy et al. |
| 2010/0009154 A1 | 1/2010 | Allan et al. |
| 2010/0028607 A1 | 2/2010 | Lee et al. |
| 2010/0029460 A1 | 2/2010 | Shojiya et al. |
| 2010/0035038 A1 | 2/2010 | Barefoot et al. |
| 2010/0035745 A1 | 2/2010 | Murata |
| 2010/0087307 A1 | 4/2010 | Murata et al. |
| 2010/0112341 A1 | 5/2010 | Takagi et al. |
| 2010/0119846 A1 | 5/2010 | Sawada |
| 2010/0190038 A1 | 7/2010 | Osakabe et al. |
| 2010/0200804 A1 | 8/2010 | Woodruff et al. |
| 2010/0210422 A1 | 8/2010 | Crawford |
| 2010/0210442 A1 | 8/2010 | Abramov et al. |
| 2010/0215996 A1 | 8/2010 | Wendling et al. |
| 2010/0291353 A1 | 11/2010 | Dejneka et al. |
| 2010/0326657 A1 | 12/2010 | Hellmann et al. |
| 2011/0014475 A1 | 1/2011 | Murata |
| 2011/0064951 A1 | 3/2011 | Fujiwara et al. |
| 2011/0067447 A1 | 3/2011 | Zadesky et al. |
| 2011/0092353 A1 | 4/2011 | Amin et al. |
| 2011/0165393 A1 | 7/2011 | Bayne et al. |
| 2011/0201490 A1 | 8/2011 | Barefoot et al. |
| 2011/0226832 A1 | 9/2011 | Bayne et al. |
| 2011/0281093 A1 | 11/2011 | Gulati et al. |
| 2011/0293942 A1 | 12/2011 | Cornejo et al. |
| 2011/0294648 A1 | 12/2011 | Chapman et al. |
| 2011/0294649 A1 | 12/2011 | Gomez et al. |
| 2011/0312483 A1 | 12/2011 | Nakashima et al. |
| 2012/0015150 A1 | 1/2012 | Suzuki |
| 2012/0021898 A1 | 1/2012 | Elam et al. |
| 2012/0040146 A1 | 2/2012 | Garner et al. |
| 2012/0048604 A1 | 3/2012 | Cornejo et al. |
| 2012/0052271 A1 | 3/2012 | Gomez et al. |
| 2012/0052275 A1 | 3/2012 | Hashimoto et al. |
| 2012/0083401 A1 | 4/2012 | Koyama et al. |
| 2012/0114955 A1 | 5/2012 | Almoric et al. |
| 2012/0135153 A1 | 5/2012 | Osakabe et al. |
| 2012/0135226 A1 | 5/2012 | Bookbinder et al. |
| 2012/0135848 A1 | 5/2012 | Beall et al. |
| 2012/0171497 A1 | 7/2012 | Koyama et al. |
| 2012/0174497 A1 | 7/2012 | Kroes |
| 2012/0189843 A1 | 7/2012 | Chang et al. |
| 2012/0194974 A1 | 8/2012 | Weber et al. |
| 2012/0196110 A1 | 8/2012 | Murata et al. |
| 2012/0206406 A1 | 8/2012 | Kim et al. |
| 2012/0216565 A1 | 8/2012 | Allan et al. |
| 2012/0216569 A1 | 8/2012 | Allan et al. |
| 2012/0219792 A1 | 8/2012 | Yamamoto et al. |
| 2012/0235953 A1 | 9/2012 | Kim et al. |
| 2012/0236526 A1 | 9/2012 | Weber |
| 2012/0264585 A1 | 10/2012 | Ohara et al. |
| 2012/0297829 A1 | 11/2012 | Endo et al. |
| 2012/0308827 A1 | 12/2012 | Boek et al. |
| 2012/0321898 A1 | 12/2012 | Meinhardt et al. |
| 2013/0004758 A1 | 1/2013 | Dejneka et al. |
| 2013/0007458 A1 | 1/2013 | Wakita et al. |
| 2013/0017380 A1 | 1/2013 | Murata et al. |
| 2013/0045375 A1 | 2/2013 | Gross |
| 2013/0050992 A1 | 2/2013 | Schneider et al. |
| 2013/0101596 A1 | 4/2013 | Demartino et al. |
| 2013/0101798 A1 | 4/2013 | Hashimoto |
| 2013/0122260 A1 | 5/2013 | Liang |
| 2013/0122284 A1 | 5/2013 | Gross |
| 2013/0183512 A1 * | 7/2013 | Gy .................. G01N 3/20 |
| | | 428/220 |
| 2013/0186139 A1 | 7/2013 | Tanii |
| 2013/0189486 A1 | 7/2013 | Wang et al. |
| 2013/0202868 A1 | 8/2013 | Barefoot et al. |
| 2013/0203583 A1 | 8/2013 | Zhang et al. |
| 2013/0209751 A1 | 8/2013 | Zhang et al. |
| 2013/0219966 A1 | 8/2013 | Hasegawa et al. |
| 2013/0224492 A1 | 8/2013 | Bookbinder et al. |
| 2013/0236666 A1 | 9/2013 | Bookbinder et al. |
| 2013/0236699 A1 | 9/2013 | Prest et al. |
| 2013/0240025 A1 | 9/2013 | Bersano et al. |
| 2013/0260154 A1 | 10/2013 | Allan et al. |
| 2013/0274085 A1 | 10/2013 | Beall et al. |
| 2013/0288001 A1 | 10/2013 | Murata et al. |

(56) References Cited

U.S. PATENT DOCUMENTS

| | | |
|---|---|---|
| 2013/0288010 A1 | 10/2013 | Akarapu et al. |
| 2013/0309613 A1 | 11/2013 | O'Malley et al. |
| 2013/0323444 A1 | 12/2013 | Ehemann et al. |
| 2014/0023865 A1 | 1/2014 | Comte et al. |
| 2014/0050911 A1 | 2/2014 | Mauro et al. |
| 2014/0063393 A1 | 3/2014 | Zhong et al. |
| 2014/0066284 A1 | 3/2014 | Hashimoto et al. |
| 2014/0087159 A1 | 3/2014 | Cleary et al. |
| 2014/0087193 A1 | 3/2014 | Cites et al. |
| 2014/0087194 A1 | 3/2014 | Dejneka et al. |
| 2014/0090864 A1 | 4/2014 | Paulson |
| 2014/0092377 A1 | 4/2014 | Liu et al. |
| 2014/0093702 A1 | 4/2014 | Kitajima |
| 2014/0106141 A1 | 4/2014 | Bellman et al. |
| 2014/0106172 A1 | 4/2014 | Dejneka et al. |
| 2014/0109616 A1 | 4/2014 | Varshneya |
| 2014/0113141 A1 | 4/2014 | Yamamoto et al. |
| 2014/0134397 A1 | 5/2014 | Amin et al. |
| 2014/0139978 A1 | 5/2014 | Kwong |
| 2014/0141226 A1 | 5/2014 | Bookbinder et al. |
| 2014/0147576 A1 | 5/2014 | Lewis et al. |
| 2014/0150525 A1 | 6/2014 | Okawa et al. |
| 2014/0151370 A1 | 6/2014 | Chang et al. |
| 2014/0154661 A1 | 6/2014 | Bookbinder et al. |
| 2014/0170380 A1 | 6/2014 | Murata et al. |
| 2014/0193606 A1 | 7/2014 | Kwong |
| 2014/0220327 A1 | 8/2014 | Adib et al. |
| 2014/0227523 A1 | 8/2014 | Dejneka et al. |
| 2014/0227524 A1 | 8/2014 | Ellison et al. |
| 2014/0227525 A1 | 8/2014 | Matsuda et al. |
| 2014/0234607 A1 | 8/2014 | Matsuda et al. |
| 2014/0248495 A1 | 9/2014 | Matsuda et al. |
| 2014/0308526 A1 | 10/2014 | Chapman et al. |
| 2014/0321124 A1 | 10/2014 | Schneider et al. |
| 2014/0329660 A1* | 11/2014 | Barefoot ............ C03B 33/0222 501/66 |
| 2014/0335330 A1 | 11/2014 | Bellman et al. |
| 2014/0356576 A1 | 12/2014 | Dejneka et al. |
| 2014/0356605 A1 | 12/2014 | Adib et al. |
| 2014/0364298 A1 | 12/2014 | Ohara et al. |
| 2014/0370264 A1 | 12/2014 | Ohara et al. |
| 2014/0370302 A1 | 12/2014 | Amin et al. |
| 2015/0004390 A1 | 1/2015 | Kawamoto et al. |
| 2015/0011811 A1 | 1/2015 | Pavone et al. |
| 2015/0027169 A1 | 1/2015 | Fredholm |
| 2015/0030834 A1 | 1/2015 | Morey et al. |
| 2015/0030838 A1 | 1/2015 | Sellier et al. |
| 2015/0037543 A1 | 2/2015 | Keegan et al. |
| 2015/0037586 A1 | 2/2015 | Gross |
| 2015/0044473 A1 | 2/2015 | Murata et al. |
| 2015/0052949 A1 | 2/2015 | Bayne et al. |
| 2015/0060401 A1 | 3/2015 | Chang et al. |
| 2015/0064472 A1 | 3/2015 | Gross et al. |
| 2015/0064474 A1 | 3/2015 | Dejneka et al. |
| 2015/0074974 A1 | 3/2015 | Pesansky et al. |
| 2015/0079398 A1 | 3/2015 | Amin et al. |
| 2015/0083200 A1 | 3/2015 | Hickman et al. |
| 2015/0093581 A1 | 4/2015 | Murata et al. |
| 2015/0111030 A1 | 4/2015 | Miyasaka et al. |
| 2015/0132563 A1 | 5/2015 | O'Malley et al. |
| 2015/0140325 A1 | 5/2015 | Gross et al. |
| 2015/0144291 A1 | 5/2015 | Brandt et al. |
| 2015/0147574 A1 | 5/2015 | Allan et al. |
| 2015/0147575 A1 | 5/2015 | Dejneka et al. |
| 2015/0147576 A1 | 5/2015 | Bookbinder et al. |
| 2015/0152003 A1 | 6/2015 | Kawamoto et al. |
| 2015/0157533 A1 | 6/2015 | Demartino et al. |
| 2015/0166401 A1 | 6/2015 | Yamamoto |
| 2015/0166407 A1 | 6/2015 | Varshneya et al. |
| 2015/0175469 A1 | 6/2015 | Tabe |
| 2015/0183680 A1 | 7/2015 | Barefoot et al. |
| 2015/0239775 A1 | 8/2015 | Amin et al. |
| 2015/0239776 A1 | 8/2015 | Amin et al. |
| 2015/0251947 A1 | 9/2015 | Lestrigant et al. |
| 2015/0259244 A1 | 9/2015 | Amin et al. |
| 2015/0261363 A1 | 9/2015 | Shah et al. |
| 2015/0274585 A1 | 10/2015 | Rogers et al. |
| 2015/0329413 A1 | 11/2015 | Beall et al. |
| 2015/0329418 A1 | 11/2015 | Murata et al. |
| 2015/0368148 A1 | 12/2015 | Duffy et al. |
| 2015/0368153 A1* | 12/2015 | Pesansky ............ C03C 3/097 428/220 |
| 2016/0083291 A1 | 3/2016 | Dogimont et al. |
| 2016/0102011 A1 | 4/2016 | Hu et al. |
| 2016/0102014 A1 | 4/2016 | Hu et al. |
| 2016/0107924 A1 | 4/2016 | Yamamoto et al. |
| 2016/0122239 A1 | 5/2016 | Amin et al. |
| 2016/0122240 A1 | 5/2016 | Oram et al. |
| 2016/0187994 A1 | 6/2016 | La et al. |
| 2016/0265368 A1 | 9/2016 | Bencini et al. |
| 2016/0318796 A1 | 11/2016 | Masuda |
| 2016/0333776 A1 | 11/2016 | Andersson et al. |
| 2017/0022092 A1 | 1/2017 | Demartino et al. |
| 2017/0022093 A1 | 1/2017 | Demartino et al. |
| 2017/0158556 A1 | 6/2017 | Dejneka et al. |
| 2017/0166478 A1 | 6/2017 | Gross et al. |
| 2017/0197869 A1 | 7/2017 | Beall et al. |
| 2017/0197870 A1 | 7/2017 | Finkeldey et al. |
| 2017/0291849 A1 | 10/2017 | Dejneka et al. |
| 2017/0295657 A1 | 10/2017 | Gross et al. |
| 2017/0305786 A1 | 10/2017 | Roussev et al. |
| 2019/0208652 A1 | 7/2019 | Gross et al. |

FOREIGN PATENT DOCUMENTS

| | | |
|---|---|---|
| CN | 1312582 A | 9/2001 |
| CN | 1693247 A | 11/2005 |
| CN | 1699230 A | 11/2005 |
| CN | 1759074 A | 4/2006 |
| CN | 1886348 A | 12/2006 |
| CN | 101316799 A | 12/2008 |
| CN | 101578240 A | 11/2009 |
| CN | 101583576 A | 11/2009 |
| CN | 101679106 A | 3/2010 |
| CN | 101689376 A | 3/2010 |
| CN | 102026929 A | 4/2011 |
| CN | 102089252 A | 6/2011 |
| CN | 102131740 A | 7/2011 |
| CN | 102149649 A | 8/2011 |
| CN | 102363567 A | 2/2012 |
| CN | 102393289 A | 3/2012 |
| CN | 102531384 A | 7/2012 |
| CN | 102690059 A | 9/2012 |
| CN | 102791646 A | 11/2012 |
| CN | 102815860 A | 12/2012 |
| CN | 102887650 A | 1/2013 |
| CN | 102898022 A | 1/2013 |
| CN | 102958855 A | 3/2013 |
| CN | 103058506 A | 4/2013 |
| CN | 103058507 A | 4/2013 |
| CN | 103068759 A | 4/2013 |
| CN | 103097319 A | 5/2013 |
| CN | 103282318 A | 9/2013 |
| CN | 103328396 A | 9/2013 |
| CN | 103338926 A | 10/2013 |
| CN | 103569015 A | 2/2014 |
| CN | 103648996 A | 3/2014 |
| CN | 103946166 A | 7/2014 |
| CN | 103987671 A | 8/2014 |
| CN | 104114503 A | 10/2014 |
| CN | 104379522 A | 2/2015 |
| CN | 104619665 A | 5/2015 |
| CN | 104736496 A | 6/2015 |
| CN | 105293901 A | 2/2016 |
| CN | 105753314 A | 7/2016 |
| CN | 107108345 A | 8/2017 |
| CN | 107848870 A | 3/2018 |
| CN | 108046589 A | 5/2018 |
| CN | 207671927 U | 7/2018 |
| CN | 109071316 A | 12/2018 |
| DE | 112011100664 B4 | 12/2020 |
| EP | 0132751 A1 | 2/1985 |
| EP | 0163873 A1 | 12/1985 |
| EP | 0700879 A1 | 3/1996 |

(56) References Cited

FOREIGN PATENT DOCUMENTS

| | | |
|---|---|---|
| EP | 0931028 A1 | 7/1999 |
| EP | 1291631 A1 | 3/2003 |
| EP | 1314704 A1 | 5/2003 |
| EP | 1593658 A1 | 11/2005 |
| EP | 2263979 A1 | 12/2010 |
| EP | 2397449 A1 | 12/2011 |
| EP | 2415724 A1 | 2/2012 |
| EP | 2531459 A2 | 12/2012 |
| EP | 2540682 A1 | 1/2013 |
| EP | 2594536 A1 | 5/2013 |
| EP | 2609047 A1 | 7/2013 |
| EP | 2646243 A1 | 10/2013 |
| EP | 2666756 A1 | 11/2013 |
| EP | 2695734 A1 | 2/2014 |
| EP | 2736855 | 6/2014 |
| EP | 2762459 A1 | 8/2014 |
| EP | 2762460 A1 | 8/2014 |
| EP | 3204338 A2 | 8/2017 |
| GB | 1012367 A | 12/1965 |
| GB | 1026770 A | 4/1966 |
| GB | 1089912 A | 11/1967 |
| GB | 1105433 A | 3/1968 |
| GB | 1334828 A | 10/1973 |
| JP | 47-004192 U | 9/1972 |
| JP | 54-083923 A | 7/1979 |
| JP | 62-187140 A | 8/1987 |
| JP | 02-293345 A | 12/1990 |
| JP | 07-263318 A | 10/1995 |
| JP | 11-328601 A | 11/1999 |
| JP | 2000-203872 A | 7/2000 |
| JP | 2000-327365 A | 11/2000 |
| JP | 2001-076336 A | 3/2001 |
| JP | 2001-354446 A | 12/2001 |
| JP | 2002-115071 A | 4/2002 |
| JP | 2002-174810 A | 6/2002 |
| JP | 2002-358626 A | 12/2002 |
| JP | 2003-505327 A | 2/2003 |
| JP | 2003-283028 A | 10/2003 |
| JP | 2004-099370 A | 4/2004 |
| JP | 2004-259402 A | 9/2004 |
| JP | 2005-062592 A | 3/2005 |
| JP | 2005-139031 A | 6/2005 |
| JP | 2005-519997 A | 7/2005 |
| JP | 2005-206406 A | 8/2005 |
| JP | 2005-289683 A | 10/2005 |
| JP | 2005-289685 A | 10/2005 |
| JP | 2005-320234 A | 11/2005 |
| JP | 2006-228431 A | 8/2006 |
| JP | 2007-527354 A | 9/2007 |
| JP | 2007-252589 A | 10/2007 |
| JP | 2007-255139 A | 10/2007 |
| JP | 2007-255319 A | 10/2007 |
| JP | 2007-314521 A | 12/2007 |
| JP | 2008-007384 A | 1/2008 |
| JP | 2008-094713 A | 4/2008 |
| JP | 2008-115071 A | 5/2008 |
| JP | 2009-084076 A | 4/2009 |
| JP | 2009-099239 A | 5/2009 |
| JP | 2009-107878 A | 5/2009 |
| JP | 2009-274902 A | 11/2009 |
| JP | 2009-280478 A | 12/2009 |
| JP | 2010-202514 A | 9/2010 |
| JP | 2011-057504 A | 3/2011 |
| JP | 2011-213576 A | 10/2011 |
| JP | 2011-527661 | 11/2011 |
| JP | 2011-530470 A | 12/2011 |
| JP | 2012-066995 A | 4/2012 |
| JP | 2012-232882 A | 11/2012 |
| JP | 2013-502371 A | 1/2013 |
| JP | 2013-028512 A | 2/2013 |
| JP | 2013-035721 A | 2/2013 |
| JP | 2013-518800 A | 5/2013 |
| JP | 2013-520388 A | 6/2013 |
| JP | 2013-529172 A | 7/2013 |
| JP | 2013-533838 A | 8/2013 |
| JP | 2013-536155 A | 9/2013 |
| JP | 2013-542159 A | 11/2013 |
| JP | 2013-544227 A | 12/2013 |
| JP | 2014-012611 A | 1/2014 |
| JP | 2014-501214 A | 1/2014 |
| JP | 2014-073953 A | 4/2014 |
| JP | 5483923 B2 | 5/2014 |
| JP | 2014-136751 A | 7/2014 |
| JP | 2014-141363 A | 8/2014 |
| JP | 2014-522798 A | 9/2014 |
| JP | 2015-511537 A | 4/2015 |
| JP | 2015-511573 A | 4/2015 |
| JP | 2017-502188 A | 1/2017 |
| JP | 2017-502202 A | 1/2017 |
| KR | 10-1181342 B1 | 9/2012 |
| KR | 10-2012-0128657 A | 11/2012 |
| KR | 10-2013-0100235 A | 9/2013 |
| KR | 10-1302664 B1 | 9/2013 |
| KR | 1302664 B1 | 9/2013 |
| KR | 10-1328832 B1 | 11/2013 |
| KR | 10-2013-0135840 A | 12/2013 |
| KR | 10-2014-0131558 A | 11/2014 |
| KR | 10-1506378 B1 | 3/2015 |
| KR | 10-2016-0080048 | 7/2016 |
| KR | 10-2021-0149192 A | 12/2021 |
| RU | 2127711 C1 | 3/1999 |
| SG | 187326 | 2/2013 |
| SU | 1677028 A1 | 9/1991 |
| TW | 200911718 A | 3/2009 |
| TW | 201040118 A | 11/2010 |
| TW | 201313635 A | 4/2013 |
| TW | 201331148 A | 8/2013 |
| TW | 201335092 A | 9/2013 |
| TW | 201341324 A | 10/2013 |
| TW | 201350449 A | 12/2013 |
| TW | 201402490 A | 1/2014 |
| TW | 201520178 A | 6/2015 |
| WO | 99/06334 A1 | 2/1999 |
| WO | 2000/047529 A1 | 8/2000 |
| WO | 01/07374 A1 | 2/2001 |
| WO | 2005/042423 A1 | 5/2005 |
| WO | 2005/091021 A1 | 9/2005 |
| WO | 2005/093720 A1 | 10/2005 |
| WO | 2009/041348 A1 | 4/2009 |
| WO | 2009/041618 A1 | 4/2009 |
| WO | 2010/002477 A1 | 1/2010 |
| WO | 2010/005578 A1 | 1/2010 |
| WO | 2010/014163 A1 | 2/2010 |
| WO | 2010/016928 A2 | 2/2010 |
| WO | 2010/147650 A2 | 12/2010 |
| WO | 2011/022661 A2 | 2/2011 |
| WO | 2011/041484 A1 | 4/2011 |
| WO | 2011/069338 A1 | 6/2011 |
| WO | 2011/077756 A1 | 6/2011 |
| WO | 2011/085190 A1 | 7/2011 |
| WO | 2011/097314 A2 | 8/2011 |
| WO | 2011/103798 A1 | 9/2011 |
| WO | 2011/103799 A1 | 9/2011 |
| WO | 2011/104035 A2 | 9/2011 |
| WO | 2011/149740 A1 | 12/2011 |
| WO | 2011/149811 A1 | 12/2011 |
| WO | 2011/149812 A1 | 12/2011 |
| WO | 2012/027660 A1 | 3/2012 |
| WO | 2012/074983 A1 | 6/2012 |
| WO | 2012/126394 A1 | 9/2012 |
| WO | 2013/016157 A1 | 1/2013 |
| WO | 2013/018774 A1 | 2/2013 |
| WO | 2013/027651 A1 | 2/2013 |
| WO | 2013/028492 A1 | 2/2013 |
| WO | 2013/032890 A1 | 3/2013 |
| WO | 2013/047679 A1 | 4/2013 |
| WO | 2013/074779 A1 | 5/2013 |
| WO | 2013/082246 A1 | 6/2013 |
| WO | 2013/088856 A1 | 6/2013 |
| WO | 2013/110721 A1 | 8/2013 |
| WO | 2013/116420 A1 | 8/2013 |
| WO | 2013/120721 A1 | 8/2013 |
| WO | 2013/130653 A2 | 9/2013 |
| WO | 2013/130665 A2 | 9/2013 |

(56) References Cited

FOREIGN PATENT DOCUMENTS

| | | |
|---|---|---|
| WO | 2013/130721 A1 | 9/2013 |
| WO | 2013/136013 A2 | 9/2013 |
| WO | 2013/184205 A1 | 12/2013 |
| WO | 2014/042244 A1 | 3/2014 |
| WO | 2014/052229 A1 | 4/2014 |
| WO | 2014/097623 A1 | 6/2014 |
| WO | 2014/100432 A1 | 6/2014 |
| WO | 2014/175144 A1 | 10/2014 |
| WO | 2014/180679 A1 | 11/2014 |
| WO | 2015/057552 A2 | 4/2015 |
| WO | 2015/057555 A1 | 4/2015 |
| WO | 2015/077179 A1 | 5/2015 |
| WO | 2015/080043 A1 | 6/2015 |
| WO | 2015/127483 A2 | 8/2015 |
| WO | 2015/175595 A1 | 11/2015 |
| WO | 2015/195419 A2 | 12/2015 |
| WO | 2015/195465 A1 | 12/2015 |
| WO | 2016/014937 A1 | 1/2016 |
| WO | 2016/028554 A1 | 2/2016 |
| WO | 2016/057787 A2 | 4/2016 |
| WO | 2016/070048 A1 | 5/2016 |
| WO | 2016/073539 A1 | 5/2016 |
| WO | 2016/174825 A1 | 11/2016 |
| WO | 2016/185934 A1 | 11/2016 |
| WO | 2016/191676 A1 | 12/2016 |
| WO | 2017/030736 A1 | 2/2017 |
| WO | 2017/100646 A1 | 6/2017 |
| WO | 2017/177109 A1 | 10/2017 |
| WO | 2017/177114 A1 | 10/2017 |

OTHER PUBLICATIONS

Smedskjaer "Effect of thermal history and chemical composition on hardness of silicate glasses"; Journal of Non-Crystalline Solids 356 (2010); pp. 893-897.

Stosser et al "Magnetic Resonance investigation of the process of corundum formation starting from sol-gel precursors", J. Am. Ceram. Soc, vol. 88, No. 10, pp. 2913-2922, 2005.

Takagi et al; "Electrostatic Imprint Process for Glass"; Applied Physics Express 1, 2008, 024003.

Tang et al. "Methods for measurement and statistical analysis of the frangibility of strengthened glass" Frontiers in Materials, 2015 vol 2, article 50. 8 pgs.

Tang, et al., "Automated Apparatus for Measuring the Frangibility and Fragmentation of Strengthened Glass", Experimental Mechanics (Jun. 2014) vol. 54 pp. 903-912.

Varshneya, "Chemical Strengthening of Glass: Lessons Learned and Yet to be Learned", International Journal of Applied Glass Science, vol. 1, No. 2, 2010, pp. 131-142.

Varshneya; "Fundamentals of Inorganic Glasses"; 2nd edition, Society of Glass Technology, 2006, pp. 513-521, XP002563094.

Varshneya; "Microhardness vs. Glass Composition"; Fundamentals of Inorganic Glasses; 2006; p. 208, paragraph 7.

Yong-Hwan; "Chemical Tempered Glass for Mobile Displays"; Korea Institute of Science and Technology; 2020; 6 Pages.

Zheng et al., "Structure and Properties of the Lithium Aluminosilicate Glasses with Yttria Addition", Wuhan University of Technology, vol. 22, No. 2, 2007, pp. 362-366.

Zheng et al; "Effect of Y2O3 addition on viscosity and crystallization of the lithium aluminosilicate glasses"; Thermochimica Acta 456 (2007) 69-74.

Zheng et al; "Structure and Properties of the Lithium Aluminosilicate Glasses with Yttria Addition"; vol. 22, No. 2 Wuhan University of Technology—(Abstract).

Zimmer, "Thin Glasses for Touch Display Technologies" Schott: glass made of ideas. Emerging Display Technologies Conference, Aug. 16-17, 2011. 17 slides.

"Building Materials", Co-edited by Xi'an University of Architecture and Technology, China Construction Industry Press, Edition 3, Apr. 30, 2004, 5 pages.

Abrams et al; "Fracture behavior of engineered stress profile soda lime silicate glass"; Journal of Non-Crystalline Solids; 321, (2003) 10-19.

Aegerter et al "Sol-gel technologies for glass producers and users—Chapter 4.1.8—Scratch resistant coatings (G. Helsch and G. H. Frischat)", pp. 217-221, Kluwer Academic Publishers, 2004.

Amin et al; U.S. Appl. No. 14/926,425, filed Oct. 29, 2015, titled "Strengthened Glass With Ultra-Deep Depth of Compression".

ASTM C1279-13 "Standard Test Method for Non-Destructive Photoelastic Measurement of Edge and Surface Stresses in Annealed, Heat-Strengthened, and Fully Tempered Flat Glass"; Downloaded Jan. 24, 2018; 11 Pages.

ASTM C1422/C1422M-10 "Standard Specification for Chemically Strengthened Flat Glass"; Downloaded Jan. 24, 2018; 5 pages.

ASTM C158-02(2012), Standard Test Methods for Strength of Glass by Flexure (Determination of Modulus of Rupture), ASTM International, West Conshohocken, PA, 2012, 9 pages.

Bahlawane "Novel sol-gel process depositing a-Al2O3 for the improvement of graphite oxidation-resistance"—Thin Solid Films, vol. 396, pp. 126-130, 2001.

Bansal et al; "Chapter 10: Elastic Properties" Handbook of Glass Properties; Elsevier; (1986) pp. 306-336.

Barnett Technical Services, "Surface Stress Meters", Available Online at <https://web.archive.org/web/20200925054825/https://barnett-technical.com/luceo/surface-stress/>, Retrieved on Sep. 25, 2020, 4 pages.

Bouyne et al; "Fragmentation of thin chemically tempered glass plates"; Glass Technol., 2002, 43C, 300-2.

Brandt et al; "Mechanics of Ceramics, Active Materials, Nanoscale Materials, Composites, Glass, and Fundamentals"; Proceedings of the 8th International Symposium on Fracture Mechanics of Ceramics, (2003); 11 Pages.

Brunkov et al; "Submicron-Resolved Relief Formation in Poled Glasses and Glass-Metal Nanocomposites"; Technical Physics Letters, 2008, vol. 34, No. 12 pp. 1030-1033.

Bubsey, R.T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (Oct. 1992).

ChemCor Product Specification, 1990.

Corning Incorporated, "What Makes ChemCor Glass Work?" ChemCor Product Specification, Feb. 1990, 2 pgs.

Corning leads $62M Investment in 'smart' glass maker view, Jun. 19, 2013; http://optics.org/news/4/6/27.

Corning, "Nook—Stress Profile Measurement", Corning Incorporated, 2019, 4 slides.

Declaration of Rostislav V. Roussev; 9 Pages; Aug. 11, 2019.

Dessler et al; "Differences between films and monoliths of sol-gel derived aluminas", Thin Solid Films, vol. 519, pp. 42-51, 2010.

Donald "Review Methods for Improving the Mechanical Properties of Oxide Glasses"; Journal of Materials Science 24 (1989) 4177-4208.

Dusil J. and Strnad Z., "Black colored glass ceramics based on beta-quartz solid solutions," Glass 1977: proceedings of the 11th International Congress on Glass, Prague, Czechoslovakia, Jul. 4-8, 1977, vol. 2, p. 139-149.

F.V. Tooley; "The Flandbook of Glass Manufacture, vol. II"; China Architecture & Building Press, First Edition, Feb. 1983, pp. 304-305.

Fu, et al, "Preparation of alumina films from a new sol-gel route" Thin Solid films 348, pp. 99-102 (1999).

Glover et al; "The interactive whiteboard: a literature survey"; Technology, Pedagogy and Education, Dec. 2006, (14) 2: 155-170.

Greaves et al; "Inorganic Glasses, glass-forming liquids and amorphizing solids" Advances in Physics; vol. 56, No. 1; 2007 pp. 1-166.

Green; "Section 2. Residual stress, brittle fracture and damage; Critical parameters in the processing of engineered stress profile glasses"; Journal of Non-Crystalline Solids, 316 (2003) 35-41.

Gulati, "Frangibility of tempered soda-lime glass sheet" Glass Processing Days, Sep. 13-15, 1997. pp. 72-76.

(56) References Cited

OTHER PUBLICATIONS

Guo et al., "Nucleation and Crystallization Behavior of Li2O—Al2O3—SiO2 System Glass-Ceramic Containing Little Fluorine and No-Fluorine", J.Non-Cryst.Solids, 2005, vol. 351, No. 24-26, pp. 2133-2137.

Hampshire; "Oxynitride glasses, their properties and crystallization—a review"; Journal of Non-Crystalline Solids; vol. 316, 2003; pp. 64-73.

Hauk "Sol-gel preparation of scratch-resistant Al2O3 coatings on float glass", Glass Science and Technology: Glastechnische Berichte, 72(12), pp. 386, 1999.

Inaba et al., "Non-destructive Stress Measurement in Double Ion-Exchanged Glass Using Optical Guided-Waves and Scattered Light", Journal of the Ceramic Society of Japan 2017, vol. 125, No. 11, pp. 814-820.

Kim Yong-Hwan, "Glass Reinforcement by Ion Exchange Method (ReSEAT Program)", Available Online at <http://www.reseat.re.kr>, Korea Institute of Science and Technology Information, retrieved in 2021, pp. 1-6 (Original Document Only).

Kim; "Glass Engineering"; Glass Technology 3rd Edition; (2009) 8 Pages.

Kitaigorodskii et al, In: Sb.Nauchn.Rabot Belor.Politekhn.Inst. ,Khimiya, Tekhnologiya i Istoriya Stekla i Keramiki, 1960, No. 86, p. 38. (The Synthesis of Thermo-stable glasses) Abstract Only.

Le Bourhis; "Glass Mechanics and Technology"; Wiley-VCH, Second Edition; (2014) 8 Pages.

Le Bourhis; "Hardness"; Glass Mechanics and Technology; 2008; pp. 170-174.

Liu et al, "Common Knowledge Evidence: Inorganic Non-Metallic Materials Technology", China University of Science and Technology Press, Sep. 2015, 1st edition.

Nagashima; "Chemical Strengthening of Glass"; Surface Technology; vol. 64, No. 8; (2013) pp. 434-438.

Oram et al; U.S. Appl. No. 14/932,411, filed Nov. 4, 2015, Titled "Deep Non-Frangible Stress Profiles and Methods of Making".

Peitl et al; "Thermal Shock Properties of Chemically Toughened Borosilicate Glass"; Journal of Non-Crystallin Solids, 247, (1999) pp. 39-49.

Pflitsch et al; "Sol-gel deposition of chromium doped aluminum oxide films (Ruby) for surface temperature sensor application", Chem. Mater., vol. 20, pp. 2773-2778, 2008.

Poumellec et al; "Surface topography change induced by poling in Ge doped silica glass films"; 2003 OSA/BGPP 2003 MD 38.

Reddy et al. "Fracture Toughness Measurement of Glass and Ceramic Materials Using Chevron-Notched Specimens" J. Am. Ceram. Soc. 71 (6) C-310-C313 (1988).

Reseat, Available Online at <https://www.reseat.or.kr/static/view/forPrint.jsp?siteId=portal>, Retrieved on Jan. 19, 2021, 1 page (Original Document Only).

Rukmani et al., "Effects of V and Mn Colorants on the Crystallization Behavior and Optical Properties of Ce-Doped Li-Disilicate Glass", In Journal of American Ceramic Society, vol. 90, 2007, pp. 706-711.

Rusan et al; "A New Method for Recording Phase Optical Structures in Glasses"; Glass Physics and Chemistry, 2010, vol. 36, No. 4, pp. 513-516.

Sglavo & Green, "Flaw-insensitive ion-exchanged glass: 11, Production and mechanical performance" J. Am. Ceram. Soc. 84(8) pp. 1832-1838 (2001).

Sglavo et al. "procedure for residual stress profile determination by curvature measurements" Mechanics of Materias, 2005, 37(8) pp. 887-898.

Shen et al; "Control of concentration profiles in two step ion exchanged glasses"; Phys. Chem. Glasses, 2003 44 (4), 284-92.

* cited by examiner

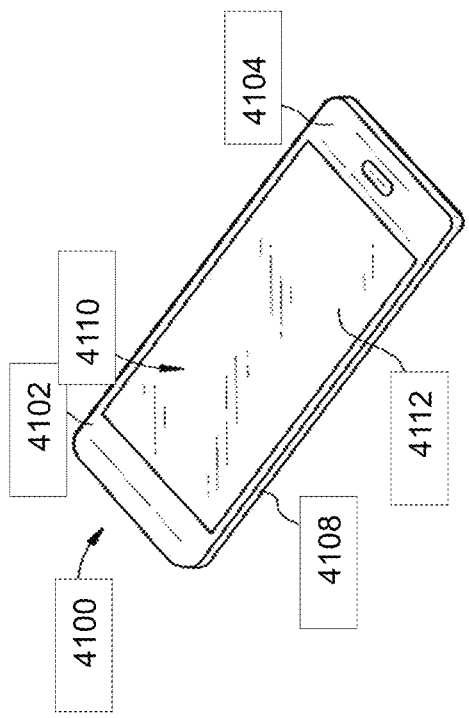
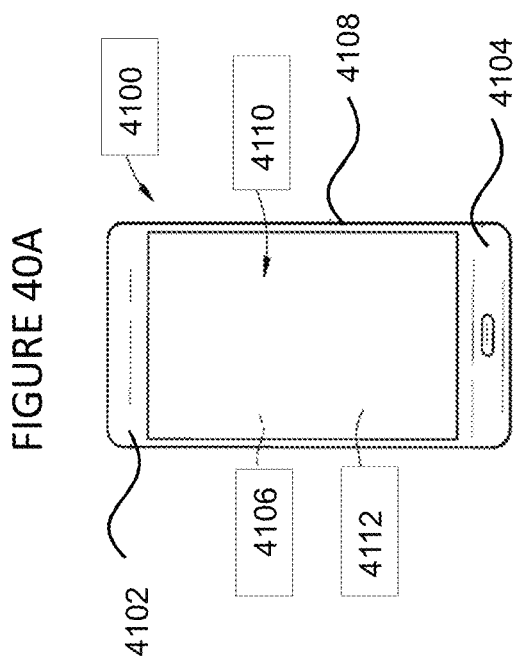

GLASS-BASED ARTICLES INCLUDING A STRESS PROFILE COMPRISING TWO REGIONS

CROSS-REFERENCE TO RELATED APPLICATIONS

This application is a divisional application and claims the benefit of priority under 35 U.S.C. § 120 of U.S. application Ser. No. 16/294,022 filed on Mar. 6, 2019, which in turn, is a divisional application and claims the benefit of priority under 35 U.S.C. § 120 of U.S. application Ser. No. 15/482,160 filed on Apr. 7, 2017, now U.S. Pat. No. 10,271,442 granted Apr. 23, 2019, which in turn, claims the benefit of priority under 35 U.S.C. § 119 of U.S. Provisional Application Ser. No. 62/320,109 filed on Apr. 8, 2016, the contents of each of which are relied upon and incorporated herein by reference in their entireties.

BACKGROUND

This disclosure relates to glass-based articles exhibiting improved damage resistance, including improved fracture resistance, and more particularly to fusion-formable, glass and glass ceramic articles exhibiting a non-zero metal oxide concentration gradient or concentration that varies along a substantial portion of the thickness. This disclosure also relates to glass-based articles including a stress profile comprising two regions with varying tangents.

Glass-based articles often experience severe impacts that can introduce large flaws into a surface of such articles. Such flaws can extend to depths of up to about 200 micrometers from the surface. Traditionally, thermally tempered glass has been used to prevent failures caused by the introduction of such flaws into the glass because thermally tempered glass often exhibits large compressive stress (CS) layers (e.g., approximately 21% of the total thickness of the glass), which can prevent the flaws from propagating further into the glass and thus, can prevent failure. An example of a stress profile generated by thermal tempering is shown in FIG. 1. In FIG. 1, the thermally treated glass article 100 includes a first surface 101, a thickness $t_1$, and a surface CS 110. The thermally treated glass article 100 exhibits a CS that decreases from the first surface 101 to a depth of compression (DOC) 130, as defined herein, at which depth the stress changes from compressive to tensile stress and reaches a maximum central tension (CT) 120.

Thermal tempering is currently limited to thick glass-based articles (i.e., glass-based articles having a thickness $t_1$ of about 3 millimeters or greater) because, to achieve the thermal strengthening and the desired residual stresses, a sufficient thermal gradient must be formed between the core of such articles and the surface. Such thick articles are undesirable or not practical in many applications such as display (e.g., consumer electronics, including mobile phones, tablets, computers, navigation systems, and the like), architecture (e.g., windows, shower panels, countertops etc.), transportation (e.g., automotive, trains, aircraft, sea craft, etc.), appliance, or any application that requires superior fracture resistance but thin and light-weight articles.

Although chemical strengthening is not limited by the thickness of the glass-based article in the same manner as thermally tempering, known chemically strengthened glass-based articles do not exhibit the stress profile of thermally tempered glass-based articles. An example of a stress profile generated by chemical strengthening (e.g., by an ion exchange process), is shown in FIG. 2. In FIG. 2, the chemically strengthened glass-based article 200 includes a first surface 201, a thickness $t_2$ and a surface CS 210. The glass-based article 200 exhibits a CS that decreases from the first surface 201 to a DOC 230, as defined herein, at which depth the stress changes from compressive to tensile stress and reaches a maximum CT 220. As shown in FIG. 2, such profiles exhibit a substantially flat CT region or CT region with a constant or near constant tensile stress along at least a portion of the CT region. Often, known chemically strengthened glass-based articles exhibit a lower maximum CT value, as compared to the maximum central value shown in FIG. 1.

It would be desirable to provide glass-based articles that have relatively high compressive stress at the surface of the article, a first stress profile region having a steep slope or tangent and a second stress profile region having a less steep profile region, and methods of providing such glass articles.

SUMMARY

A first aspect of this disclosure pertains to a glass-based article including a first surface and a second surface opposing the first surface defining a thickness (t), a concentration of a metal oxide that is both non-zero and varies along a thickness range from about $0 \cdot t$ to about $0.3 \cdot t$; and a central tension (CT) region comprising a maximum CT of less than about 80 MPa. In one or more embodiments, the when the glass-based article is fractured, the glass-based article fractures into at least 2 fragments/inch$^2$. In one or more embodiments, when the glass-based article is fractured, the glass-based article fractures into at least 1 fragment/inch$^2$ up to 40 fragments/inch$^2$.

In one or more embodiments, the concentration of the metal oxide is non-zero and varies along the entire thickness. In one or more embodiments, the metal oxide generates a stress along the thickness range. The monovalent ion of the metal oxide may have the largest ionic diameter of all of the monovalent ions of the metal oxides in the glass-based substrate. The concentration of the metal oxide may decrease from the first surface to a value at a point between the first surface and the second surface and increases from the value to the second surface. For example, the concentration of the metal oxide at the first surface may be about 1.5 times greater than the concentration of the metal oxides at a depth equal to about $0.5 \cdot t$. In some instances, the concentration of the metal oxide is about 0.05 mol % or greater throughout the thickness (e.g., in the range from about 1 mol % to about 15 mol %). The metal oxide may include any one or more of $Li_2O$, $Na_2O$, $K_2O$, $Rb_2O$, and $Cs_2O$. In one or more embodiments, the metal oxide concentration gradient may be present in the CT region of the glass-based article.

In one or more embodiments, the glass-based article includes a stress profile extending along the thickness, wherein all points of the stress profile between a thickness range from about $0 \cdot t$ up to $0.3 \cdot t$ and from greater than $0.7 \cdot t$, comprise a tangent having a slope that is less than about −0.1 MPa/micrometers or greater than about 0.1 MPa/micrometers. In some embodiments, the stress profile comprises a maximum CS, a DOC and a maximum CT of less than about 80 MPa, wherein the ratio of maximum CT to maximum absolute value of CS is in the range from about 0.01 to about 0.2 and wherein the DOC is about $0.1 \cdot t$ or greater. When the glass-based article of one or more embodiments is fractured, the glass-based article fractures into at least 2 fragments/inch$^2$.

The glass-based article of one or more embodiments may include a surface compressive stress (CS) of about 300 MPa or greater or about 500 MPa or greater. In some embodiments, the glass-based article includes a surface CS of about 200 MPa or greater and a chemical depth of layer of about 0.4·t or greater. In one or more embodiments, the CS may extend from the first surface to a DOC, wherein the DOC is about 0.1 t or greater. The glass-based article of some embodiments exhibits a ratio of maximum CT to absolute value of surface CS (which may include the maximum CS) in the range from about 0.01 to about 0.2. Optionally, the absolute value of surface CS is greater than the maximum CT.

In one or more embodiments, the glass-based article includes a first metal oxide concentration and a second metal oxide concentration, wherein the first metal oxide concentration is in the range from about 0 mol % to about 15 mol % from a first thickness range from about 0·t to about 0.5·t, and wherein the second metal oxide concentration is in the range from about 0 mol % to about 10 mol % from a second thickness range from about 0 micrometers to about 25 micrometers. Optionally, the glass-based article includes a third metal oxide.

In one or more embodiments, the glass-based article includes a concentration of a metal oxide that is both non-zero and varies along a thickness range from about 0·t to about 0.3·t (or from about 0·t to about 0.4·t or from about 0·t to about 0.45·t), a surface compressive stress of about 200 MPa or greater; and a CT region having a maximum CT of less than about 80 MPa.

The glass-based article may have a thickness t of about 3 millimeters or less or about 1 millimeter or less. The glass-based article may have an amorphous structure, a crystalline structure or a combination of both. The glass-based article may exhibit a transmittance of about 88% or greater over a wavelength in the range from about 380 nm to about 780 nm. Moreover, in some embodiments, the glass-based article may exhibit a CIELAB color space coordinates, under a CIE illuminant F02, of L* values of about 88 and greater, a* values in the range from about −3 to about +3, and b* values in the range from about −6 to about +6.

In one or more embodiments, the glass-based article includes a Young's modulus of less than 80 GPa. The glass-based article includes a liquidus viscosity of about 100 kilopoise (kP) or greater.

The glass-based article may include a composition having any one or more of: a composition comprising a combined amount of $Al_2O_3$ and $Na_2O$ of greater than about 15 mol %, a composition comprising greater than about 4 mol % $Na_2O$, a composition substantially free of $B_2O_3$, ZnO, or both $B_2O_3$ and ZnO, and a composition comprising a non-zero amount of $P_2O_5$.

The glass-based article may include a diffusivity of about 450 $\mu m^2$/hour or greater at about 460° C. and a DOC greater than about 0.15·t, and wherein the absolute value of surface CS is 1.5 times the maximum CT or greater.

In some embodiments, the glass-based article comprises a fracture toughness ($K_{1C}$) of about 0.7 MPa·m$^{1/2}$ or greater.

In one or more embodiments, the glass-based article exhibits a stored tensile energy of about greater than 0 J/m2 to less than 20 J/m$^2$.

In one or more embodiments, the glass-based article includes a stress profile including a CS region and a CT region, wherein the CT region is approximated by the equation Stress(x)=MaxCT−(((MaxCT·(n+1))/0.5$^n$)·|(x/t)−0.5|$^n$), wherein MaxCT is a maximum CT value and is a positive value in units of MPa, x is position along the thickness (t) in micrometers, and n is between 1.5 and 5. In some embodiments, the CT region comprises a maximum CT value in the range from about 50 MPa to about 250 MPa and the maximum CT value is at a depth in the range from about 0.4t to about 0.6t. In some instances, from a thickness in the range from about 0t to about 0.1t microns, the stress profile comprises a slope in the range from about 20 MPa/microns to about 200 MPa/microns. In one or more embodiments, the stress profile is defined by a plurality of error functions as measured from 0.5t to the surface.

A second aspect of this disclosure pertains to the use of a glass composition in a strengthened glass-based article, comprising (in mol %): $SiO_2$ in an amount in the range from about 60 to about 75, $Al_2O_3$ in an amount in the range from about 12 to about 20, $B_2O_3$ in an amount in the range from about 0 to about 5, $Li_2O$ in an amount in the range from about 2 to about 8, $Na_2O$ in an amount greater than 4, $P_2O_5$ in a non-zero amount, MgO in an amount in the range from about 0 to about 5, ZnO in an amount in the range from about 0 to about 3, CaO in an amount in the range from about 0 to about 5, wherein the glass composition is ion-exchangeable and is amorphous, wherein the total amount of $Al_2O_3$ and $Na_2O$ is greater than about 15 mol %, wherein the glass composition is substantially free of nucleating agents, and wherein the glass composition comprises a liquidus viscosity of about 100 kP or greater. In one or more embodiments, the glass composition is substantially free of $B_2O_3$, ZnO, or both $B_2O_3$ and ZnO.

A third aspect of this disclosure pertains to a glass substrate comprising a composition including, in mol %, $SiO_2$ in an amount in the range from about 60 to about 75, $Al_2O_3$ in an amount in the range from about 12 to about 20, $B_2O_3$ in an amount in the range from about 0 to about 5, $Li_2O$ in an amount in the range from about 2 to about 8, $Na_2O$ in an amount greater than about 4, MgO in an amount in the range from about 0 to about 5, ZnO in an amount in the range from about 0 to about 3, CaO in an amount in the range from about 0 to about 5, and $P_2O_5$ in a non-zero amount; wherein the glass substrate is ion-exchangeable and is amorphous, wherein total amount of $Al_2O_3$ and $Na_2O$ in the composition is greater than about 15 mol %, wherein the glass composition is substantially free of nucleating agents and comprises a liquidus viscosity of about 100 kP or greater.

In some embodiments, the glass substrate is amorphous and is strengthened, wherein the $Na_2O$ concentration varies, wherein the composition is substantially free of nucleating agents, total amount of $Al_2O_3$ and $Na_2O$ in the composition is greater than about 15 mol %, and comprises a liquidus viscosity of about 100 kP or greater. In some embodiments the glass substrate includes a non-zero amount of $P_2O_5$.

A fourth aspect of the disclosure pertains to a glass-based article comprising a first surface and a second surface opposing the first surface defining a thickness (t) in a range of 0.1 mm and 2 mm; and a stress profile extending along the thickness (t), wherein at least one point of the stress profile in a first thickness range from about 0·t up to 0.020·t and greater than 0.98·t comprises a tangent having a slope of from about −200 MPa/micrometer to about −25 MPa/micrometer or about 25 MPa/micrometer to about 200 MPa/micrometer, wherein all points of the stress profile in a second thickness range from about 0.035·t and less than 0.965·t comprise a tangent having a slope of from about −15 MPa/micrometer to about 15 MPa/micrometer, wherein the stress profile comprises a surface CS of from about 200 MPa to about 1100 MPa, and wherein the stress profile comprises a DOC ranging from about 0.1 t to 0.25·t. In some embodiments all points of the stress profile in the first thickness range from about 0·t up to 0.020·t and greater than 0.98·t comprise a tangent having a slope of from about −200 MPa/micrometer to about −25 MPa/micrometer or about 25 MPa/micrometer to about 200 MPa/micrometer.

In one or more embodiments, all points of the stress profile in the second thickness range comprise a tangent having a slope of from about −2 MPa/micrometer to about 2 MPa/micrometer.

In one or more embodiments, all points of the stress profile in the second thickness range from about 0.025·t and less than 0.975·t comprise a tangent having a slope of from about −15 MPa/micrometer to about 15 MPa/micrometer. In some embodiments, all points of the stress profile in the second thickness range comprise a tangent having a slope of from about −2 MPa/micrometer to about 2 MPa/micrometer.

In one or more embodiments, all points of the stress profile in the second thickness range from about 0.02·t and less than 0.98·t comprise a tangent having a slope of from about −15 MPa/micrometer to about 15 MPa/micrometer. In some embodiments, all points of the stress profile in the second thickness range comprise a tangent having a slope of from about −2 MPa/micrometer to about 2 MPa/micrometer.

In one or more embodiments, the stress profile in the second thickness range forms a power-law profile having a power exponent, wherein the power exponent is between about 1.2 to 3.2. In some embodiments, the power exponent is between about 1.3 and 2.8.

In one or more embodiments, the surface CS is from about 300, 350, 400, 450, 500, 550, 600, 610, 620 MPa to about 650, 700, 750, 800, 850, 900, 950, 1000 or 1100 MPa.

In one or more embodiments, at least one point of the stress profile in the first thickness range comprises a tangent having a slope of from about −170 MPa/micrometer to about −30 MPa/micrometer or about 30 MPa/micrometer to about 170 MPa/micrometer. In one or more embodiments, all points of the stress profile in the first thickness range comprise a tangent having a slope of from about −170 MPa/micrometer to about −30 MPa/micrometer or about 30 MPa/micrometer to about 170 MPa/micrometer. In some embodiments, all points of the stress profile in the first thickness range comprise a tangent having a slope of from about −140 MPa/micrometer to about −35 MPa/micrometer or about 35 MPa/micrometer to about 140 MPa/micrometer. In some embodiments, at least one point of the stress profile in the first thickness range comprise a tangent having a slope of from about −140 MPa/micrometer to about −35 MPa/micrometer or about 35 MPa/micrometer to about 140 MPa/micrometer.

In one or more embodiments, at least one point of the stress profile in a first thickness range from about 0·t up to 0.025·t and greater than 0.975·t comprises a tangent having a slope of from about −200 MPa/micrometer to about −25 MPa/micrometer or about 25 MPa/micrometer to about 200 MPa/micrometer. In one or more embodiments, all points of the stress profile in a first thickness range from about 0·t up to 0.025·t and greater than 0.975·t comprise a tangent having a slope of from about −200 MPa/micrometer to about −25 MPa/micrometer or about 25 MPa/micrometer to about 200 MPa/micrometer. In some embodiments, at least one point of the stress profile in the first thickness range comprises a tangent having a slope of from about −170 MPa/micrometer to about −30 MPa/micrometer or about 30 MPa/micrometer to about 170 MPa/micrometer. In some embodiments, at least one point of, and in other embodiments all points of, the stress profile in the first thickness range comprise a tangent having a slope of from about −170 MPa/micrometer to about −30 MPa/micrometer or about 30 MPa/micrometer to about 170 MPa/micrometer. In some embodiments at least one point of, and in other embodiments all points of, the stress profile in the first thickness range comprise a tangent having a slope of from about −140 MPa/micrometer to about −35 MPa/micrometer or about 35 MPa/micrometer to about 140 MPa/micrometer.

In one or more embodiments at least one point of, and in other embodiments all points of, the stress profile in a first thickness range from about 0·t up to 0.035·t and greater than 0.965·t comprise a tangent having a slope of from about −200 MPa/micrometer to about −25 MPa/micrometer or about 25 MPa/micrometer to about 200 MPa/micrometer. In some embodiments at least one point of, and in other embodiments all points of, the stress profile in the first thickness range comprise a tangent having a slope of from about −170 MPa/micrometer to about −30 MPa/micrometer or about 30 MPa/micrometer to about 170 MPa/micrometer. In some embodiments at least one point of, and in other embodiments all points of, the stress profile in the first thickness range comprise a tangent having a slope of from about −140 MPa/micrometer to about −35 MPa/micrometer or about 35 MPa/micrometer to about 140 MPa/micrometer.

In one or more embodiments, the first thickness range is obtained by ion exchange in a K-containing salt.

In one or more embodiments, the second thickness range is obtained by ion exchange in a Na-containing salt.

In one or more embodiments, the stress profile is obtained using a single ion-exchange step.

In one or more embodiments, the stress profile is obtained using two or more ion-exchange steps.

In one or more embodiments, the surface CS is between about 690 MPa and 950 MPa.

In one or more embodiments, the glass-based article comprises a composition comprising between about 0.5 mol % $P_2O_5$ and 10 mol % $P_2O_5$.

A fifth aspect of the disclosure pertains to a glass-based article comprising a center plane, wherein the center plane comprises from about 2 to about 20 mol-% $Li_2O$; a first surface and a second surface opposing the first surface defining a thickness (t) in a range of 0.1 mm and 2 mm; and a stress profile extending along the thickness (t), wherein at least one point of the stress profile in a first thickness range from about 0·t up to 0.020·t and greater than 0.98·t comprises a tangent having a slope of from about −200 MPa/micrometer to about −25 MPa/micrometer or about 25 MPa/micrometer to about 200 MPa/micrometer, wherein the stress profile comprises a surface CS of from about 200 MPa to about 1100 MPa, and wherein the stress profile comprises a DOC ranging from about 0.05·t to 0.25·t. In some embodiments, all the points of the stress profile in the first thickness range from about 0·t up to 0.020·t and greater than 0.98·t comprises a tangent having a slope of from about −200 MPa/micrometer to about −25 MPa/micrometer or about 25 MPa/micrometer to about 200 MPa/micrometer.

In one or more embodiments, the first thickness range is obtained by ion exchange in a K-containing salt.

In one or more embodiments, the second thickness range is obtained by ion exchange in a Na- or K-containing salt.

In one or more embodiments, the stress profile is obtained using a single ion-exchange step.

In one or more embodiments, the stress profile is obtained using two or more ion-exchange steps.

In one or more embodiments, the surface CS ranges from about 690 MPa and 950 MPa.

In one or more embodiments, the stress profile in the second thickness range forms a power-law profile having a power exponent, wherein the power exponent is between about 1.2 to 3.4. In some embodiments, the power exponent is between about 1.3 and 2.8.

In one or more embodiments, the glass-based article comprises a composition comprising about 0.5 mol % $P_2O_5$ and 10 mol % $P_2O_5$.

In one or more embodiments, the center-plane further comprises a composition comprising from about 0.5 mol % and 20 mol % $Na_2O$. In some embodiments, the center-plane further comprises a composition comprising from about 2 mol % and 10 mol % $Li_2O$. In some embodiments, the concentration of $Na_2O$ in the center plane of the glass article is between about 5 mol % and 16 mol %. In some embodiments, the concentration of $Na_2O$ in the center plane of the glass article is between about 10 mol % and 15 mol %. In some embodiments, the concentration of $Li_2O$ in the center plane of the glass article is between about 3 mol % and 10 mol %.

In one or more embodiments, processes are provided to obtain stress profiles described herein. Such processes involve relatively long ion exchange times, either by a single ion exchange or by two or more ion exchanges. According to one or more embodiment, ion exchange time are greater than 1 hour, greater than 1.5 hours, greater than 2 hours, greater than 2.5 hours, greater than 3 hours, greater than 3.5 hours, greater than 4 hours, greater than 4.5 hours, greater than 5 hours, greater than 5.5 hours, greater than 6 hours, greater than 6.5 hours, greater than 7 hours, greater than 7.5 hours and greater than 8 hours.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 40A is a plan view of an exemplary electronic device incorporating any of the glass-based articles disclosed herein.

FIG. 40B is a perspective view of the exemplary electronic device of FIG. 40A.

DETAILED DESCRIPTION

Figure 1:
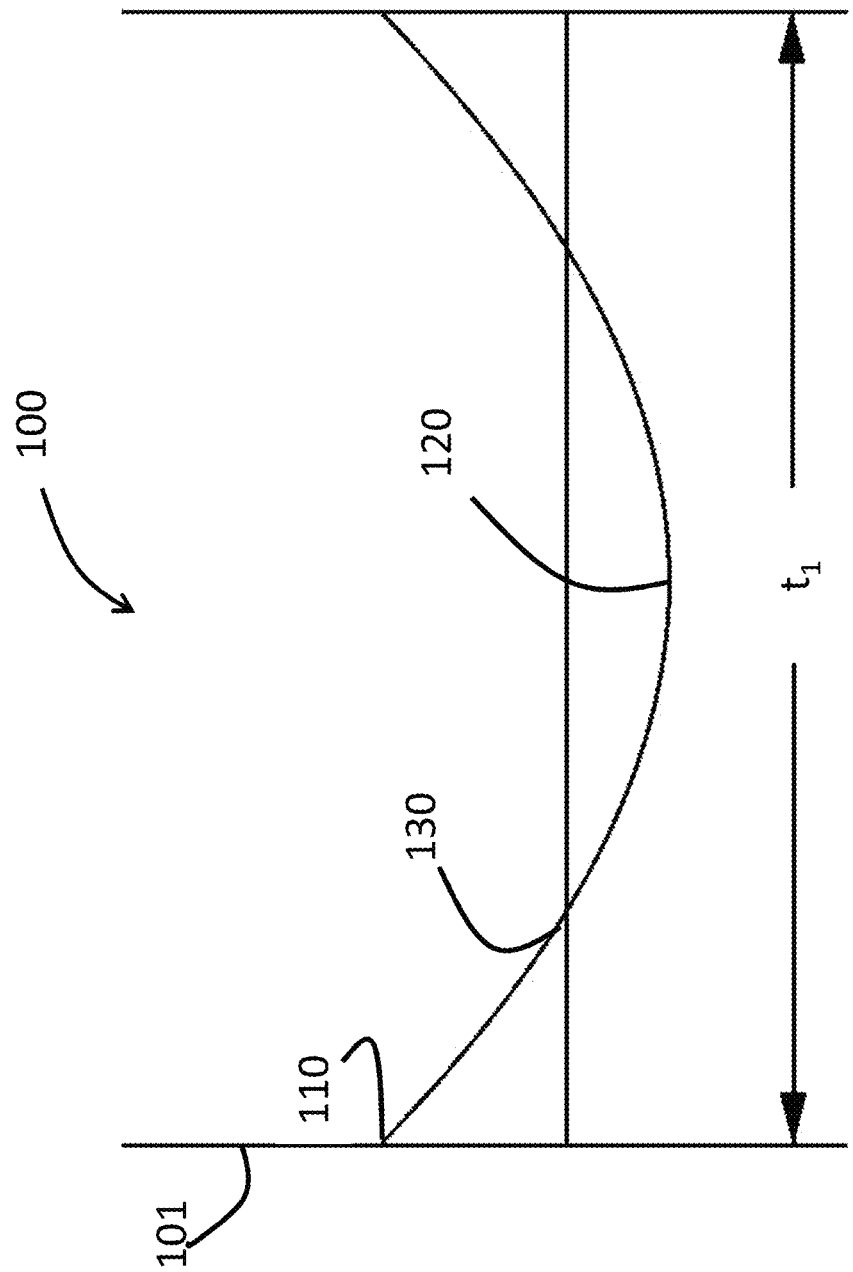
FIG. 1 is a cross-sectional view across a thickness of a known, thermally tempered glass article.

Reference will now be made in detail to various embodiments, examples of which are illustrated in the accompanying examples and drawings.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

As used herein, the terms "glass-based article" and "glass-based substrates" are used in their broadest sense to include any object made wholly or partly of glass. Glass-based articles include laminates of glass and non-glass materials, laminates of glass and crystalline materials, and glass-ceramics (including an amorphous phase and a crystalline phase). Unless otherwise specified, all compositions are expressed in terms of mole percent (mol %).

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, for example, a glass-based article that is "substantially free of MgO" is one in which MgO is not actively added or batched into the glass-based article, but may be present in very small amounts as a contaminant.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

Unless otherwise specified, all temperatures are expressed in terms of degrees Celsius (° C.). As used herein the term "softening point" refers to the temperature at which the viscosity of a glass is approximately $10^{7.6}$ poise (P), the term "anneal point" refers to the temperature at which the viscosity of a glass is approximately $10^{13.2}$ poise, the term "200 poise temperature ($T^{200P}$)" refers to the temperature at which the viscosity of a glass is approximately 200 poise, the term "$10^{11}$ poise temperature" refers to the temperature at which the viscosity of a glass is approximately $10^{11}$ poise, the term "35 kP temperature ($T^{35kP}$)" refers to the temperature at which the viscosity of a glass is approximately 35 kilopoise (kP), and the term "160 kP temperature ($T^{160kP}$)" refers to the temperature at which the viscosity of a glass is approximately 160 kP.

Figure 2:
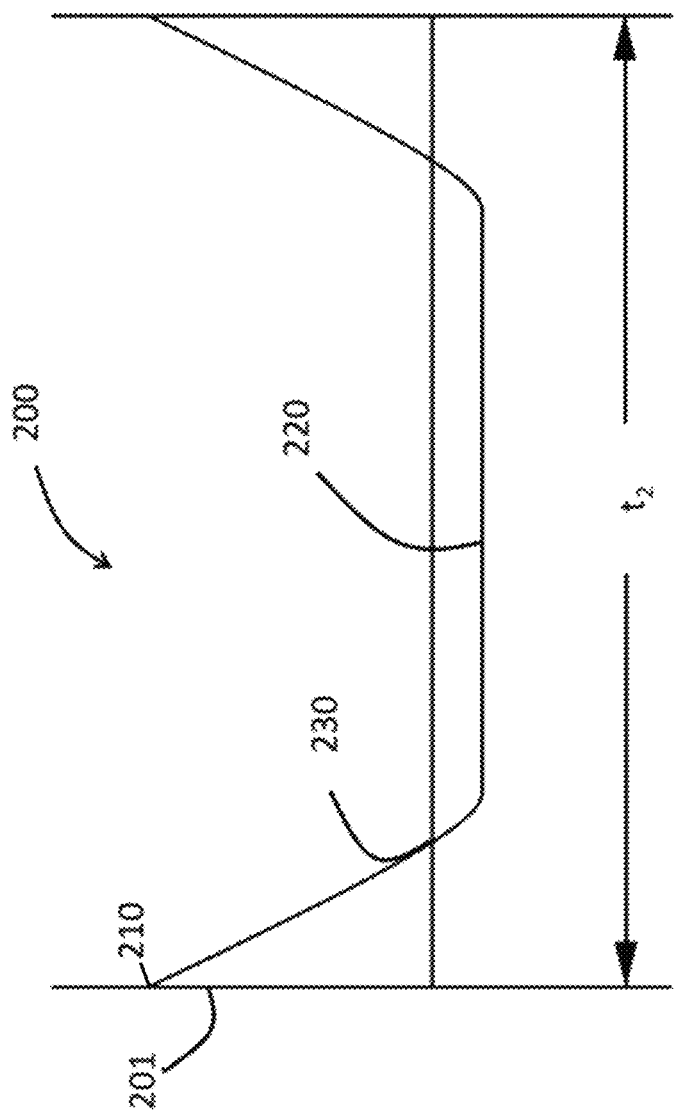
FIG. 2 is a cross-sectional view across a thickness of a known, chemically strengthened glass article.
Figure 3:
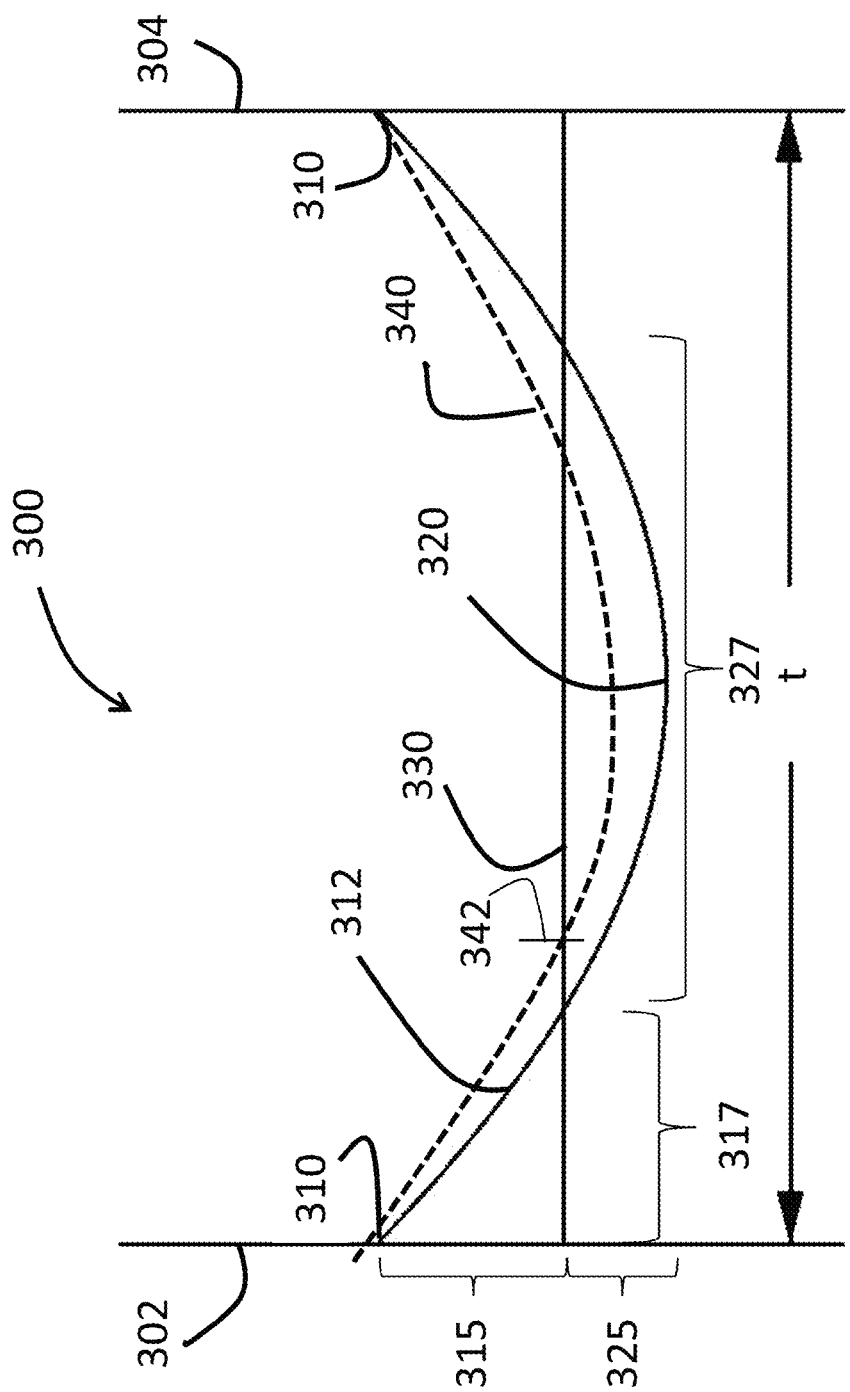
FIG. 3 is a cross-sectional view across a thickness of a chemically strengthened glass-based article according to one or more embodiments of this disclosure.

Referring to the drawings in general and to FIGS. 1-3 in particular, it will be understood that the illustrations are for the purpose of describing particular embodiments and are not intended to limit the disclosure or appended claims thereto. The drawings are not necessarily to scale, and certain features and certain views of the drawings may be shown exaggerated in scale or in schematic in the interest of clarity and conciseness.

As used herein, DOC refers to the depth at which the stress within the glass-based article changes compressive to tensile stress. At the DOC, the stress crosses from a positive (compressive) stress to a negative (tensile) stress (e.g., 130 in FIG. 1) and thus exhibits a stress value of zero.

As used herein, the terms "chemical depth", "chemical depth of layer" and "depth of chemical layer" may be used interchangeably and refer to the depth at which an ion of the metal oxide or alkali metal oxide (e.g., the metal ion or alkali metal ion) diffuses into the glass-based article and the depth at which the concentration of the ion reaches a minimum value, as determined by Electron Probe Micro-Analysis (EPMA) or Glow Discharge-Optical Emission Spectroscopy (GD-OES)). In particular, to assess the depth of $Na_2O$ diffusion or Na+ ion concentration may be determined using EPMA and a surface stress meter (described in more detail below).

According to the convention normally used in the art, compressive stress is expressed as a negative (<0) and tensile stress is expressed as a positive (>0) stress. Throughout this description, however, CS is expressed as a positive or absolute value—i.e., as recited herein, CS=|CS|.

Described herein are thin, chemically strengthened glass-based articles that include glasses, such as silicate glasses including alkali-containing glass, and glass-ceramics that may be used as a cover glass for mobile electronic devices and touch-enabled displays. The glass-based articles may also be used in displays (or as display articles) (e.g., billboards, point of sale systems, computers, navigation systems, and the like), architectural articles (walls, fixtures, panels, windows, etc.), transportation articles (e.g., in automotive applications, trains, aircraft, sea craft, etc.), appliances (e.g., washers, dryers, dishwashers, refrigerators and the like), or any article that requires some fracture resistance.

In particular, the glass-based articles described herein are thin and exhibit stress profiles that are typically only achievable through thermal tempering thick glass articles (e.g., having a thickness of about 2 mm or 3 mm or greater). The glass-based articles exhibit unique stress profiles along the thickness thereof. In some cases, the glass-based articles described herein exhibit a greater surface CS than thermally tempered glass articles. In one or more embodiments, the glass-based articles have a compressive stress layer that extends deeper into the glass-based article (in which the CS decreases and increases more gradually than known chemically strengthened glass-based articles) such that the glass-based article exhibits substantially improved fracture resistance, even when the glass-based article or a device including the same is dropped on a hard surface (e.g., granite) or a hard and rough surface (e.g., asphalt). The glass-based articles of one or more embodiments exhibit a greater maximum CT value than some known chemically strengthened glass substrates.

CS and depth of penetration of potassium ions ("Potassium DOL"), or depth of chemical layer "DOL" or "chemical DOL", which are typically indicative of the depth of the compressive stress layer particularly of a surface spike as typically caused by potassium ions, are measured using those means known in the art. As used herein, DOC means the depth at which the stress in the chemically strengthened alkali aluminosilicate glass article described herein changes from compressive to tensile. DOC may be measured by FSM or a scattered light polariscope (SCALP) depending on the ion exchange treatment. Where the stress in the glass article is generated by exchanging potassium ions into the glass article, FSM is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by FSM.

Potassium DOL is distinguished from DOC because it represents the depth of potassium penetration as a result of an ion exchange process. Potassium DOL is typically less than the DOC for the articles described herein. CS and Potassium DOL are measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to a modified version of Procedure C described in ASTM standard C770-98 (2013), entitled "Standard Test Method for Measurement of Glass Stress-Optical Coefficient," the contents of which are incorporated herein by reference in their entirety. The modification includes using a glass disc as the specimen with a thickness of 5 to 10 mm and a diameter of 12.7 mm, wherein the disc is isotropic and homogeneous and core drilled with both faces polished and parallel. The modification also includes calculating the maximum force, Fmax to be applied. The force should be sufficient to produce 20 MPa or more compression stress. Fmax is calculated as follows:

$$F\max=7.854*D*h$$

Where:
Fmax=Force in Newtons
D=the diameter of the disc
h=the thickness of the light path
For each force applied, the stress is computed as follows:

$$\sigma_{MPa}=8F/(\pi*D*h)$$

Where:
F=Force in Newtons
D=the diameter of the disc
h=the thickness of the light path Maximum CT values are measured using a scattered light polariscope (SCALP). Refracted near-field (RNF) method or SCALP may be used to measure the stress profile. When the RNF method is utilized, the maximum CT value provided by SCALP is utilized. In particular, the stress profile measured by the RNF method is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass-based article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal. The RNF profile is then smoothed, and used for the CT region. As noted above, the FSM technique is used for the surface CS and slope of the stress profile in the CS region near the surface.

As stated above, the glass-based articles described herein are chemically strengthened by ion exchange and exhibit stress profiles that are distinguished from those exhibited by known strengthened glass articles. In this disclosure glass-based substrates are generally unstrengthened and glass-based articles generally refer to glass-based substrates that have been strengthened (by, for example, ion exchange). In this process, ions at or near the surface of the glass-based article are replaced by—or exchanged with—larger ions having the same valence or oxidation state. In those embodiments in which the glass-based article comprises an alkali aluminosilicate glass, ions in the surface layer of the glass and the larger ions are monovalent alkali metal cations, such as $Li^+$ (when present in the glass-based article), Nat, K+, Rb+, and Cst. Alternatively, monovalent cations in the surface layer may be replaced with monovalent cations other than alkali metal cations, such as $Ag^+$ or the like.

Ion exchange processes are typically carried out by immersing a glass-based substrate in a molten salt bath (or two or more molten salt baths) containing the larger ions to be exchanged with the smaller ions in the glass-based substrate. It should be noted that aqueous salt baths may also be utilized. In addition, the composition of the bath(s) may include more than one type of larger ion (e.g., Na+ and K+) or a single larger ion. It will be appreciated by those skilled in the art that parameters for the ion exchange process, including, but not limited to, bath composition and temperature, immersion time, the number of immersions of the glass-based article in a salt bath (or baths), use of multiple salt baths, additional steps such as annealing, washing, and the like, are generally determined by the composition of the glass-based article (including the structure of the article and any crystalline phases present) and the desired DOL or DOC and CS of the glass-based article that results from strengthening. By way of example, ion exchange of glass-based substrates may be achieved by immersion of the glass-based substrates in at least one molten bath containing a salt such as, but not limited to, nitrates, sulfates, and chlorides of the larger alkali metal ion. Typical nitrates include $KNO_3$, $NaNO_3$, $LiNO_3$, $NaSO_4$ and combinations thereof. The temperature of the molten salt bath typically is in a range from about 380° C. up to about 450° C., while immersion times range from about 15 minutes up to about 100 hours depending on glass thickness, bath temperature and glass diffusivity. However, temperatures and immersion times different from those described above may also be used.

In one or more embodiments, the glass-based substrates may be immersed in a molten salt bath of 100% $NaNO_3$ having a temperature from about 370° C. to about 480° C.

In some embodiments, the glass-based substrate may be immersed in a molten mixed salt bath including from about 5% to about 90% $KNO_3$ and from about 10% to about 95% $NaNO_3$. In some embodiments, the glass-based substrate may be immersed in a molten mixed salt bath including $Na_2SO_4$ and $NaNO_3$ and have a wider temperature range (e.g., up to about 500° C.). In one or more embodiments, the glass-based article may be immersed in a second bath, after immersion in a first bath. Immersion in a second bath may include immersion in a molten salt bath including 100% $KNO_3$ for 15 minutes to 8 hours.

In one or more embodiments, the glass-based substrate may be immersed in a molten, mixed salt bath including $NaNO_3$ and $KNO_3$ (e.g., 49%/51%, 50%/50%, 51%/49%) having a temperature less than about 420° C. (e.g., about 400° C. or about 380° C.) for less than about 5 hours, or even about 4 hours or less.

Ion exchange conditions can be tailored to provide a "spike" or to increase the slope of the stress profile at or near the surface of the resulting glass-based article. This spike can be achieved by single bath or multiple baths, with the bath(s) having a single composition or mixed composition, due to the unique properties of the glass compositions used in the glass-based articles described herein.

As illustrated in FIG. 3, the glass-based article 300 of one or more embodiments includes a first surface 302 and a second surface 304 opposing the first surface, defining a thickness t. In one or more embodiments, the thickness t may be about 3 millimeters or less (e.g., in the range from about 0.01 millimeter to about 3 millimeters, from about 0.1 millimeter to about 3 millimeters, from about 0.2 millimeter to about 3 millimeters, from about 0.3 millimeter to about 3 millimeters, from about 0.4 millimeter to about 3 millimeters, from about 0.01 millimeter to about 2.5 millimeters, from about 0.01 millimeter to about 2 millimeters, from about 0.01 millimeter to about 1.5 millimeters, from about 0.01 millimeter to about 1 millimeter, from about 0.01 millimeter to about 0.9 millimeter, from about 0.01 millimeter to about 0.8 millimeter, from about 0.01 millimeter to about 0.7 millimeter, from about 0.01 millimeter to about 0.6 millimeter, from about 0.01 millimeter to about 0.5 millimeter, from about 0.1 millimeter to about 0.5 millimeter, or from about 0.3 millimeter to about 0.5 millimeter.)

The glass-based article includes a stress profile that extends from the first surface 302 to the second surface 304 (or along the entire length of the thickness t). In the embodiment shown in FIG. 3, the stress profile 312 as measured by the techniques described herein is shown along with the stress profile 340 estimated by FSM techniques as described herein. The x-axis represents the stress value and the y-axis represents the thickness or depth within the glass-based article.

As illustrated in FIG. 3, the stress profile 312 includes a CS layer 315 (with a surface CS 310), a CT layer 325 (with a maximum CT 320) and a DOC 317 at which the stress profile 312 turns from compressive to tensile at 330. The CT layer 325 also has an associated depth or length 327 (CT region or layer). The estimated stress profile 340 includes a DOL that is greater than the DOC. As used herein, reference to the DOC and DOL is with respect to a depth from one surface (either the first surface 302 or the second surface 304), with the understanding that such DOC or DOL may also be present from the other surface.

The surface CS 310 may be about 150 MPa or greater or about 200 MPa or greater (e.g., about 250 MPa or greater, about 300 MPa or greater, about 400 MPa or greater, about 450 MPa or greater, about 500 MPa or greater, or about 550 MPa or greater). The surface CS 310 may be up to about 900 MPa, up to about 1000 MPa, up to about 1100 MPa, or up to about 1200 MPa. The surface CS values provided herein may also comprise the maximum CS. In some embodiments, the surface CS is less than the maximum CS.

The maximum CT 320 may be about 80 MPa or less, about 75 MPa or less, or about 70 MPa or less (e.g., about 60 MPa or less, about 55 MPa or less, 50 MPa or less, or about 40 MPa or less). In some embodiments, the maximum CT 320 may be in the range from about 25 MPa to about 80 MPa (e.g., from about 25 MPa to about 75 MPa, from about 25 MPa to about 70 MPa, from about 25 MPa to about 65 MPa, from about 45 MPa to about 80 MPa, from about 50 MPa to about 80 MPa, or from about 60 MPa to about 80 MPa).

The maximum CT 320 may be positioned at a range from about 0.3·t to about 0.7·t, from about 0.4·t to about 0.6·t or from about 0.45·t to about 0.55·t. It should be noted that any one or more of surface CS 310 and maximum CT 320 may be dependent on the thickness of the glass-based article. For example, glass-based articles having at thickness of about 0.8 mm may have a maximum CT of about 75 MPa or less. When the thickness of the glass-based article decreases, the maximum CT may increase. In other words, the maximum CT increases with decreasing thickness (or as the glass-based article becomes thinner).

In some embodiments, the ratio of the maximum CT 320 to the surface CS 310 in the range from about 0.01 to about 0.2 (e.g., in the range from about 0.01 to about 0.18, from about 0.01 to about 0.16, from about 0.01 to about 0.15, from about 0.01 to about 0.14, from about 0.01 to about 0.1, from about 0.02 to about 0.2, from about 0.04 to about 0.2, from about 0.05 to about 0.2, from about 0.06 to about 0.2, from about 0.08 to about 0.2, from about 0.1 to about 0.2, or from about 0.12 to about 0.2). In known chemically strengthened glass-based articles, the ratio of the maximum CT 320 to the absolute value of surface CS 310 is 0.2 or less, or about 0.15 or less. In some embodiments, absolute value of surface CS may be 1.5 times (or 2 times or 2.5 times) the maximum CT or greater. In some embodiments, the absolute value of surface CS may be up to about 48 times the maximum CT, up to 40 times the maximum CT, up to 20 times the maximum CT, 10 up to times the maximum CT, or up to 8 times the maximum CT. The absolute value of surface CS may be in the range from about 5 times up to about 50 times the maximum CT.

In one or more embodiments, the stress profile 312 comprises a maximum CS, which is typically the surface CS 310 and can be found at one or both of the first surface 302 and the second surface 304. In one or more embodiments, the CS layer or region 315 extends along a portion of the thickness to the DOC 317 and a maximum CT 320. In one or more embodiments, the DOC 317 may be about 0.1·t or greater. For example, the DOC 317 may be about 0.12·t or greater, about 0.14·t or greater, about 0.15·t or greater, about 0.16·t or greater, 0.17·t or greater, 0.18·t or greater, 0.19·t or greater, 0.20·t or greater, about 0.21 t or greater, or up to about 0.25·t. In some embodiments, the DOC 317 is less than the chemical depth 342. The chemical depth 342 may be about 0.4·t or greater, 0.5·t or greater, about 0.55·t or greater, or about 0.6·t or greater. In one or more embodiments, the stress profile 312 may be described as parabolic-like in shape. In some embodiments, the stress profile along the region or depth of the glass-based article exhibiting tensile stress exhibits a parabolic-like shape. In one or more specific embodiments, the stress profile 312 is free of a flat stress (i.e., compressive or tensile) portion or a portion that exhibits a substantially constant stress (i.e., compressive or tensile). In some embodiments, the CT region exhibits a stress profile that is substantially free of a flat stress or free of a substantially constant stress. In one or more embodiments, all points of the stress profile 312 between a thickness range from about 0t up to about 0.2·t and greater than 0.8·t (or from about 0·t to about 0.3·t and greater than 0.7·t) comprise a tangent having a slope that is less than about −0.1 MPa/micrometers or greater than about 0.1 MPa/micrometers. In some embodiments, the slope may be less than about −0.2 MPa/micrometers or greater than about 0.2 MPa/micrometers. In some more specific embodiments, the slope may be less than about −0.3 MPa/micrometers or greater than about 0.3 MPa/micrometers. In even more specific embodiments, the slope may be less than about −0.5 MPa/micrometers or greater than about 0.5 MPa/micrometers. In other words, the stress profile of one or more embodiments along these thickness ranges (i.e., 0·t up to about 0.2·t and greater than 0.8t, or from about 0·t to about 0.3·t and 0.7·t or greater) exclude points having a tangent with a slope, as described herein. Without being bound by theory, known error function or quasi-linear stress profiles have points along these thickness ranges (i.e., from about 0·t up to about 0.2·t and greater than 0.8·t, or from about 0·t to about 0.3·t and 0.7·t or greater) that have a tangent with a slope that is in the range from about −0.1 MPa/micrometers to about 0.1 MPa/micrometers, (indicating a flat or zero slope stress profile along such thickness ranges, as shown in FIG. 2, 220). The glass-based articles of one or more embodiments of this disclosure do not exhibit such a stress profile having a flat or zero slope stress profile along these thickness ranges, as shown in FIG. 3.

In one or more embodiments, the glass-based article exhibits a stress profile in a thickness range from about 0.1·t to 0.3·t and from about 0.7·t to 0.9·t that comprises a tangent with a maximum slope and a tangent with a minimum slope. In some instances, the difference between the maximum slope and the minimum slope is about 3.5 MPa/micrometers or less, about 3 MPa/micrometers or less, about 2.5 MPa/micrometers or less, or about 2 MPa/micrometers or less. In other embodiments, this thickness range in which the difference between the maximum and minimum slope falls within the above ranges comprises up to about 0.02·t and greater than 0.980·t, for example up to about 0.0250·t and greater than 0.9750·t, or up to about 0.0275·t and greater than 0.9725·t, or up to about 0.030·t and greater than 0.970·t, or up to about 0.0350·t and greater than 0.9650·t.

In one or more embodiments, the glass-based article includes a stress profile 312 that is substantially free of any flat segments that extend in a depth direction or along at least a portion of the thickness t of the glass-based article. In other words, the stress profile 312 is substantially continuously increasing or decreasing along the thickness t. In some embodiments, the stress profile is substantially free of any flat segments in a depth direction having a length of about 10 micrometers or more, about 50 micrometers or more, or about 100 micrometers or more, or about 200 micrometers or more. As used herein, the term "flat" refers to a slope having a magnitude of less than about 5 MPa/micrometer, or less than about 2 MPa/micrometer along the flat segment. In some embodiments, one or more portions of the stress profile that are substantially free of any flat segments in a depth direction are present at depths within the glass-based article of about 5 micrometers or greater (e.g., 10 micrometers or greater, or 15 micrometers or greater) from either one or both the first surface or the second surface. For example, along a depth of about 0 micrometers to less than about 5 micrometers from the first surface, the stress profile may include linear segments, but from a depth of about 5 micrometers or greater from the first surface, the stress profile may be substantially free of flat segments. As used herein "linear" includes line segments having flat slope as well as line segments not having flat slopes; for example of the latter, see FIG. 6 within a depth of about 12 microns from the surface.

In some embodiments, the stress profile may include linear segments at depths from about 0t up to about 0.1t and may be substantially free of flat segments at depths of about 0.1t to about 0.4t. In some embodiments, the stress profile from a thickness in the range from about 0t to about 0.1t may have a slope in the range from about 20 MPa/microns to about 200 MPa/microns. As will be described herein, such embodiments may be formed using a single ion-exchange process by which the bath includes two or more alkali salts or is a mixed alkali salt bath or multiple (e.g., 2 or more) ion exchange processes.

In one or more embodiments, the glass-based article may be described in terms of the shape of the stress profile along the CT region (327 in FIG. 3). For example, in some embodiments, the stress profile along the CT region (where stress is in tension) may be approximated by equation. In some embodiments, the stress profile along the CT region may be approximated by equation (1):

$$\text{Stress}(x) = \text{MaxCT} - (((\text{MaxCT} \cdot (n+1))/0.5^n) \cdot |(x/t) \sim 0.5|^n) \quad (1)$$

In equation (1), the stress (x) is the stress value at position x. Here the stress is positive (tension). MaxCT is the maximum central tension as a positive value in MPa. The value x is position along the thickness (t) in micrometers, with a range from 0 to t; x=0 is one surface (302, in FIG. 3), x=0.5t is the center of the glass-based article, stress(x) =MaxCT, and x=t is the opposite surface (304, in FIG. 3). MaxCT used in equation (1) may be in the range from about 50 MPa to about 80 MPa (e.g., from about 60 MPa to about 80 MPa, from about 70 MPa to about 80 MPa, from about 50 MPa to about 75 MPa, from about 50 MPa to about 70 MPa, or from about 50 MPa to about 65 MPa), and n is a fitting parameter from 1.5 to 5 (e.g., 2 to 4, 2 to 3 or 1.8 to 2.2) whereby n=2 can provide a parabolic stress profile, exponents that deviate from n=2 provide stress profiles with near parabolic stress profiles.

In some embodiments, the stress profile may be modified by heat treatment. In such embodiments, the heat treatment may occur before any ion-exchange processes, between ion-exchange processes, or after all ion-exchange processes. In some embodiments, the heat treatment may reduce the slope of the stress profile at or near the surface. In some embodiments, where a steeper or greater slope is desired at the surface, an ion-exchange process after the heat treatment may be utilized to provide a "spike" or to increase the slope of the stress profile at or near the surface.

In one or more embodiments, the stress profile 312 (and/or estimated stress profile 340) is generated due to a non-zero concentration of a metal oxide(s) that varies along a portion of the thickness, for example along a thickness segment of about 10 micrometers, 100 micrometers, or the entire thickness. The variation in concentration may be referred to herein as a gradient. In some embodiments, the concentration of a metal oxide is both non-zero and varies along a thickness range from about 0·t to about 0.3·t. In some embodiments, the concentration of the metal oxide is non-zero and varies along a thickness range from about 0·t to about 0.35·t, from about 0·t to about 0.4·t, from about 0·t to about 0.45-1 or from about 0·t to about 0.48·t. The metal oxide may be described as generating a stress in the glass-based article. The variation in concentration may be continuous along the above-referenced thickness ranges. Variation in concentration may include a change in metal oxide concentration of about 0.2 mol % along a thickness segment of about 100 micrometers. This change may be measured by known methods in the art including microprobe, as shown in Example 1. The metal oxide that is non-zero in concentration and varies along a portion of the thickness may be described as generating a stress in the glass-based article.

The variation in concentration may be continuous along the above-referenced thickness ranges. In some embodiments, the variation in concentration may be continuous along thickness segments in the range from about 10 micrometers to about 30 micrometers. In some embodiments, the concentration of the metal oxide decreases from the first surface to a value at a point between the first surface and the second surface and increases from the value to the second surface.

The concentration of metal oxide may include more than one metal oxide (e.g., a combination of $Na_2O$ and $K_2O$). In some embodiments, where two metal oxides are utilized and where the radius of the ions differ from one or another, the concentration of ions having a larger radius is greater than the concentration of ions having a smaller radius at shallow depths, while the at deeper depths, the concentration of ions having a smaller radius is greater than the concentration of ions having larger radius. For example, where a single Na- and K-containing bath is used in the ion exchange process, the concentration of $K+$ ions in the glass-based article is greater than the concentration of $Na+$ ions at shallower depths, while the concentration of $Na+$ is greater than the concentration of $K+$ ions at deeper depths. This is due, in part, due to the size of the ions. In such glass-based articles, the area at or near the surface comprises a greater CS due to the greater amount of larger ions (i.e., $K+$ ions) at or near the surface. This greater CS may be exhibited by a stress profile having a steeper slope at or near the surface (i.e., a spike in the stress profile at the surface).

The concentration gradient or variation of one or more metal oxides is created by chemically strengthening a glass-based substrate, as previously described herein, in which a plurality of first metal ions in the glass-based substrate is exchanged with a plurality of second metal ions. The first ions may be ions of lithium, sodium, potassium, and rubidium. The second metal ions may be ions of one of sodium, potassium, rubidium, and cesium, with the proviso that the second alkali metal ion has an ionic radius greater than the ionic radius of the first alkali metal ion. The second metal ion is present in the glass-based substrate as an oxide thereof (e.g., $Na_2O$, $K_2O$, $Rb_2O$, $Cs_2O$ or a combination thereof).

In one or more embodiments, the metal oxide concentration gradient extends through a substantial portion of the thickness t or the entire thickness t of the glass-based article, including the CT layer 327. In one or more embodiments, the concentration of the metal oxide is about 0.5 mol % or greater in the CT layer 327. In some embodiments, the concentration of the metal oxide may be about 0.5 mol % or greater (e.g., about 1 mol % or greater) along the entire thickness of the glass-based article, and is greatest at the first surface 302 and/or the second surface 304 and decreases substantially constantly to a value at a point between the first surface 302 and the second surface 304. At that point, the concentration of the metal oxide is the least along the entire thickness t; however the concentration is also non-zero at that point. In other words, the non-zero concentration of that particular metal oxide extends along a substantial portion of the thickness t (as described herein) or the entire thickness t. In some embodiments, the lowest concentration in the particular metal oxide is in the CT layer 327. The total concentration of the particular metal oxide in the glass-based article may be in the range from about 1 mol % to about 20 mol %.

In one or more embodiments, the glass-based article includes a first metal oxide concentration and a second metal oxide concentration, such that the first metal oxide concentration is in the range from about 0 mol % to about 15 mol % along a first thickness range from about 0t to about 0.5t, and the second metal oxide concentration is in the range from about 0 mol % to about 10 mol % from a second thickness range from about 0 micrometers to about 25 micrometers (or from about 0 micrometers to about 12 micrometers); however, the concentration of one or both the first metal oxide and the second metal oxide is non-zero along a substantial portion or the entire thickness of the glass-based article. The glass-based article may include an optional third metal oxide concentration. The first metal oxide may include $Na_2O$ while the second metal oxide may include $K_2O$.

The concentration of the metal oxide may be determined from a baseline amount of the metal oxide in the glass-based article prior to being modified to include the concentration gradient of such metal oxide.

In one or more embodiments, the glass-based articles may be described in terms of how they fracture and the fragments that result from such fracture. In one or more embodiments, when fractured, the glass-based articles fracture into 2 or more fragments per square inch (or per 6.4516 square centimeters) of the glass-based article (prior to fracture), wherein the sample size used was a 5.08 cm by 5.08 cm (2 inch by 2 inch) square. In some cases, the glass-based articles fracture into 3 or more, 4 or more, 5 or more, or 10 or more fragments per square inch (or per 6.4516 square centimeters) of the glass-based article (prior to fracture), wherein the sample size used was a 5.08 cm by 5.08 cm (2 inch by 2 inch) square. In some instances, when fractured, the glass-based articles fracture into fragments such that 50% or more of the fragments have a surface area that is less than 5%, less than 2%, or less than 1% of the surface area of the glass-based article (prior to fracture). In some embodiments, when fractured, the glass-based articles fracture into fragments such that 90% or more or even 100% of the fragments have a surface area that is less than 5%, less than 2%, or less than 1% of the surface area of the glass-based article (prior to fracture).

In one or more embodiments, after chemically strengthening the glass-based article, the resulting stress profile 317 (and estimated stress profile 340) of the glass-based article provides improved fracture resistance. For example, in some embodiments, upon fracture, the glass-based article comprises fragments having an average longest cross-sectional dimension of less than or equal to about 0.2·t (e.g., 1.8·t, 1.6·t, 1.5·t, 1.4·t, 1.2·t or 1·t or less).

In one or more embodiments, the glass-based articles may exhibit a fracture toughness ($K_{1C}$) of about 0.7 MPa·m$^{1/2}$ or greater. In some cases, the fracture toughness may be about 0.8 MPa·m$^{1/2}$ or greater, or about 0.9 MPa·m$^{1/2}$ or greater. In some embodiments the fracture toughness may be in the range from about 0.7 MPa·m$^{12}$ to about 1 MPa·m$^{1/2}$. The fracture toughness value ($K_{1C}$) recited in this disclosure refers to a value as measured by chevron notched short bar (CNSB) method disclosed in Reddy, K. P. R. et al, "Fracture Toughness Measurement of Glass and Ceramic Materials Using Chevron-Notched Specimens," J. Am. Ceram. Soc., 71 [6], C-310-C-313 (1988) except that $Y^*_m$ is calculated using equation 5 of Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (October 1992).

In some embodiments, the substrate may also be characterized as having a hardness from about 500 HVN to about 800 HVN, as measured by Vickers hardness test at a load of 200 g.

The glass-based articles described herein may exhibit a stored tensile energy in the range from greater than 0 J/m$^2$ to about 20 J/m$^2$. In some instances, the stored tensile energy may be in the range from about 1 J/m$^2$ to about 20 J/m$^2$, from about 2 J/m$^2$ to about 20 J/m$^2$, from about 3 J/m$^2$ to about 20 J/m$^2$, from about 4 J/m$^2$ to about 20 J/m$^2$, from about 1 J/m$^2$ to about 19 J/m$^2$, from about 1 J/m$^2$ to about 18 J/m$^2$, from about 1 J/m$^2$ to about 16 J/m$^2$, from about 4 J/m$^2$ to about 20 J/m$^2$, or from about 4 J/m$^2$ to about 18 J/m$^2$. The stored tensile energy is calculated the following Equation (2):

$$\text{stored tensile energy}(J/m^2) = [(1-\nu)/E]\int(\sigma^2)(dt) \quad (2)$$

where ν is Poisson's ratio, E is the Young's modulus (in MPa), σ is stress (in MPa) and the integration is computed across the thickness (in microns) of the tensile region only.

The glass-based articles described herein generally have elastic modulus or Young's modulus of less than about 80 GPa. The elastic modulus, which is intrinsic to the composition of the glass-based article, can provide the desired high stiffness, which is an extrinsic property, to the ultimate glass-based article that is produced therefrom. For clarity, unless the specific type of elastic modulus measurement is explicitly indicated, the elastic modulus described herein will be the Young's modulus of a material, rather than, for example, shear modulus, bulk modulus, Poisson's ratio, and the like.

In some embodiments, the glass-based article comprises a high liquidus viscosity that enables the formation of the glass-based articles via down-draw techniques (e.g., fusion draw, slot draw, and other like methods), which can provide high precision surface smoothness. As used herein, the term "liquidus viscosity" refers to the viscosity of a molten glass at the liquidus temperature, wherein the term "liquidus temperature" refers to the temperature at which crystals first appear as a molten glass cools down from the melting temperature (or the temperature at which the very last crystals melt away as temperature is increased from room temperature). The liquidus viscosity is determined by the following method. First the liquidus temperature of the glass is measured in accordance with ASTM C829-81 (2015), titled "Standard Practice for Measurement of Liquidus Temperature of Glass by the Gradient Furnace Method". Next the viscosity of the glass at the liquidus temperature is measured in accordance with ASTM C965-96(2012), titled "Standard Practice for Measuring Viscosity of Glass Above the Softening Point". In general, the glass-based articles (or the compositions used to form such articles) described herein a liquidus viscosity of about 100 kilopoise (kP) or greater. In scenarios where a higher liquidus viscosity is desired for down-draw processability, the glass-based articles (or the compositions used to form such articles) exhibit a liquidus viscosity of at 200 kP or more (e.g., about 600 kP or greater).

In one or more embodiments, the glass-based articles exhibit a Knoop Lateral Cracking Scratch Threshold in the range from about 4 N to about 7 N, from about 4.5 N to about 7 N, from about 5 N to about 7 N, from about 4 N to about 6.5 N, from about 4 N to about 6 N, or from about 5 N to about 6 N. As used herein, Knoop Scratch Lateral Cracking Threshold is the onset of lateral cracking (in 3 or more of 5 indentation events) which extend equal to or greater than 2 times the width of the microductile scratch groove, formed using a Knoop indenter. In some embodiments, the Knoop Lateral Cracking scratch Threshold may be in the range of from about 10 to about 16 Newtons. As used herein, Knoop Scratch Lateral Cracking Threshold is the onset of lateral cracking (in 3 or more of 5 scratch events). A series of increasing constant load scratches (3 minimum per load, but more per load could be used to increase confidence level) are performed to identify the Knoop scratch threshold. In Knoop Scratch Lateral Cracking Threshold testing, for each load, samples of the glass substrates and/or articles were scratched with a Knoop indenter over a length of 10 mm with a velocity of 0.25 mm/s. The Knoop scratch threshold range can be determined by comparing the test specimen to one of the following 3 failure modes: 1) sustained lateral surface cracks that are more than two times the width of the groove, 2) damage is contained within the groove, but there are lateral surface cracks that are less than two times the width of groove and there is damage visible by naked eye, or 3) the presence of large subsurface lateral cracks which are greater than two times the width of the groove and/or there is a median crack at the vertex of the scratch. The scratch threshold is then the highest load at which failure does not occur in 3 or more of 5 events.

In one or more embodiments, the glass-based articles exhibit a Vickers Indentation Fracture Threshold in the range from about 10 kgf or greater, about 12 kgf or greater, or about 15 kgf or greater. As used herein, Indentation Fracture Threshold (or Vickers crack initiation threshold) was measured by a Vickers indenter. Vickers Indentation Fracture Threshold is a measure of indentation damage resistance of the glass. The test involved the use of a square-based pyramidal diamond indenter with an angle of 136° between faces, referred to as a Vickers indenter. The Vickers indenter was same as the one used in standard micro hardness testing (reference ASTM-E384-11). A minimum of five specimens were chosen to represent the glass type and/or pedigree of interest. For each specimen, multiple sets of five indentations were introduced to the specimen surface. Each set of five indentations was introduced at a given load, with each individual indentation separated by a minimum of 5 mm and no closer than 5 mm to a specimen edge. A rate of indenter loading/unloading of 50 kg/minute was used for test loads ≥2 kg. For test loads <2 kg, a rate of 5 kg/minute was used. A dwell (i.e., hold) time of 10 seconds at the target load was utilized. The machine maintained load control during the dwell period. After a period of at least 12 hours, the indentations were inspected in under reflected light using a compound microscope at 500× magnification. The presence or absence of median/radial cracks, or specimen fracture, was then noted for each indentation. Note that the formation of lateral cracks was not considered indicative of exhibiting threshold behavior, since the formation of median/radial cracks was of interest, or specimen fracture, for this test. The specimen threshold value is defined as the midpoint of the lowest consecutive indentation loads which bracket greater than 50% of the individual indentations meeting threshold. For example, if within an individual specimen 2 of the 5 (40%) indentations induced at a 5 kg load have exceeded threshold, and 3 of the 5 (60%) indentations induced at a 6 kg load have exceeded threshold, then the specimen threshold value would be defined as the midpoint of 5 and 6 kg, or 5.5 kg. The sample mean threshold value is defined as the arithmetic mean of all individual specimen threshold values. Along with the mean, the range (lowest value to highest value) of all the specimen midpoints was reported for each sample. The pre-test, test and post-test environment was controlled to 23±2° C. and 50±5% RH to minimize variation in the fatigue (stress corrosion) behavior of the glass specimens. It should be noted that when first testing an unfamiliar composition or pedigree, the required indentation loads and bracketing increment were determined by performing an "iterative search." Once familiarity with the sample's performance was gained, future testing may be streamlined by testing only those loads near the expected threshold, and then "filling in" additional indentation loads only if necessary.

In one or more embodiments, the glass-based articles exhibit improved surface strength when subjected to abraded ring-on-ring (AROR) testing. The strength of a material is defined as the stress at which fracture occurs. The AROR test is a surface strength measurement for testing flat glass specimens, and ASTM C1499-09(2013), entitled "Standard Test Method for Monotonic Equibiaxial Flexural Strength of Advanced Ceramics at Ambient Temperature," serves as the basis for the AROR test methodology described herein. The contents of ASTM C1499-09 are incorporated herein by reference in their entirety. In one embodiment, the glass specimen is abraded prior to ring-on-ring testing with 90 grit silicon carbide (SiC) particles that are delivered to the glass sample using the method and apparatus described in Annex A2, entitled "abrasion Procedures," of ASTM C158-02 (2012), entitled "Standard Test Methods for Strength of Glass by Flexure (Determination of Modulus of Rupture). The contents of ASTM C158-02 and the contents of Annex 2 in particular are incorporated herein by reference in their entirety.

Prior to ring-on-ring testing a surface of the glass-based article is abraded as described in ASTM C158-02, Annex 2, to normalize and/or control the surface defect condition of the sample using the apparatus shown in Figure A2.1 of ASTM C158-02. The abrasive material is typically sandblasted onto the surface 110 of the glass-based article at a load of 15 psi using an air pressure of 304 kPa (44 psi); although in the Examples below, the abrasive material was sandblasted onto the surface 110 at other loads (e.g., 25 psi or 45 psi). After air flow is established, 5 cm$^3$ of abrasive material is dumped into a funnel and the sample is sandblasted for 5 seconds after introduction of the abrasive material.

Figure 4:
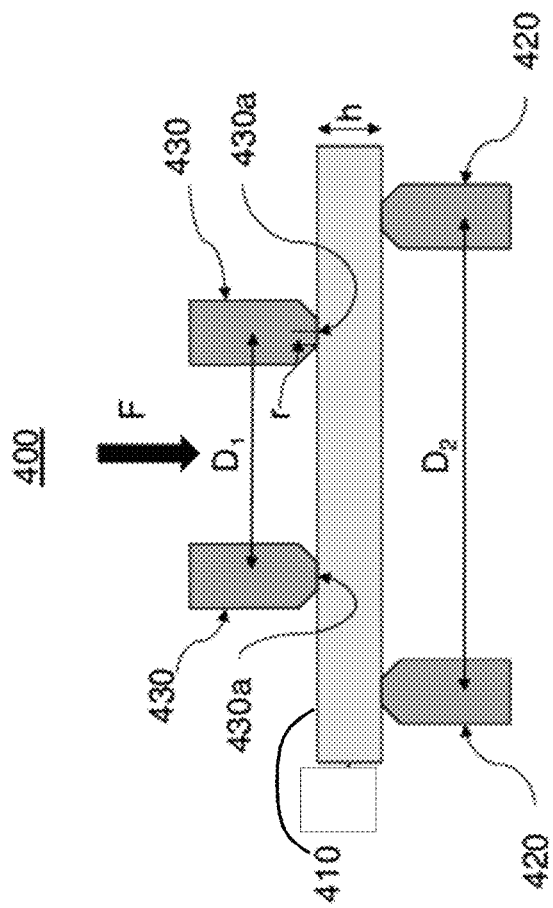
FIG. 4 is a is a schematic cross-sectional view of a ring-on-ring apparatus.

For the AROR test, a glass-based article having at least one abraded surface 410 as shown in FIG. 4 is placed between two concentric rings of differing size to determine equibiaxial flexural strength (i.e., the maximum stress that a material is capable of sustaining when subjected to flexure between two concentric rings), as also shown in FIG. 4. In the AROR configuration 400, the abraded glass-based article 410 is supported by a support ring 420 having a diameter D2. A force F is applied by a load cell (not shown) to the surface of the glass-based article by a loading ring 430 having a diameter D1.

The ratio of diameters of the loading ring and support ring D1/D2 may be in a range from about 0.2 to about 0.5. In some embodiments, D1/D2 is about 0.5. Loading and support rings 130, 120 should be aligned concentrically to within 0.5% of support ring diameter D2. The load cell used for testing should be accurate to within ±1% at any load within a selected range. In some embodiments, testing is carried out at a temperature of 23±2° C. and a relative humidity of 40±10%.

For fixture design, the radius r of the protruding surface of the loading ring 430, h/2≤r≤3 h/2, where h is the thickness of glass-based article 410. Loading and support rings 430, 420 are typically made of hardened steel with hardness HRc>40. AROR fixtures are commercially available.

The intended failure mechanism for the AROR test is to observe fracture of the glass-based article 410 originating from the surface 430a within the loading ring 430. Failures that occur outside of this region—i.e., between the loading rings 430 and support rings 420—are omitted from data analysis. Due to the thinness and high strength of the glass-based article 410, however, large deflections that exceed % of the specimen thickness h are sometimes observed. It is therefore not uncommon to observe a high percentage of failures originating from underneath the loading ring 430. Stress cannot be accurately calculated without knowledge of stress development both inside and under the ring (collected via strain gauge analysis) and the origin of failure in each specimen. AROR testing therefore focuses on peak load at failure as the measured response.

The strength of glass-based article depends on the presence of surface flaws. However, the likelihood of a flaw of a given size being present cannot be precisely predicted, as the strength of glass is statistical in nature. A probability distribution can therefore generally be used as a statistical representation of the data obtained.

In some embodiments, the glass-based articles described herein have a surface or equibiaxial flexural strength of 20 kgf or more, and up to about 30 kgf as determined by AROR testing using a load of 25 psi or even 45 psi to abrade the surface. In other embodiments, the surface strength is 25 kgf or more, and in still other embodiments, 30 kgf or more.

Figure 27A:
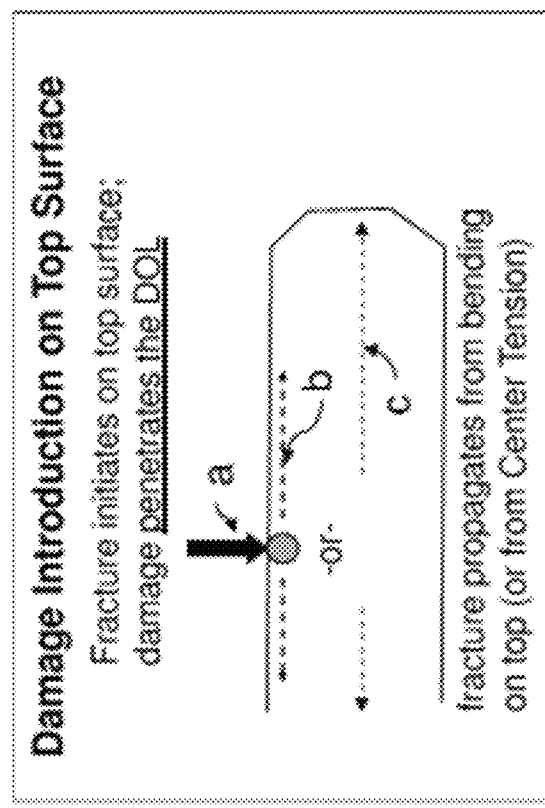
FIG. 27A is a schematic cross-sectional representation of the dominant mechanism for failure due to damage introduction plus bending that typically occurs in glass-based articles that are used in mobile or hand held electronic devices.

In some embodiments, the glass-based articles described herein may be described in terms of performance in an inverted ball on sandpaper (IBoS) test. The IBoS test is a dynamic component level test that mimics the dominant mechanism for failure due to damage introduction plus bending that typically occurs in glass-based articles that are used in mobile or hand held electronic devices, as schematically shown in FIG. 27A. In the field, damage introduction (a in FIG. 27A) occurs on the top surface of the glass-based article. Fracture initiates on the top surface of the glass-based article and damage either penetrates the glass-based article (b in FIG. 27A) or the fracture propagates from bending on the top surface or from the interior portions of the glass-based article (c in FIG. 27A). The IBoS test is designed to simultaneously introduce damage to the surface of the glass and apply bending under dynamic load. In some instances, the glass-based article exhibits improved drop performance when it includes a compressive stress than if the same glass-based article does not include a compressive stress.

Figure 27B:
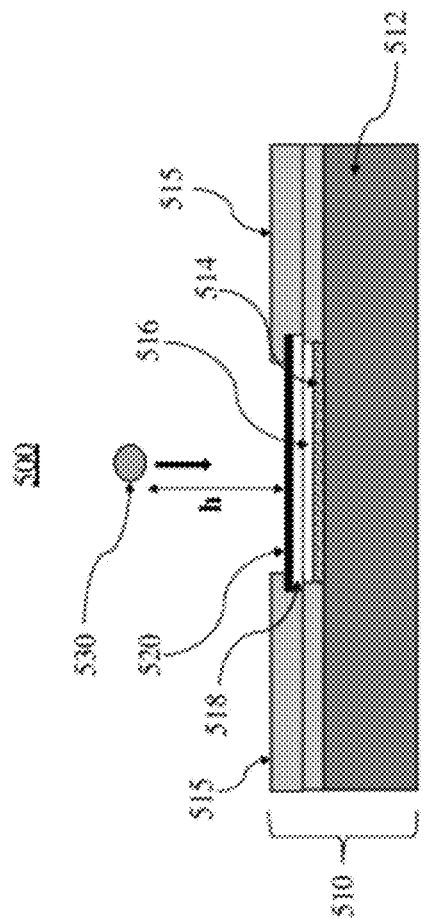
FIG. 27B is a schematic cross-sectional view of an embodiment of the apparatus that is used to perform the inverted ball on sandpaper (IBoS) test described in the present disclosure.

An IBoS test apparatus is schematically shown in FIG. 27B. Apparatus 500 includes a test stand 510 and a ball 530. Ball 530 is a rigid or solid ball such as, for example, a stainless steel ball, or the like. In one embodiment, ball 530 is a 4.2 gram stainless steel ball having diameter of 10 mm. The ball 530 is dropped directly onto the glass-based article sample 518 from a predetermined height h. Test stand 510 includes a solid base 512 comprising a hard, rigid material such as granite or the like. A sheet 514 having an abrasive material disposed on a surface is placed on the upper surface of the solid base 512 such that surface with the abrasive material faces upward. In some embodiments, sheet 514 is sandpaper having a 30 grit surface and, in other embodiments, a 180 grit surface. The glass-based article sample 518 is held in place above sheet 514 by sample holder 515 such that an air gap 516 exists between glass-based article sample 518 and sheet 514. The air gap 516 between sheet 514 and glass-based article sample 518 allows the glass-based article sample 518 to bend upon impact by ball 530 and onto the abrasive surface of sheet 514. In one embodiment, the glass-based article sample 218 is clamped across all corners to keep bending contained only to the point of ball impact and to ensure repeatability. In some embodiments, sample holder 514 and test stand 510 are adapted to accommodate sample thicknesses of up to about 2 mm. The air gap 516 is in a range from about 50 µm to about 100 µm. Air gap 516 is adapted to adjust for difference of material stiffness (Young's modulus, Emod), but also includes the elastic modulus and thickness of the sample. An adhesive tape 520 may be used to cover the upper surface of the glass-based article sample to collect fragments in the event of fracture of the glass-based article sample 518 upon impact of ball 530.

Various materials may be used as the abrasive surface. In a one particular embodiment, the abrasive surface is sandpaper, such as silicon carbide or alumina sandpaper, engineered sandpaper, or any abrasive material known to those skilled in the art for having comparable hardness and/or sharpness. In some embodiments, sandpaper having 30 grit may be used, as it has a surface topography that is more consistent than either concrete or asphalt, and a particle size and sharpness that produces the desired level of specimen surface damage.

Figure 28:
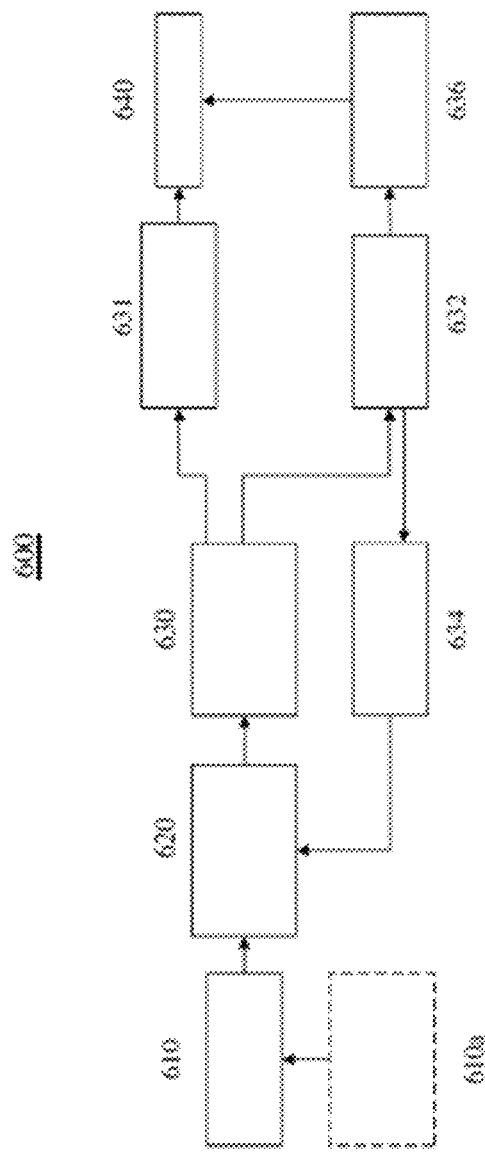
FIG. 28 is a flow chart for a method of conducting the IBoS test in the apparatus described herein.

In one aspect, a method 600 of conducting the IBoS test using the apparatus 500 described hereinabove is shown in FIG. 28. In Step 610, a glass-based article sample (218 in FIG. 36) is placed in the test stand 510, described previously and secured in sample holder 515 such that an air gap 516 is formed between the glass-based article sample 518 and sheet 514 with an abrasive surface. Method 600 presumes that the sheet 514 with an abrasive surface has already been placed in test stand 510. In some embodiments, however, the method may include placing sheet 514 in test stand 510 such that the surface with abrasive material faces upward. In some embodiments (Step 610a), an adhesive tape 520 is applied to the upper surface of the glass-based article sample 518 prior to securing the glass-based article sample 518 in the sample holder 510.

In Step 520, a solid ball 530 of predetermined mass and size is dropped from a predetermined height h onto the upper surface of the glass-based article sample 518, such that the ball 530 impacts the upper surface (or adhesive tape 520 affixed to the upper surface) at approximately the center (i.e., within 1 mm, or within 3 mm, or within 5 mm, or within 10 mm of the center) of the upper surface. Following impact in Step 520, the extent of damage to the glass-based article sample 518 is determined (Step 630). As previously described hereinabove, herein, the term "fracture" means that a crack propagates across the entire thickness and/or entire surface of a substrate when the substrate is dropped or impacted by an object.

In method 600, the sheet 518 with the abrasive surface may be replaced after each drop to avoid "aging" effects that have been observed in repeated use of other types (e.g., concrete or asphalt) of drop test surfaces.

Various predetermined drop heights h and increments are typically used in method 600. The test may, for example, utilize a minimum drop height to start (e.g., about 10-20 cm). The height may then be increased for successive drops by either a set increment or variable increments. The test described in method 600 is stopped once the glass-based article sample 518 breaks or fractures (Step 631). Alternatively, if the drop height h reaches the maximum drop height (e.g., about 100 cm) without fracture, the drop test of method 300 may also be stopped, or Step 520 may be repeated at the maximum height until fracture occurs.

In some embodiments, IBoS test of method 600 is performed only once on each glass-based article sample 518 at each predetermined height h. In other embodiments, however, each sample may be subjected to multiple tests at each height.

If fracture of the glass-based article sample 518 has occurred (Step 631 in FIG. 28), the IBoS test according to method 600 is ended (Step 640). If no fracture resulting from the ball drop at the predetermined drop height is observed (Step 632), the drop height is increased by a predetermined increment (Step 634)—such as, for example 5, 10, or 20 cm—and Steps 620 and 630 are repeated until either sample fracture is observed (631) or the maximum test height is reached (636) without sample fracture. When either Step 631 or 636 is reached, the test according to method 600 is ended.

When subjected to the inverted ball on sandpaper (IBoS) test described above, embodiments of the glass-based article described herein have about a 60% or more survival rate when the ball is dropped onto the surface of the glass from a height of 100 cm. For example, a glass-based article is described as having a 60% survival rate when dropped from a given height when three of five identical (or nearly identical) samples (i.e., having approximately the same composition and, when strengthened, approximately the same compressive stress and depth of compression or compressive stress layer, as described herein) survive the IBoS drop test without fracture when dropped from the prescribed height (here 100 cm). In other embodiments, the survival rate in the 100 cm IBoS test of the glass-based articles that are strengthened is about 70% or more, in other embodiments, about 80% or more, and, in still other embodiments, about 90% or more. In other embodiments, the survival rate of the strengthened glass-based articles dropped from a height of 100 cm in the IBoS test is about 60% or more, in other embodiments, about 70% or more, in still other embodiments, about 80% or more, and, in other embodiments, about 90% or more. In one or more embodiments, the survival rate of the strengthened glass-based articles dropped from a height of 150 cm in the IBoS test is about 60% or more, in other embodiments, about 70% or more, in still other embodiments, about 80% or more, and, in other embodiments, about 90% or more.

To determine the survivability rate of the glass-based articles when dropped from a predetermined height using the IBoS test method and apparatus described hereinabove, at least five identical (or nearly identical) samples (i.e., having approximately the same composition and, if strengthened, approximately the same compressive stress and depth of compression or layer) of the glass-based articles are tested, although larger numbers (e.g., 10, 20, 30, etc.) of samples may be subjected to testing to raise the confidence level of the test results. Each sample is dropped a single time from the predetermined height (e.g., 100 cm or 150 cm) or, alternatively, dropped from progressively higher heights without fracture until the predetermined height is reached, and visually (i.e., with the naked eye) examined for evidence of fracture (crack formation and propagation across the entire thickness and/or entire surface of a sample). A sample is deemed to have "survived" the drop test if no fracture is observed after being dropped from the predetermined height, and a sample is deemed to have "failed (or "not survived") if fracture is observed when the sample is dropped from a height that is less than or equal to the predetermined height. The survivability rate is determined to be the percentage of the sample population that survived the drop test. For example, if 7 samples out of a group of 10 did not fracture when dropped from the predetermined height, the survivability rate of the glass would be 70%.

Figure 32:
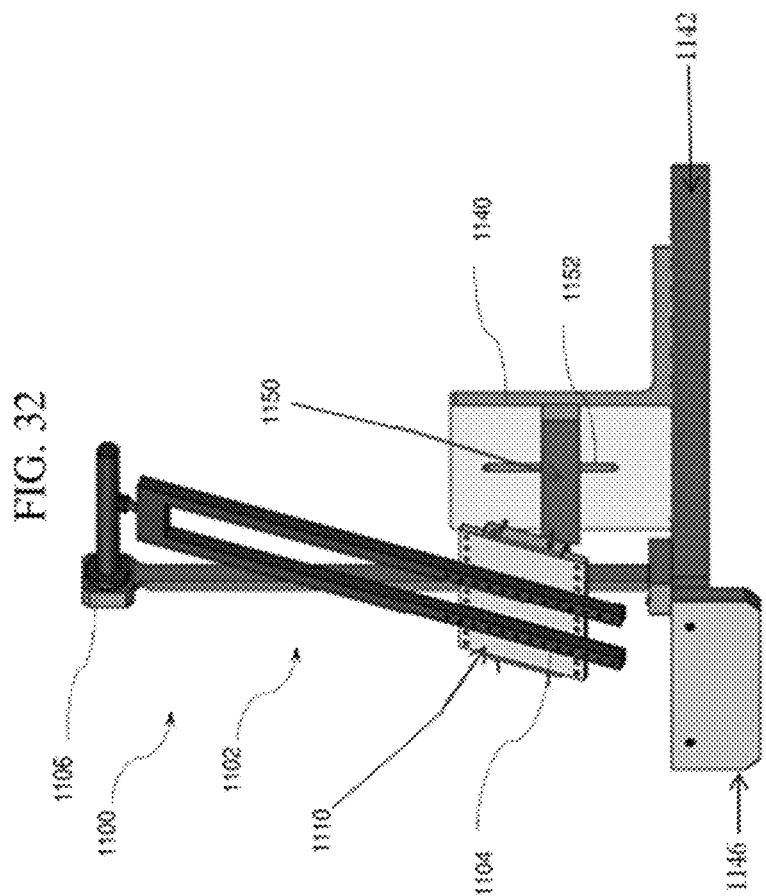
FIG. 32 is a front perspective view of the testing apparatus shown in FIG. 29.
Figure 33:
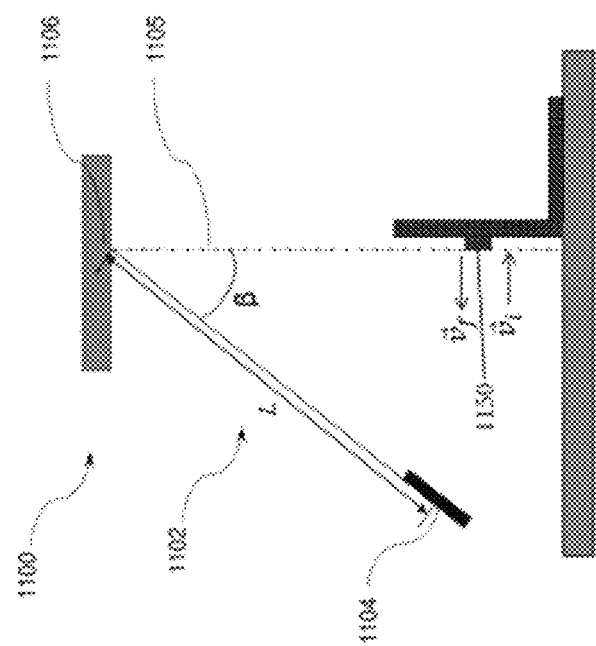
FIG. 33 is side view of a testing apparatus for glass-based articles.

Referring now to FIGS. 29-33, an embodiment of an apparatus 1100 for alternative impact testing a brittle substrate is shown; this apparatus is used to carry out "Impact Threshold Testing" on both the major surface of a sample, and an edge of a sample. Apparatus 1100 comprises a pendulum 1102 including a bob 1104 attached to a pivot 1106. A bob on a pendulum is a weight suspended from the pivot and connected to a pivot by an arm. Thus, the bob 1104 shown in the Figures is connected to the pivot 1106 by arm 1108, which may be in the form of a string, or a rod or a plurality of rods, such as two rods as shown. As best shown in FIG. 33, the bob 1104 has an equilibrium position 1105 shown as dotted line such that the angle β is zero. In other words, the arm 1108 is not in a raised position.

The bob 1104 includes a base 1110 for receiving a brittle substrate. As shown in better detail in FIG. 34, the base 1110 for receiving a brittle substrate 1112 having two ends 1114, 1116, an inner surface 1113 and an outer surface 1115. The base 1110 has a first end 1120 and a second end 1122, and a curved surface 1124 defining a radius of curvature between the first end 1120 and the second end 1122. Suitable material for the base 1110 is metal. The curved surface 1124 has an apex 1125.

Figure 34:
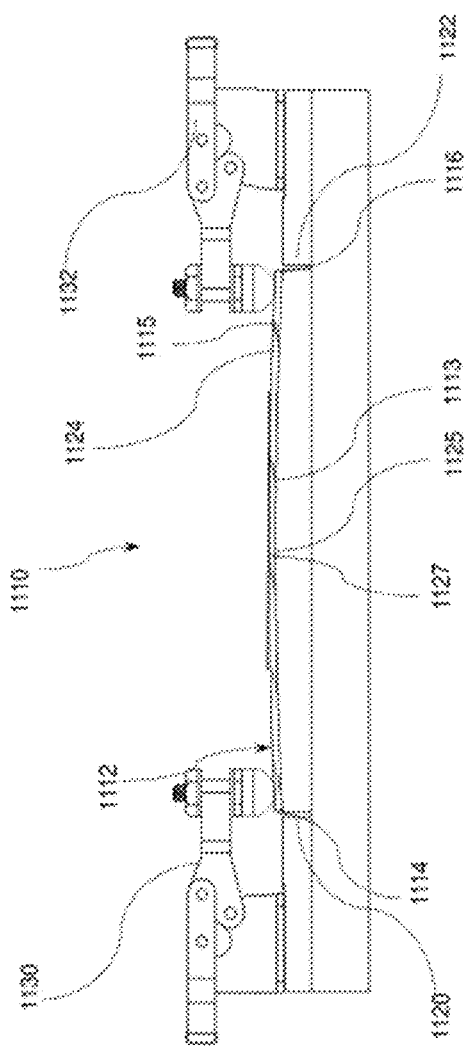
FIG. 34 is a side view of a portion of the testing apparatus shown in FIG. 29.

The apparatus 1100 according to one or more embodiments further includes a first fixture 1130 and a second fixture 1132 to hold two ends 1114, 1116 of the brittle substrate 1112 and to apply a force to bend the brittle substrate 1112 about the curved surface 1124 and to conform the brittle substrate to the radius of curvature. By bending the brittle substrate 1112, the brittle substrate has an apex 1127 conforming to the apex 1125 of the curved surface 1124. In one or more specific embodiments, the curved surface 1124 and the curvature of the brittle substrate 1112 can be a fixed radius or a compound radius. The first fixture 1130 and the second fixture 1132 each are a clamp, toggle clamps as shown in FIG. 34.

Figure 35:
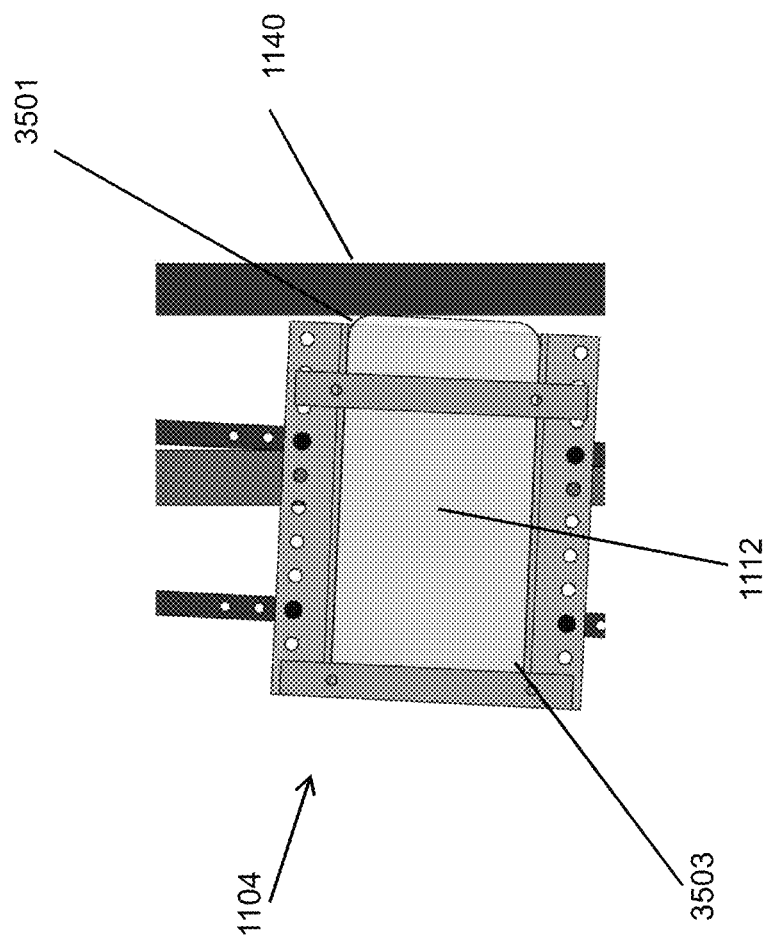
FIG. 35 is a schematic view of an alternative configuration of a portion of the testing apparatus shown in FIG. 29.

The apparatus 1100 further includes a roughened surface, which is an abrasive sheet having an abrasive surface to be placed in contact with the outer surface 1115 (or corners 3501, 3503, etc., as shown in FIG. 35) of the substrate 1112. The abrasive sheet is attached to impact surface 1150 (of impacting object 1140 described below) by double sided tape, with the abrasive surface of the abrasive sheet facing toward the curved surface 1124 on which the substrate 1112 is mounted. One suitable abrasive sheet is Indasa Rhynowet® Plus Line P180 grit sandpaper. The sandpaper according to one or more embodiments is cut in 25 mm square pieces, and the sandpaper is flattened if the pieces are bent during the cutting process.

The apparatus 1100 further includes an impacting object 1140 positioned such that when the bob 1104 is released from a position at an angle β greater than zero from the equilibrium position 1105, the curved surface 1124 of the bob 1104 (or a substrate 1112 mounted on the curved surface 1124) contacts the impact surface 1150 (or the abrasive side of an abrasive sheet disposed on the impact surface 1150) of the impacting object 1140. In the embodiment shown, the impacting object 1140 is a L-shaped bracket affixed to platform 1142, and the impacting object 1140 is affixed to the platform 1142 by screw 1144. The impacting object 1140 could also be affixed by any other suitable mechanism such as a bolt, rivet, clamp, etc. The platform 1142 includes a stopper 1146, which permits the apparatus 1100 to be held at the end of work bench 1148. In the embodiment shown, the impacting object 1140 is fixed and does not move when the bob 1104 contacts the impacting object 1140 at impact surface 1150. The impact surface 1150 may be a separate element that is movable in the x-y plane as best seen in FIG. 32 within slot 1152. Alternatively, the impact surface 1150 need not move relative to the impacting object 1140. In one or more embodiments, the bob 1104 and base 1110 are sized and shaped such that when a brittle substrate is affixed to the base 1110 and when the bob 1104 is released from a position at an angle β greater than zero from the equilibrium position 1105, the brittle substrate 1112 is subjected to a bending radius and an impact force that simulate a bending radius of a chemically strengthened cover glass of a mobile phone or tablet device when the mobile phone or tablet device is dropped on a ground surface by a user of the mobile phone or tablet device.

In one or more embodiments the radius of curvature of the curved surface 1124 on the base 1110 is selected to provide a bending tensile force of 100 MPa when a substrate is bent around the curved surface 1124 such that the tensile force is an externally applied tensile force that results from the stress of bending the substrate. Thus, when the substrate is bent, the tensile force is at the apex 1125 of the brittle substrate. According to one or more embodiments, the radius of curvature is in the range of 0.25 m and 1.5 m, for example, in the range of 0.5 m and 1 m.

In one or more embodiments, the first fixture 1130 and second fixture 1132 are spaced apart at a distance of a cover glass length for a mobile phone or a tablet. In specific embodiments, the first fixture 1130 and second fixture 1132 are spaced apart at a distance in the range of 50 mm and 500 mm.

Another aspect of the disclosure pertains to a method of impact testing a brittle sheet, the surface Impact Threshold Test method comprising:

bending the brittle sheet having a contact surface to provide a bent sheet having a radius of curvature and an apex on the contact surface; and impacting the bent sheet at the apex with an impacting object using a pendulum. In an embodiment, the bent sheet is attached to a pendulum bob. In an embodiment, the bent sheet attached to a pendulum bob is positioned such that the impacting object contacts the apex of the contact surface. In one or more embodiments, the brittle sheet is glass and the radius of curvature is in a range that simulates a bending radius of a chemically or thermally strengthened cover glass of a mobile phone or tablet device when the mobile phone or tablet device is dropped on a ground surface by a user of the mobile phone or tablet device, wherein the drop event is such that an edge of the device contacts the ground first (as opposed to a face first drop wherein the device generally hits the ground in an orientation such that the contact surface is generally parallel to the ground). At least five identical (or nearly identical) samples (i.e., having approximately the same composition and, if strengthened, approximately the same compressive stress and depth of compression or layer) of the glass-based articles are tested, although larger numbers (e.g., 10, 20, 30, etc.) of samples may be subjected to testing to raise the confidence level of the test results.

In one or more embodiments, an abrasive sheet is placed on the impact surface 1150 in a position so as to contact the apex of the brittle sheet upon a swinging movement of the arm 1108. In one or more embodiments, the brittle sheet is secured to the impacting object with double sided tape.

Another embodiment pertains to a method of impact testing a brittle sheet, the method comprising: attaching a brittle sheet to a pendulum bob to expose a contact surface on the brittle sheet; and moving the pendulum bob with the brittle sheet attached to the pendulum bob to cause the contact surface to contact an impact object. In an embodiment, the method includes bending the brittle sheet to provide a bent sheet having a radius of curvature and an apex on the contact surface. In an embodiment, the bent sheet attached to a pendulum bob is positioned such that the impact object contacts the apex of the contact surface. In one or more embodiments, the brittle sheet is glass and the radius of curvature is in a range that simulates a bending radius of a chemically or thermally strengthened cover glass of a mobile phone or tablet device when the mobile phone or tablet device is dropped on a ground surface by a user of the mobile phone or tablet device, wherein the drop event is such that an edge of the device contacts the ground first (as opposed to a face first drop wherein the device generally hits the ground in an orientation such that the contact surface is generally parallel to the ground). In some embodiments, the brittle sheet is secured to a curved surface prior to impacting the apex with the impacting object.

Figure 29:
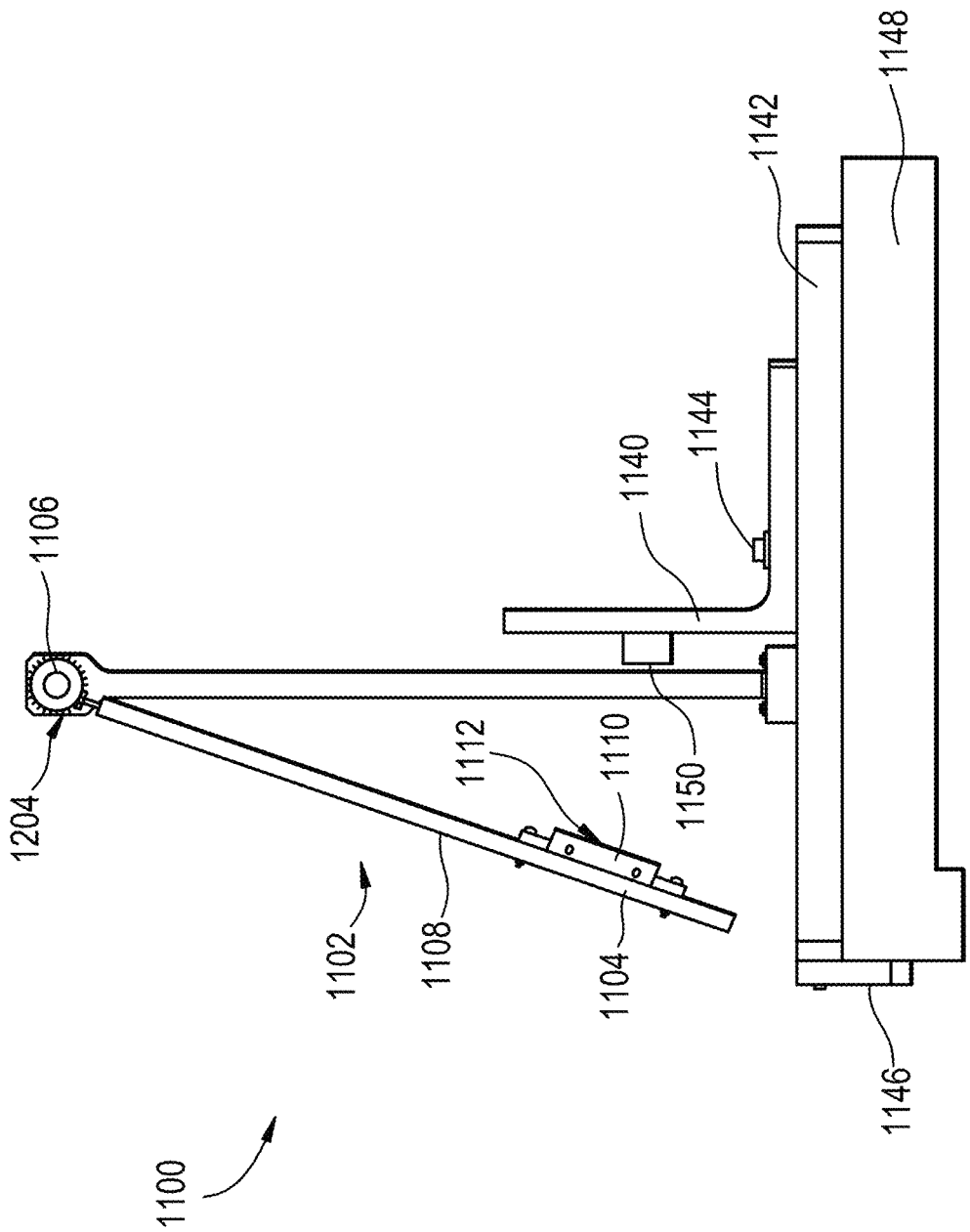
FIG. 29 is a side view of a testing apparatus for glass-based articles.
Figure 30:
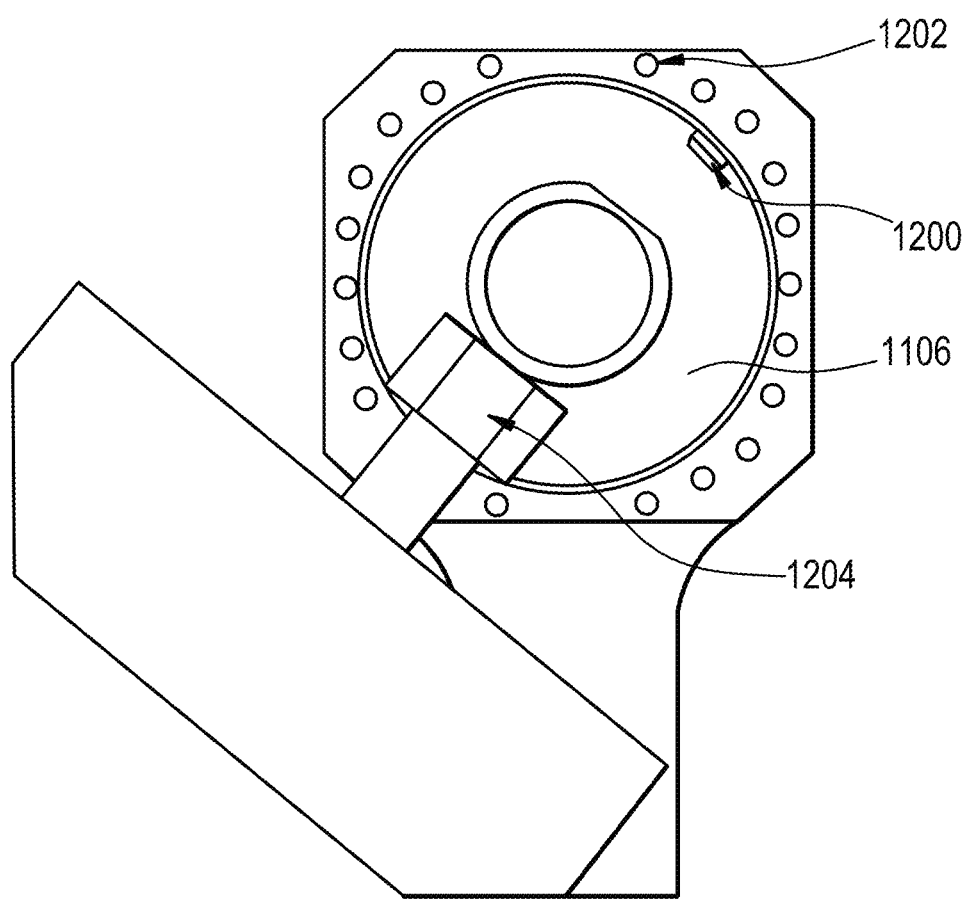
FIG. 30 is a side view of a portion of the testing apparatus shown in FIG. 29.
Figure 31:
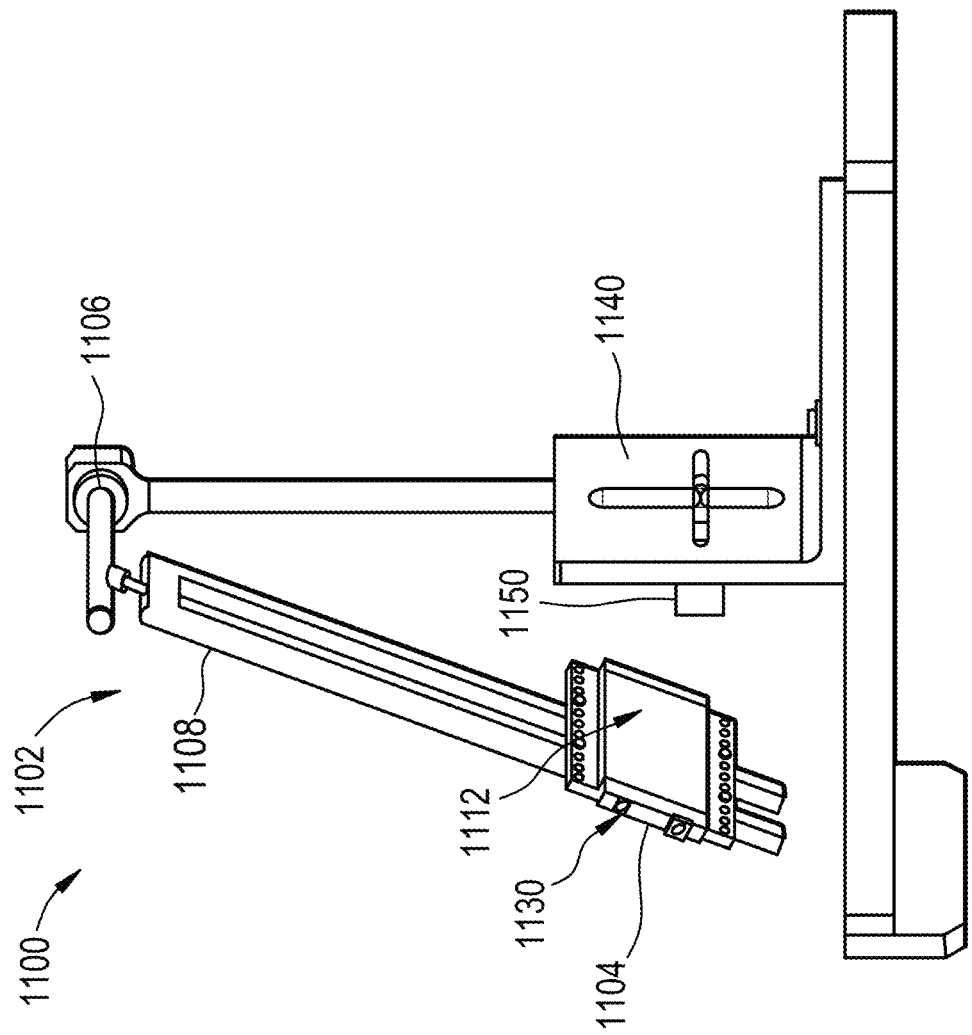
FIG. 31 is a rear perspective view of the testing apparatus shown in FIG. 29.

Referring now to FIGS. 29 and 30, specific, non-limiting details of operation of the apparatus include a pointer notch 1200 on the pivot 1106, which can point to various test positions 1202, i.e., positions at which the arm 1108 is positioned at angle $ relative to equilibrium position 1105, and positions from which motion of the pendulum is initiated. The pointer notch 1200 enables alignment with a variety of test positions 1202, which may be any suitable number of test positions, for example 1, 2, 3, 4, 5, 6, 7, 8, 9, 10, and so on incrementally up to 50 or more. The apparatus 1100 may further include a lock, which may be in the form of nut 1204 to lock the arm 1108 in the desired rotational orientation about its central longitudinal axis so as to square the base 1110 with the impact surface 1150 of the impacting object 1140.

The apparatus 1100 simulates an actual phone drop event according to one or more embodiments. Incident impact energy, E and average impact force, $\vec{F}_{avg}$ are provided by the equations $$E = mgL\{1 - \cos\beta\}$$

$$|\vec{F}_{avg}| = \frac{|m\vec{v}_f - m\vec{v}_i|}{\Delta t}$$

Where, m=mass of the pendulum 1102 (including swing arm 1108, bob 1104, and base 1110), L=length of arm, g=acceleration of free fall, vf is the initial impact velocity (i.e., the velocity at the point when the glass first contacts the impact surface 1150 of the impacting object 1140), and vi is the final impact velocity (i.e., the velocity at which the glass leaves the impact surface 1150 of the impacting object 1140, or in other words at the point when the glass first separates from the impact surface 1150 of the impacting object 1140), and Δt=contact interaction time (i.e., the time during which the glass is in contact with the impact surface 1150 of the impacting object 1140). The contact interaction time is measured by high-speed video camera by observing the number of frames during which the glass is in contact with the impact surface 1150, and multiplying by the number of frames taken per unit time by the high-speed video camera. The average force equation is useful for samples that have not been broken already, i.e., the samples loaded into the apparatus 1100 prior to the test are ones that have not already been broken. When the mass and length of the swing arm are known, setting the angle β to a selected position, an impact force can be calculated and used to simulate impacts on a device when dropped from a specific height. For example, the average force experienced by a substrate cover glass on a 130 g mobile phone device when dropped from 1 meter height has been calculated to be 800 N. Using the mass, arm length and angle β, this force can be replicated using the apparatus 1100 shown in FIGS. 29-34.

Alternatively, as shown in FIG. 35, the bob 1104 may be repositioned so that an edge of the substrate 1112 may be impacted by the impacting object, according to the edge Impact Threshold Test. In this case, the impact surface 1150 of the impacting object 1140 is not raised, but is simply a planar portion of the impacting object 1140 facing toward the bob 1140. In this orientation, a corner 3501 of the substrate 1112 contacts with the impacting object 1140 to which an abrasive sheet is attached, in the same manner as described above. Thus, this orientation simulates a drop of an electronic device onto its edge so that the impact energy a substrate edge is able to withstand is then determined in a similar manner as set forth above. In the case of edge testing, the substrate 1112 is tested at each corner only once, and is tested so that the top portion of the edge of the substrate is made the point of impact with the impacting object 1140. The corner 3501 is tested first, and then at an incrementally higher pendulum height the opposite corner 3503 is tested. No more than one impact test is performed at the same location on a sample, so as to avoid accumulation of damage introductions. At least five identical (or nearly identical) samples (i.e., having approximately the same composition and, if strengthened, approximately the same compressive stress and depth of compression or layer) of the glass-based articles are tested, although larger numbers (e.g., 10, 20, 30, etc.) of samples may be subjected to testing to raise the confidence level of the test results.

The glass-based articles described herein may be transparent. In one or more the glass-based article may have a thickness of about 1 millimeter or less and exhibit a transmittance of about 88% or greater over a wavelength in the range from about 380 nm to about 780 nm.

The glass-based article may also exhibit a substantially white color. For example, the glass-based article may exhibit CIELAB color space coordinates, under a CIE illuminant F02, of L* values of about 88 and greater, a* values in the range from about −3 to about +3, and b* values in the range from about −6 to about +6.

Choice of substrates not particularly limited. In some examples, the glass-based article may be described as having a high cation diffusivity for ion exchange. In one or more embodiments, the glass or glass-ceramic has fast ion-exchange capability, i.e., where diffusivity is greater than 500 μm²/hr. or may be characterized as greater than 450 μm²/hour at 460° C.

At a certain temperature the diffusivity is calculated using the equation (4):

$$\text{Diffusivity} = DOL^{5.6} * T \quad (4)$$

in which DOL is depth of ion-exchange layer and T is the IOX time it takes to reach that DOL.

The glass-based article may include an amorphous substrate, a crystalline substrate or a combination thereof (e.g., a glass-ceramic substrate). In one or more embodiments, the glass-based article substrate (prior to being chemically strengthened as described herein) may include a glass composition, in mole percent (mole %), including: $SiO_2$ in the range from about 40 to about 80, $Al_2O_3$ in the range from about 10 to about 30, $B_2O_3$ in the range from about 0 to about 10, $R_2O$ in the range from about 0 to about 20, and RO in the range from about 0 to about 15. In some instances, the composition may include either one or both of $ZrO_2$ in the range from about 0 mol % to about 5 mol % and $P_2O_5$ in the range from about 0 to about 15 mol %. $TiO_2$ can be present from about 0 mol % to about 2 mol %.

In some embodiments, the glass composition may include $SiO_2$ in an amount, in mol %, in the range from about 45 to about 80, from about 45 to about 75, from about 45 to about 70, from about 45 to about 65, from about 45 to about 60, from about 45 to about 65, from about 45 to about 65, from about 50 to about 70, from about 55 to about 70, from about 60 to about 70, from about 70 to about 75, from about 70 to about 72, or from about 50 to about 65.

In some embodiments, the glass composition may include $Al_2O_3$ in an amount, in mol %, in the range from about 5 to about 28, from about 5 to about 26, from about 5 to about 25, from about 5 to about 24, from about 5 to about 22, from about 5 to about 20, from about 6 to about 30, from about 8 to about 30, from about 10 to about 30, from about 12 to about 30, from about 14 to about 30, from about 16 to about 30, from about 18 to about 30, from about 18 to about 28, or from about 12 to about 15.

In one or more embodiments, the glass composition may include $B_2O_3$ in an amount, in mol %, in the range from about 0 to about 8, from about 0 to about 6, from about 0 to about 4, from about 0.1 to about 8, from about 0.1 to about 6, from about 0.1 to about 4, from about 1 to about 10, from about 2 to about 10, from about 4 to about 10, from about 2 to about 8, from about 0.1 to about 5, or from about 1 to about 3. In some instances, the glass composition may be substantially free of $B_2O_3$. As used herein, the phrase "substantially free" with respect to the components of the glass composition means that the component is not actively or intentionally added to the glass compositions during initial batching or subsequent ion exchange, but may be present as an impurity. For example, a glass may be describe as being substantially free of a component, when the component is present in an amount of less than about 0.1001 mol %.

In some embodiments, the glass composition may include one or more alkali earth metal oxides, such as MgO, CaO and ZnO. In some embodiments, the total amount of the one or more alkali earth metal oxides may be a non-zero amount up to about 15 mol %. In one or more specific embodiments, the total amount of any of the alkali earth metal oxides may be a non-zero amount up to about 14 mol %, up to about 12 mol %, up to about 10 mol %, up to about 8 mol %, up to about 6 mol %, up to about 4 mol %, up to about 2 mol %, or up about 1.5 mol %. In some embodiments, the total amount, in mol %, of the one or more alkali earth metal oxides may be in the range from about 0.1 to 10, from about 0.1 to 8, from about 0.1 to 6, from about 0.1 to 5, from about 1 to 10, from about 2 to 10, or from about 2.5 to 8. The amount of MgO may be in the range from about 0 mol % to about 5 mol % (e.g., from about 2 mol % to about 4 mol %, from about 0.01 to about 2, or from about 0.001 to about 1). The amount of ZnO may be in the range from about 0 to about 2 mol % (e.g., from about 1 to about 2). The amount of CaO may be from about 0 mol % to about 2 mol %. In one or more embodiments, the glass composition may include MgO and may be substantially free of CaO and ZnO. In one variant, the glass composition may include any one of CaO or ZnO and may be substantially free of the others of MgO, CaO and ZnO. In one or more specific embodiments, the glass composition may include only two of the alkali earth metal oxides of MgO, CaO and ZnO and may be substantially free of the third of the earth metal oxides.

The total amount, in mol %, of alkali metal oxides $R_2O$ in the glass composition may be in the range from about 5 to about 20, from about 5 to about 18, from about 5 to about 16, from about 5 to about 15, from about 5 to about 14, from about 5 to about 12, from about 5 to about 10, from about 5 to about 8, from about 5 to about 20, from about 6 to about 20, from about 7 to about 20, from about 8 to about 20, from about 9 to about 20, from about 10 to about 20, from about 11 to about 20, from about 12 to about 18, or from about 14 to about 18.

In one or more embodiments, the glass composition includes $Na_2O$ in an amount in the range from about 0 mol % to about 18 mol %, from about 0 mol % to about 16 mol % or from about 0 mol % to about 14 mol %, from about 0 mol % to about 12 mol %, from about 2 mol % to about 18 mol %, from about 4 mol % to about 18 mol %, from about 6 mol % to about 18 mol %, from about 8 mol % to about 18 mol %, from about 8 mol % to about 14 mol %, from about 8 mol % to about 12 mol %, or from about 10 mol % to about 12 mol %. In some embodiments, the composition may include about 4 mol % or more $Na_2O$.

In some embodiments, the amount of $Li_2O$ and $Na_2O$ is controlled to a specific amount or ratio to balance formability and ion exchangeability. For example, as the amount of $Li_2O$ increases, the liquidus viscosity may be reduced, thus preventing some forming methods from being used; however, such glass compositions are ion exchanged to deeper DOC levels, as described herein. The amount of $Na_2O$ can modify liquidus viscosity but can inhibit ion exchange to deeper DOC levels.

In one or more embodiments, the glass composition may include $K_2O$ in an amount less than about 5 mol %, less than about 4 mol %, less than about 3 mol %, less than about 2 mol %, or less than about 1 mol %. In one or more alternative embodiments, the glass composition may be substantially free, as defined herein, of $K_2O$.

In one or more embodiments, the glass composition may include $Li_2O$ in an amount about 0 mol % to about 18 mol %, from about 0 mol % to about 15 mol % or from about 0 mol % to about 10 mol %, from about 0 mol % to about 8 mol %, from about 0 mol % to about 6 mol %, from about 0 mol % to about 4 mol % or from about 0 mol % to about 2 mol %. In some embodiments, the glass composition may include $Li_2O$ in an amount about 2 mol % to about 10 mol %, from about 4 mol % to about 10 mol %, from about 6 mol % to about 10 mol, or from about 5 mol % to about 8 mol %. In one or more alternative embodiments, the glass composition may be substantially free, as defined herein, of $Li_2O$.

In one or more embodiments, the glass composition may include $Fe_2O_3$. In such embodiments, $Fe_2O_3$ may be present in an amount less than about 1 mol %, less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol % and all ranges and sub-ranges therebetween. In one or more alternative embodiments, the glass composition may be substantially free, as defined herein, of $Fe_2O_3$.

In one or more embodiments, the glass composition may include $ZrO_2$. In such embodiments, $ZrO_2$ may be present in an amount less than about 1 mol %, less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol % and all ranges and sub-ranges therebetween. In one or more alternative embodiments, the glass composition may be substantially free, as defined herein, of $ZrO_2$.

In one or more embodiments, the glass composition may include $P_2O_5$ in a range from about 0 mol % to about 10 mol %, from about 0 mol % to about 8 mol %, from about 0 mol % to about 6 mol %, from about 0 mol % to about 4 mol %, from about 0.1 mol % to about 10 mol %, from about 0.1 mol % to about 8 mol %, from about 2 mol % to about 8 mol %, from about 2 mol % to about 6 mol % or from about 2 mol % to about 4 mol %. In some instances, the glass composition may be substantially free of $P_2O_5$.

In one or more embodiments, the glass composition may include $TiO_2$. In such embodiments, $TiO_2$ may be present in an amount less than about 6 mol %, less than about 4 mol %, less than about 2 mol %, or less than about 1 mol %. In one or more alternative embodiments, the glass composition may be substantially free, as defined herein, of $TiO_2$. In some embodiments, $TiO_2$ is present in an amount in the range from about 0.1 mol % to about 6 mol %, or from about 0.1 mol % to about 4 mol %.

In some embodiments, the glass composition may include various compositional relationships. For example, the glass composition may include a ratio of the amount of $Li_2O$ (in mol %) to the total amount of $R_2O$ (in mol %) in the range from about 0 to about 1, from about 0 to about 0.5, from about 0 to about 0.4, from about 0.1 to about 0.5, or from about 0.2 to about 0.4.

In some embodiments, the glass composition may include a difference between the total amount of $R_2O$ (in mol %) to the amount of $Al_2O_3$ (in mol %) ($R_2O$—$Al_2O_3$) in the range from about 0 to about 5 (e.g., from about 0 to about 4, from about 0 to about 3, from about 0.1 to about 4, from about 0.1 to about 3, from about 0.1 to about 2 or from about 1 to about 2).

In some embodiments, the glass composition may include a difference between the total amount of $R_xO$ (in mol %) to the amount of $Al_2O_3$ (in mol %) ($R_xO$—$Al_2O_3$) in the range from about 0 to about 5 (e.g., from about 0 to about 4, from about 0 to about 3, from about 0.1 to about 4, from about 0.1 to about 3, from about 1 to about 3, or from about 2 to about 3).

In some embodiments, the glass composition may include a ratio of the total amount of $R_2O$ (in mol %) to the amount of $Al_2O_3$ (in mol %) ($R_2O/Al_2O_3$) in the range from about 0 to about 5 (e.g., from about 0 to about 4, from about 0 to about 3, from about 1 to about 4, from about 1 to about 3, or from about 1 to about 2).

In one or more embodiments, the glass composition includes a combined amount of $Al_2O_3$ and $Na_2O$ greater than about 15 mol % (e.g., greater than 18 mol %, greater than about 20 mol %, or greater than about 23 mol %). The combined amount of $Al_2O_3$ and $Na_2O$ may be up to and including about 30 mol %, about 32 mol % or about 35 mol %.

The glass composition of one or more embodiments may exhibit a ratio of the amount of MgO (in mol %) to the total amount of RO (in mol %) in the range from about 0 to about 2.

In some embodiments, glass composition may be substantially free of nucleating agents. Examples of typical nucleating agents are $TiO_2$, $ZrO_2$ and the like. Nucleating agents may be described in terms of function in that nucleating agents are constituents in the glass can initiate the formation of crystallites in the glass.

In some embodiments, the compositions used for the glass substrate may be batched with 0-2 mol % of at least one fining agent selected from a group that includes $Na_2SO_4$, NaCl, NaF, NaBr, $K_2SO_4$, KCl, KF, KBr, and $SnO_2$. The glass composition according to one or more embodiments may further include $SnO_2$ in the range from about 0 to about 2, from about 0 to about 1, from about 0.1 to about 2, from about 0.1 to about 1, or from about 1 to about 2. The glass compositions disclosed herein may be substantially free of $As_2O_3$ and/or $Sb_2O_3$.

In one or more embodiments, the composition may specifically include 62 mol % to 75 mol % $SiO_2$; 10.5 mol % to about 17 mol % $Al_2O_3$; 5 mol % to about 13 mol % $Li_2O$; 0 mol % to about 4 mol % ZnO; 0 mol % to about 8 mol % MgO; 2 mol % to about 5 mol % $TiO_2$; 0 mol % to about 4 mol % $B_2O_3$; 0 mol % to about 5 mol % $Na_2O$; 0 mol % to about 4 mol % $K_2O$; 0 mol % to about 2 mol % $ZrO_2$; 0 mol % to about 7 mol % $P_2O_5$; 0 mol % to about 0.3 mol % $Fe_2O_3$; 0 mol % to about 2 mol % MnOx; and 0.05 mol % to about 0.2 mol % $SnO_2$.

In one or more embodiments, the composition may include 67 mol % to about 74 mol % $SiO_2$; 11 mol % to about 15 mol % $Al_2O_3$; 5.5 mol % to about 9 mol % $Li_2O$; 0.5 mol % to about 2 mol % ZnO; 2 mol % to about 4.5 mol % MgO; 3 mol % to about 4.5 mol % $TiO_2$; 0 mol % to about 2.2 mol % $B_2O_3$; 0 mol % to about 1 mol % $Na_2O$; 0 mol % to about 1 mol % $K_2O$; 0 mol % to about 1 mol % $ZrO_2$; 0 mol % to about 4 mol % $P_2O_5$; 0 mol % to about 0.1 mol % $Fe_2O_3$; 0 mol % to about 1.5 mol % MnOx; and 0.08 mol % to about 0.16 mol % $SnO_2$.

In one or more embodiments, the composition may include 70 mol % to 75 mol % $SiO_2$; 10 mol % to about 15 mol % $Al_2O_3$; 5 mol % to about 13 mol % $Li_2O$; 0 mol % to about 4 mol % ZnO; 0.1 mol % to about 8 mol % MgO; 0 mol % to about 5 mol % $TiO_2$; 0.1 mol % to about 4 mol % $B_2O_3$; 0.1 mol % to about 5 mol % $Na_2O$; 0 mol % to about 4 mol % $K_2O$; 0 mol % to about 2 mol % $ZrO_2$; 0 mol % to about 7 mol % $P_2O_5$; 0 mol % to about 0.3 mol % $Fe_2O_3$; 0 mol % to about 2 mol % MnOx; and 0.05 mol % to about 0.2 mol % $SnO_2$.

In one or more embodiments, the composition may include 52 mol % to about 65 mol % $SiO_2$; 14 mol % to about 18 mol % $Al_2O_3$; 5.5 mol % to about 7 mol % $Li_2O$; 1 mol % to about 2 mol % ZnO; 0.01 mol % to about 2 mol % MgO; 4 mol % to about 12 mol % $Na_2O$; 0.1 mol % to about 4 mol % $P_2O_5$; and 0.01 mol % to about 0.16 mol % $SnO_2$. In some embodiments, the composition may be substantially free of any one or more of $B_2O_3$, $TiO_2$, $K_2O$ and $ZrO_2$.

In one or more embodiments, the composition may include 0.5 mol % or more $P_2O_5$, $Na_2O$ and, optionally, $Li_2O$, where $Li_2O$ (mol %)/$Na_2O$ (mol %)<1. In addition, these compositions may be substantially free of $B_2O_3$ and $K_2O$. In some embodiments, the composition may include ZnO, MgO, and $SnO_2$.

In some embodiments, the composition may comprise: from about 58 mol % to about 65 mol % $SiO_2$; from about 11 mol % to about 19 mol % $Al_2O_3$; from about 0.5 mol % to about 3 mol % $P_2O_5$; from about 6 mol % to about 18 mol % $Na_2O$; from 0 mol % to about 6 mol % MgO; and from 0 mol % to about 6 mol % ZnO. In certain embodiments, the composition may comprise from about 63 mol % to about 65 mol % $SiO_2$; from 11 mol % to about 17 mol % $Al_2O_3$; from about 1 mol % to about 3 mol % $P_2O_5$; from about 9 mol % to about 20 mol % $Na_2O$; from 0 mol % to about 6 mol % MgO; and from 0 mol % to about 6 mol % ZnO.

In some embodiments, the composition may include the following compositional relationships $R_2O$ (mol %)/$Al_2O_3$ (mol %)<2, where $R_2O=Li_2O\pm Na_2O$. In some embodiments, 65 mol %<$SiO_2$ (mol %)+$P_2O_5$ (mol %)<67 mol %. In certain embodiments, $R_2O$ (mol %)+R'O (mol %)−$Al_2O_3$ (mol %)+$P_2O_5$ (mol %)>−3 mol %, where $R_2O=Li_2O+Na_2O$ and R'O is the total amount of divalent metal oxides present in the composition.

Other exemplary compositions of glass-based articles prior to being chemically strengthened, as described herein, are shown in Table 1A. Table 1B lists selected physical properties determined for the examples listed in Table 1A. The physical properties listed in Table 1B include: density; low temperature and high temperature CTE; strain, anneal and softening points; $10^{11}$ Poise, 35 kP, 200 kP, liquidus, and zircon breakdown temperatures; zircon breakdown and liquidus viscosities; Poisson's ratio; Young's modulus; refractive index, and stress optical coefficient. In some embodiments, the glass-based articles and glass substrates described herein have a high temperature CTE of less than or equal to 30 ppm/° C. and/or a Young's modulus of 70 GPa or more and, in some embodiments, a Young's modulus of up to 80 GPa.

TABLE 1A

Exemplary compositions prior to chemical strengthening.

| Composition (mol %) | Ex. 1 | Ex. 2 | Ex. 3 | Ex. 4 | Ex. 5 | Ex. 6 | Ex. 7 |
| --- | --- | --- | --- | --- | --- | --- | --- |
| $SiO_2$ | 63.77 | 64.03 | 63.67 | 63.91 | 64.16 | 63.21 | 63.50 |
| $Al_2O_3$ | 12.44 | 12.44 | 11.83 | 11.94 | 11.94 | 11.57 | 11.73 |
| $P_2O_5$ | 2.43 | 2.29 | 2.36 | 2.38 | 1.92 | 1.93 | 1.93 |
| $Li_2O$ | 0.00 | 0.00 | 0.00 | 0.00 | 0.00 | 0.00 | 0.00 |
| $Na_2O$ | 16.80 | 16.81 | 16.88 | 16.78 | 16.80 | 17.63 | 16.85 |
| ZnO | 0.00 | 4.37 | 0.00 | 4.93 | 0.00 | 5.59 | 5.93 |
| MgO | 4.52 | 0.02 | 5.21 | 0.02 | 5.13 | 0.02 | 0.01 |
| $SnO_2$ | 0.05 | 0.05 | 0.05 | 0.05 | 0.05 | 0.05 | 0.05 |
| $R_2O/Al_2O_3$ | 1.35 | 1.35 | 1.43 | 1.41 | 1.41 | 1.52 | 1.44 |
| $Li_2O/Na_2O$ | 0.00 | 0.00 | 0.00 | 0.00 | 0.00 | 0.00 | 0.00 |
| ($R_2O$ + RO) − $Al_2O_3$ − $P_2O_5$ | 6.45 | 6.46 | 7.89 | 7.40 | 8.07 | 9.74 | 9.14 |

| Composition (mol %) | Ex. 8 | Ex. 9 | Ex. 10 | Ex. 11 | Ex. 12 | Ex. 13 | Ex. 14 |
| --- | --- | --- | --- | --- | --- | --- | --- |
| $SiO_2$ | 63.37 | 63.43 | 63.56 | 63.58 | 63.66 | 63.62 | 63.67 |
| $Al_2O_3$ | 11.72 | 12.49 | 12.63 | 12.59 | 12.91 | 12.85 | 12.89 |
| $P_2O_5$ | 2.00 | 2.32 | 2.46 | 2.46 | 2.43 | 2.45 | 2.47 |
| $Li_2O$ | 0.00 | 0.00 | 1.42 | 2.87 | 0.00 | 1.42 | 2.92 |
| $Na_2O$ | 16.84 | 17.16 | 15.45 | 14.04 | 16.89 | 15.48 | 13.92 |
| ZnO | 6.00 | 4.54 | 4.43 | 4.41 | 4.04 | 4.12 | 4.06 |
| MgO | 0.02 | 0.02 | 0.02 | 0.02 | 0.02 | 0.02 | 0.02 |
| $SnO_2$ | 0.05 | 0.04 | 0.05 | 0.05 | 0.05 | 0.05 | 0.05 |
| $R_2O/Al_2O_3$ | 1.44 | 1.37 | 1.34 | 1.34 | 1.31 | 1.31 | 1.31 |
| $Li_2O/Na_2O$ | 0.00 | 0.00 | 0.09 | 0.20 | 0.00 | 0.09 | 0.21 |
| ($R_2O$ + RO) − $Al_2O_3$ − $P_2O_5$ | 9.14 | 6.90 | 6.22 | 6.29 | 5.62 | 5.72 | 5.57 |

TABLE 1A-continued

Exemplary compositions prior to chemical strengthening.

| Composition (mol %) | Ex. 15 | Ex. 16 | Ex. 17 | Ex. 18 | Ex. 19 | Ex. 20 | Ex. 21 |
|---|---|---|---|---|---|---|---|
| $SiO_2$ | 63.55 | 63.80 | 63.76 | 63.88 | 63.74 | 64.03 | 63.68 |
| $Al_2O_3$ | 12.92 | 12.90 | 12.95 | 13.48 | 13.37 | 13.26 | 13.19 |
| $P_2O_5$ | 2.35 | 2.34 | 2.37 | 2.31 | 2.34 | 2.29 | 2.46 |
| $Li_2O$ | 0.00 | 1.47 | 2.94 | 0.00 | 1.48 | 2.94 | 0.00 |
| $Na_2O$ | 17.97 | 16.36 | 14.85 | 17.20 | 15.96 | 14.37 | 16.84 |
| ZnO | 0.00 | 0.00 | 0.00 | 0.00 | 0.00 | 0.00 | 3.77 |
| MgO | 3.17 | 3.08 | 3.09 | 3.08 | 3.08 | 3.06 | 0.02 |
| $SnO_2$ | 0.05 | 0.04 | 0.05 | 0.05 | 0.04 | 0.04 | 0.05 |
| $R_2O/Al_2O_3$ | 1.39 | 1.38 | 1.37 | 1.28 | 1.30 | 1.31 | 1.28 |
| $Li_2O/Na_2O$ | 0.00 | 0.09 | 0.20 | 0.00 | 0.09 | 0.20 | 0.00 |
| $(R_2O + RO) - Al_2O_3 - P_2O_5$ | 5.87 | 5.67 | 5.56 | 4.48 | 4.81 | 4.83 | 4.98 |
| Composition (mol %) | Ex. 22 | Ex. 23 | Ex. 24 | Ex. 25 | Ex. 26 | Ex. 27 | Ex. 28 |
| $SiO_2$ | 63.66 | 63.76 | 63.67 | 63.73 | 63.73 | 63.64 | 63.76 |
| $Al_2O_3$ | 14.15 | 15.31 | 13.87 | 14.82 | 12.93 | 16.62 | 16.59 |
| $P_2O_5$ | 2.47 | 2.44 | 2.47 | 2.43 | 2.48 | 2.47 | 2.47 |
| $Li_2O$ | 1.49 | 2.98 | 1.50 | 2.96 | 0.00 | 2.52 | 4.91 |
| $Na_2O$ | 15.31 | 13.79 | 15.36 | 13.93 | 16.83 | 14.68 | 12.20 |
| ZnO | 2.85 | 1.64 | 0.00 | 0.00 | 2.98 | 0.00 | 0.00 |
| MgO | 0.03 | 0.03 | 3.09 | 2.08 | 1.00 | 0.03 | 0.03 |
| $SnO_2$ | 0.05 | 0.04 | 0.05 | 0.05 | 0.05 | 0.05 | 0.05 |
| $R_2O/Al_2O_3$ | 1.19 | 1.10 | 1.22 | 1.14 | 1.30 | 1.03 | 1.03 |
| $Li_2O/Na_2O$ | 0.10 | 0.22 | 0.10 | 0.21 | 0.00 | 0.17 | 0.40 |
| $(R_2O + RO) - Al_2O_3 - P_2O_5$ | 3.05 | 0.70 | 3.61 | 1.72 | 5.40 | −1.86 | −1.92 |
| Composition (mol %) | Ex. 29 | Ex. 30 | Ex. 31 | Ex. 32 | Ex. 33 | Ex. 34 | Ex. 35 |
| $SiO_2$ | 63.89 | 63.92 | 63.77 | 63.73 | 63.70 | 63.65 | 63.87 |
| $Al_2O_3$ | 16.55 | 15.29 | 15.27 | 15.30 | 15.27 | 15.22 | 15.29 |
| $P_2O_5$ | 2.47 | 2.24 | 2.31 | 2.39 | 2.40 | 2.48 | 2.37 |
| $Li_2O$ | 7.27 | 3.46 | 2.98 | 4.02 | 4.46 | 4.96 | 5.39 |
| $Na_2O$ | 9.74 | 13.46 | 13.99 | 12.91 | 12.51 | 11.99 | 11.44 |
| ZnO | 0.00 | 1.56 | 1.61 | 1.57 | 1.58 | 1.63 | 1.57 |
| MgO | 0.03 | 0.02 | 0.02 | 0.03 | 0.03 | 0.02 | 0.02 |
| $SnO_2$ | 0.04 | 0.04 | 0.04 | 0.05 | 0.04 | 0.05 | 0.04 |
| $R_2O/Al_2O_3$ | 1.03 | 1.11 | 1.11 | 1.11 | 1.11 | 1.11 | 1.10 |
| $Li_2O/Na_2O$ | 0.75 | 0.26 | 0.21 | 0.31 | 0.36 | 0.41 | 0.47 |
| $(R_2O + RO) - Al_2O_3 - P_2O_5$ | −1.98 | 0.97 | 1.01 | 0.84 | 0.90 | 0.91 | 0.76 |
| Composition (mol %) | Ex. 36 | Ex. 37 | Ex. 38 | Ex. 39 | Ex. 40 | Ex. 41 | Ex. 42 |
| $SiO_2$ | 63.69 | 63.75 | 63.70 | 63.62 | 63.74 | 63.77 | 63.77 |
| $Al_2O_3$ | 15.26 | 15.30 | 15.27 | 15.23 | 15.27 | 15.27 | 15.33 |
| $P_2O_5$ | 2.45 | 2.42 | 2.45 | 2.46 | 2.47 | 2.46 | 2.44 |
| $Li_2O$ | 2.96 | 2.98 | 3.94 | 3.98 | 4.93 | 4.93 | 2.91 |
| $Na_2O$ | 13.50 | 13.46 | 12.54 | 12.57 | 11.49 | 11.50 | 13.94 |
| ZnO | 2.06 | 2.01 | 2.03 | 2.06 | 2.03 | 2.00 | 0.00 |
| MgO | 0.02 | 0.03 | 0.02 | 0.03 | 0.03 | 0.03 | 1.57 |
| $SnO_2$ | 0.05 | 0.04 | 0.04 | 0.05 | 0.04 | 0.05 | 0.04 |
| $R_2O/Al_2O_3$ | 1.08 | 1.08 | 1.08 | 1.09 | 1.08 | 1.08 | 1.10 |
| $Li_2O/Na_2O$ | 0.22 | 0.22 | 0.31 | 0.32 | 0.43 | 0.43 | 0.21 |
| $(R_2O + RO) - Al_2O_3 - P_2O_5$ | 0.83 | 0.77 | 0.80 | 0.95 | 0.73 | 0.73 | 0.66 |
| Composition (mol %) | Ex. 43 | Ex. 44 | Ex. 45 | Ex. 46 | Ex. 47 | Ex. 48 | Ex. 49 |
| $SiO_2$ | 63.69 | 63.81 | 63.65 | 63.71 | 63.62 | 63.65 | 63.62 |
| $Al_2O_3$ | 15.25 | 15.26 | 15.33 | 15.32 | 15.24 | 15.68 | 15.67 |
| $P_2O_5$ | 2.43 | 2.41 | 2.46 | 2.44 | 2.47 | 2.44 | 2.48 |
| $Li_2O$ | 4.00 | 4.89 | 2.96 | 4.01 | 4.91 | 6.07 | 6.06 |
| $Na_2O$ | 13.01 | 12.03 | 13.29 | 12.25 | 11.42 | 10.93 | 10.53 |
| ZnO | 0.00 | 0.00 | 2.24 | 2.20 | 2.27 | 1.17 | 1.57 |
| MgO | 1.57 | 1.56 | 0.03 | 0.03 | 0.02 | 0.02 | 0.02 |
| $SnO_2$ | 0.05 | 0.04 | 0.05 | 0.04 | 0.05 | 0.04 | 0.05 |
| $R_2O/Al_2O_3$ | 1.12 | 1.11 | 1.06 | 1.06 | 1.07 | 1.08 | 1.06 |
| $Li_2O/Na_2O$ | 0.31 | 0.41 | 0.22 | 0.33 | 0.43 | 0.56 | 0.58 |
| $(R_2O + RO) - Al_2O_3 - P_2O_5$ | 0.90 | 0.81 | 0.73 | 0.73 | 0.91 | 0.08 | 0.04 |
| Composition (mol %) | Ex. 50 | Ex. 51 | Ex. 52 | Ex. 53 | Ex. 54 | Ex. 55 | Ex. 56 |
| $SiO_2$ | 63.60 | 63.89 | 63.84 | 63.90 | 63.88 | 64.74 | 60.17 |
| $Al_2O_3$ | 15.65 | 16.09 | 16.47 | 16.87 | 16.97 | 15.25 | 18.58 |
| $P_2O_5$ | 2.46 | 2.42 | 2.43 | 2.43 | 2.42 | 0.98 | 1.90 |
| $Li_2O$ | 6.13 | 6.80 | 7.84 | 8.75 | 9.78 | 5.28 | 5.16 |
| $Na_2O$ | 10.29 | 9.97 | 8.96 | 7.99 | 6.88 | 12.09 | 12.58 |
| ZnO | 1.81 | 0.78 | 0.39 | 0.00 | 0.00 | 1.61 | 1.55 |

TABLE 1A-continued

Exemplary compositions prior to chemical strengthening.

| | | | | | | | |
|---|---|---|---|---|---|---|---|
| MgO | 0.02 | 0.02 | 0.02 | 0.02 | 0.02 | 0.02 | 0.02 |
| $SnO_2$ | 0.04 | 0.04 | 0.04 | 0.04 | 0.04 | 0.03 | 0.03 |
| $R_2O/Al_2O_3$ | 1.05 | 1.04 | 1.02 | 0.99 | 0.98 | 1.14 | 0.96 |
| $Li_2O/Na_2O$ | 0.60 | 0.68 | 0.87 | 1.10 | 1.42 | 0.44 | 0.41 |
| $(R_2O + RO) - Al_2O_3 - P_2O_5$ | 0.14 | −0.94 | −1.68 | −2.54 | −2.70 | 2.78 | −1.16 |

| Composition (mol %) | Ex. 57 | Ex. 58 | Ex. 59 | Ex. 60 | Ex. 61 | Ex. 62 | Ex. 63 | Ex. 64 |
|---|---|---|---|---|---|---|---|---|
| $SiO_2$ | 58.32 | 63.3 | 63.3 | 63.3 | 63.3 | 63.3 | 63.3 | 63.46 |
| $Al_2O_3$ | 18.95 | 15.25 | 15.65 | 16.2 | 15.1 | 15.425 | 15.7 | 15.71 |
| $P_2O_5$ | 2.42 | 2.5 | 2.5 | 2.5 | 2.5 | 2.5 | 2.5 | 2.45 |
| $Li_2O$ | 4.96 | 6 | 7 | 7.5 | 6 | 7 | 7.5 | 6.37 |
| $Na_2O$ | 13.74 | 10.7 | 9.7 | 9.45 | 10.55 | 9.475 | 8.95 | 10.69 |
| ZnO | 1.56 | 1.2 | 0.8 | 0 | 2.5 | 2.25 | 2 | 1.15 |
| MgO | 0.02 | 1 | 1 | 1 | 0 | 0 | 0 | 0.06 |
| $SnO_2$ | 0.03 | 0.05 | 0.05 | 0.05 | 0.05 | 0.05 | 0.05 | 0.04 |
| $R_2O/Al_2O_3$ | 0.99 | 1.10 | 1.07 | 1.05 | 1.10 | 1.07 | 1.05 | 1.09 |
| $Li_2O/Na_2O$ | 0.36 | 0.56 | 0.72 | 0.79 | 0.57 | 0.74 | 0.84 | 0.6 |
| $(R_2O + RO) - Al_2O_3 - P_2O_5$ | −1.09 | 1.15 | 0.35 | −0.75 | 1.45 | 0.80 | 0.25 | −1.1 |

TABLE 2

Selected physical properties of the glasses listed in Table 1.

| | Ex. 1 | Ex. 2 | Ex. 3 | Ex. 4 | Ex. 5 | Ex. 6 | Ex. 7 |
|---|---|---|---|---|---|---|---|
| Density (g/cm$^3$) | 2.434 | 2.493 | 2.434 | 2.504 | 2.44 | 2.514 | 2.519 |
| Low temperature CTE 25-300° C. (ppm/° C.) | 8.9 | 8.62 | 8.95 | 8.6 | 8.82 | 8.71 | 8.54 |
| High temperature CTE (ppm/° C.) | 17.67 | 19.1 | 17.16 | 21 | 18.12 | 20 | 20.11 |
| Strain pt. (° C.) | 630 | 591 | 612 | 580 | 605 | 580 | 589 |
| Anneal pt. (° C.) | 683 | 641 | 662 | 628 | 651 | 629 | 639 |
| $10^{11}$ Poise temperature (° C.) | 770 | 725 | 748 | 710 | 734 | 711 | 721 |
| Softening pt. (° C.) | 937 | 888 | 919 | 873 | 909 | 868 | 874 |
| $T^{35\ kP}$ (° C.) | | | | 1167 | 1180 | 1158 | 1160 |
| $T^{200\ kP}$ (° C.) | | | | 1070 | 1083 | 1061 | 1064 |
| Zircon breakdown temperature (° C.) | | 1205 | | 1220 | 1170 | 1185 | 1205 |
| Zircon breakdown viscosity (P) | | | | $1.56 \times 10^4$ | $4.15 \times 10^4$ | $2.29 \times 10^4$ | $1.74 \times 10^4$ |
| Liquidus temperature (° C.) | | 980 | | 990 | 975 | 990 | 1000 |
| Liquidus viscosity (P) | | | | $1.15 \times 10^6$ | $2.17 \times 10^6$ | $9.39 \times 10^5$ | $7.92 \times 10^5$ |
| Poisson's ratio | 0.200 | 0.211 | 0.206 | 0.214 | 0.204 | 0.209 | 0.211 |
| Young's modulus (GPa) | 69.2 | 68.8 | 69.4 | 68.5 | 69.6 | 68.3 | 69.0 |
| Refractive index at 589.3 nm | 1.4976 | 1.5025 | 1.4981 | 1.5029 | 1.4992 | 1.5052 | 1.506 |
| Stress optical coefficient (nm/mm/MPa) | 2.963 | 3.158 | 3.013 | 3.198 | 2.97 | 3.185 | 3.234 |

| | Ex. 8 | Ex. 9 | Ex. 10 | Ex. 11 | Ex. 12 | Ex. 13 | Ex. 14 |
|---|---|---|---|---|---|---|---|
| Density (g/cm$^3$) | 2.516 | 2.501 | 2.498 | 2.493 | 2.493 | 2.492 | 2.486 |
| Low temperature CTE 25-300° C. (ppm/° C.) | 8.35 | 8.67 | 8.87 | 8.49 | 8.65 | 8.71 | 8.49 |
| High temperature CTE (ppm/° C.) | 20.11 | 20.6 | 20.94 | | 19.52 | 20.77 | |
| Strain pt. (° C.) | 590 | 589 | 591 | 584 | 600 | 579 | 588 |
| Anneal pt. (° C.) | 641 | 639 | 640 | 628 | 652 | 620 | 630 |
| $10^{11}$ Poise temperature (° C.) | 726 | 724 | 720 | 704 | 738 | 695 | 704 |
| Softening pt. (° C.) | 888 | 890 | 865 | 857 | 900 | 867 | 860 |
| $T^{35\ kP}$ (° C.) | 1170 | 1176 | 1159 | 1139 | 1197 | 1169 | |
| $T^{200\ kP}$ (° C.) | 1073 | 1080 | 1061 | 1041 | 1099 | 1070 | |
| Zircon breakdown temperature (° C.) | 1195 | 1195 | 1210 | 1225 | 1195 | 1195 | 1220 |
| Zircon breakdown viscosity (P) | $2.33 \times 10^4$ | $2.58 \times 10^4$ | $1.60 \times 10^4$ | $9.94 \times 10^3$ | $3.63 \times 10^4$ | $2.35 \times 10^4$ | |
| Liquidus temperature (° C.) | 1005 | 990 | 990 | 980 | 990 | 980 | 980 |
| Liquidus viscosity (P) | $8.69 \times 10^4$ | 1.48E+06 | 9.02E+05 | 7.10E+05 | 2.19E+06 | 1.33E+06 | |
| Poisson's ratio | 0.211 | 0.205 | 0.208 | 0.209 | 0.209 | 0.210 | 0.217 |
| Young's modulus (GPa) | 69.0 | 68.7 | 71.4 | 73.5 | 68.4 | 71.6 | 74.0 |
| Refractive index at 589.3 nm | 1.506 | 1.5036 | 1.505 | 1.5063 | 1.5026 | 1.5041 | 1.5052 |
| Stress optical coefficient (nm/mm/MPa) | 3.234 | 3.194 | 3.157 | 3.131 | 3.18 | 3.156 | 3.131 |

| | Ex. 15 | Ex. 16 | Ex. 17 | Ex. 18 | Ex. 19 | Ex. 20 | Ex. 21 |
|---|---|---|---|---|---|---|---|
| Density (g/cm$^3$) | 2.433 | 2.429 | 2.426 | 2.431 | 2.428 | 2.433 | 2.486 |
| Low temperature CTE 25-300° C. (ppm/° C.) | 9.15 | 9.16 | 8.83 | 8.97 | 8.97 | 8.79 | 8.45 |

TABLE 2-continued

Selected physical properties of the glasses listed in Table 1.

| | | | | | | | |
|---|---|---|---|---|---|---|---|
| High temperature CTE (ppm/° C.) | 20 | 20 | 21 | 17.3 | 20 | | |
| Strain pt. (° C.) | 615 | 606 | 599 | 633 | 616 | 611 | 602 |
| Anneal pt. (° C.) | 662 | 659 | 653 | 684 | 670 | 665 | 653 |
| $10^{11}$ Poise temperature (° C.) | 747 | 745 | 741 | 771 | 758 | 751 | 739 |
| Softening pt. (° C.) | 935 | 903 | 901 | 943 | 918 | 905 | 910 |
| $T^{35\ kP}$ (° C.) | 1182 | 1166 | 1152 | 1221 | 1185 | 1167 | 1207 |
| $T^{200\ kP}$ (° C.) | 1083 | 1066 | 1051 | 1122 | 1084 | 1066 | 1108 |
| Zircon breakdown temperature (° C.) | | | | | | | |
| Zircon breakdown viscosity (P) | | | | | | | |
| Liquidus temperature (° C.) | | | | | | | |
| Liquidus viscosity (P) | | | | | | | |
| Poisson's ratio | 0.203 | 0.207 | 0.205 | 0.209 | 0.199 | | 0.207 |
| Young's modulus (GPa) | 68.9 | 71.2 | 72.7 | 69.4 | 70.9 | | 68.1 |
| Refractive index at 589.3 nm | 1.4964 | 1.4981 | 1.4991 | 1.4965 | 1.4984 | 1.5006 | 1.5019 |
| Stress optical coefficient (nm/mm/MPa) | 2.994 | 3.022 | 2.982 | 2.979 | 2.99 | 0 | 3.173 |

| | Ex. 22 | Ex. 23 | Ex. 24 | Ex. 25 | Ex. 26 | Ex. 27 | Ex. 28 |
|---|---|---|---|---|---|---|---|
| Density (g/cm³) | 2.468 | 2.448 | 2.434 | 2.428 | 2.47 | 2.419 | 2.414 |
| Low temperature CTE 25-300° C. (ppm/° C.) | 8.6 | 8.23 | 8.91 | 8.25 | 8.66 | 8.52 | 8.17 |
| High temperature CTE (ppm/° C.) | 19.52 | | 19.49 | | | | 19.47 |
| Strain pt. (° C.) | 596 | 595 | 638 | 616 | 608 | 640 | 620 |
| Anneal pt. (° C.) | 644 | 649 | 695 | 656 | 654 | 700 | 677 |
| $10^{11}$ Poise temperature (° C.) | 728 | 741 | 785 | 732 | 736 | 798 | 771 |
| Softening pt. (° C.) | 905 | 922 | 941 | 925 | 911 | 978 | 946 |
| $T^{35\ kP}$ (° C.) | 1217 | 1227 | 1209 | 1215 | 1209 | 1283 | 1249 |
| $T^{200\ kP}$ (° C.) | 1115 | 1125 | 1109 | 1115 | 1107 | 1184 | 1150 |
| Zircon breakdown temperature (° C.) | 1185 | 1185 | 1180 | 1185 | | | 1185 |
| Zircon breakdown viscosity (P) | 5.86E+04 | 6.91E+04 | 5.59E+04 | 5.72E+04 | | | 1.05E+05 |
| Liquidus temperature (° C.) | 975 | 980 | 1080 | 1025 | | | 940 |
| Liquidus viscosity (P) | 4.14E+06 | 4.52E+06 | 3.56E+05 | 1.27E+06 | | | 2.92E+07 |
| Poisson's ratio | 0.210 | | 0.204 | 0.210 | 0.210 | | 0.213 |
| Young's modulus (GPa) | 71.4 | | 71.6 | 73.5 | 68.8 | | 76.9 |
| Refractive index at 589.3 nm | 1.502 | 1.5025 | 1.4996 | 1.5008 | 1.5006 | 1.4987 | 1.5014 |
| Stress optical coefficient (nm/mm/MPa) | 3.123 | 3.03 | 3.001 | 3.021 | 3.148 | 3.039 | 3.015 |

| | Ex. 29 | Ex. 30 | Ex. 31 | Ex. 32 | Ex. 33 | Ex. 34 | Ex. 35 |
|---|---|---|---|---|---|---|---|
| Density (g/cm³) | 2.408 | 2.446 | 2.448 | 2.446 | 2.445 | 2.443 | 2.442 |
| Low temperature CTE 25-300° C. (ppm/° C.) | 7.86 | 8.29 | 8.38 | 8.17 | 8.14 | 8.04 | 7.97 |
| High temperature CTE (ppm/° C.) | 18.57 | | | | | 19.71 | |
| Strain pt. (° C.) | 610 | 591 | 595 | 585 | 580 | 574 | 577 |
| Anneal pt. (° C.) | 665 | 645 | 649 | 638 | 633 | 627 | 629 |
| $10^{11}$ Poise temperature (° C.) | 755 | 736 | 740 | 726 | 722 | 717 | 717 |
| Softening pt. (° C.) | 924 | 915 | 919 | 894 | 894 | 895 | 890 |
| $T^{35\ kP}$ (° C.) | 1216 | 1223 | 1227 | 1216 | 1210 | 1203 | 1196 |
| $T^{200\ kP}$ (° C.) | 1120 | 1122 | 1126 | 1114 | 1108 | 1102 | 1095 |
| Zircon breakdown temperature (° C.) | 1210 | 1175 | 1180 | 1190 | 1195 | 1210 | 1205 |
| Zircon breakdown viscosity (P) | 3.86E+04 | 7.72E+04 | 7.55E+04 | 5.29E+04 | 4.43E+04 | 3.14E+04 | 3.04E+04 |
| Liquidus temperature (° C.) | 1080 | 990 | 975 | 975 | 975 | 975 | 980 |
| Liquidus viscosity (P) | 4.55E+05 | 3.28E+06 | 5.43E+06 | 3.80E+06 | 3.33E+06 | 3.02E+06 | 2.29E+06 |
| Poisson's ratio | 0.211 | 0.206 | 0.202 | 0.21 | 0.204 | 0.204 | 0.203 |
| Young's modulus (GPa) | 75.0 | 73.91 | 73.02 | 74.60 | 74.67 | 75.15 | 75.43 |
| Refractive index at 589.3 nm | 1.5053 | 1.503 | 1.5025 | 1.5035 | 1.5041 | 1.5046 | 1.5053 |
| Stress optical coefficient (nm/mm/MPa) | 3.002 | 3.074 | 3.083 | 3.071 | 3.059 | 3.016 | 3.053 |

| | Ex. 36 | Ex. 37 | Ex. 38 | Ex. 39 | Ex. 40 | Ex. 41 | Ex. 42 |
|---|---|---|---|---|---|---|---|
| Density (g/cm³) | 2.453 | 2.453 | 2.452 | 2.451 | 2.449 | 2.449 | 2.425 |
| Low temperature CTE 25-300° C. (ppm/° C.) | 8.17 | 8.14 | 7.97 | 8.01 | 7.79 | 7.9 | 8.54 |
| High temperature CTE (ppm/° C.) | | | | | 20.56 | | |
| Strain pt. (° C.) | 595 | 595 | 584 | 587 | 578 | 584 | 617 |
| Anneal pt. (° C.) | 649 | 649 | 638 | 640 | 630 | 637 | 663 |
| $10^{11}$ Poise temperature (° C.) | 740 | 741 | 729 | 730 | 718 | 726 | 746 |
| Softening pt. (° C.) | 918 | 921 | 905 | 907 | 894 | 901 | 929 |
| $T^{35\ kP}$ (° C.) | 1229 | 1232 | 1212 | 1219 | 1200 | 1204 | 1232 |
| $T^{200\ kP}$ (° C.) | 1128 | 1131 | 1111 | 1118 | 1100 | 1103 | 1132 |
| Zircon breakdown temperature (° C.) | 1185 | | 1200 | | 1210 | | |

TABLE 2-continued

Selected physical properties of the glasses listed in Table 1.

| | | | | | | | | |
|---|---|---|---|---|---|---|---|---|
| Zircon breakdown viscosity (P) | 7.20E+04 | | 4.26E+04 | | 3.00E+04 | | | |
| Liquidus temperature (° C.) | 995 | | 990 | | 965 | | | |
| Liquidus viscosity (P) | 3.33E+06 | | 2.51E+06 | | 3.71E+06 | | | |
| Poisson's ratio | 0.208 | | 0.206 | | 0.206 | | | |
| Young's modulus (GPa) | 73.70 | | 74.67 | | 75.50 | | | |
| Refractive index at 589.3 nm | 1.5032 | | 1.5042 | | 1.5054 | | 1.5005 | |
| Stress optical coefficient (nm/mm/MPa) | 3.093 | | 3.071 | | 3.072 | | 3.033 | |

| | Ex. 43 | Ex. 44 | Ex. 45 | Ex. 46 | Ex. 47 | Ex. 48 | Ex. 49 | Ex. 50 |
|---|---|---|---|---|---|---|---|---|
| Density (g/cm³) | 2.424 | 2.422 | 2.455 | 2.454 | 2.454 | 2.434 | 2.439 | 2.443 |
| Low temperature coefficient of thermal expansion 25-300° C. (ppm/° C.) | 8.48 | 8.34 | 8.03 | 7.88 | 7.76 | 7.87 | 7.71 | 7.63 |
| High temperature coefficient of thermal expansion (ppm/° C.) | | | | | | | | |
| Strain pt. temperature (° C.) | 614 | 594 | 595 | 586 | 579 | 580 | 581 | 579 |
| Anneal pt. temperature (° C.) | 659 | 640 | 649 | 639 | 630 | 633 | 633 | 632 |
| $10^{11}$ Poise temperature (° C.) | 739 | 722 | 740 | 729 | 718 | 722 | 721 | 721 |
| Softening pt. temperature (° C.) | 912 | 899 | 918 | 909 | 898 | 892 | 893 | 895 |
| 35 kP temperature (° C.) | 1216 | 1204 | | 1212 | 1200 | 1203 | 1203 | 1203 |
| 200 kP temperature (° C.) | 1116 | 1102 | | 1113 | 1099 | 1105 | 1102 | 1103 |
| Zircon breakdown temperature (° C.) | | | | | | | | |
| Zircon breakdown viscosity (P) | | | | | | | | |
| Liquidus temperature (° C.) | | | 985 | | 965 | 1005 | 1010 | 1030 |
| Liquidus viscosity (P) | | | | | 4.E+06 | 1.78E+06 | 1.34E+06 | 8.98E+05 |
| Poisson's ratio | | | | | | 0.211 | 0.21 | 0.213 |
| Young's modulus (GPa) | | | | | | 76.32 | 76.60 | 76.81 |
| Refractive index at 589.3 nm | 1.5014 | 1.5026 | 1.5036 | 1.5047 | 1.5061 | 1.505 | 1.5059 | 1.5064 |
| Stress optical coefficient (nm/mm/MPa) | 2.965 | 2.981 | 3.082 | 3.057 | 3.063 | 3.025 | 3.004 | 3.046 |

| | Ex. 51 | Ex. 52 | Ex. 53 | Ex. 54 | Ex. 55 | Ex. 56 | Ex. 57 |
|---|---|---|---|---|---|---|---|
| Density (g/cm³) | 2.424 | 2.431 | 2.403 | 2.4 | 2.45 | 2.462 | 2.468 |
| Low temperature CTE 25-300° C. (ppm/° C.) | 77.1 | 76.1 | 74.3 | 73.1 | 80.2 | 79.7 | 83.6 |
| High temperature CTE (ppm/° C.) | | | | | | | |
| Strain pt. (° C.) | 588 | 599 | 611 | 612 | 580 | 611 | 597 |
| Anneal pt. (° C.) | 640 | 651 | 665 | 665 | 631 | 663 | 649 |
| $10^{11}$ Poise temperature (° C.) | 728 | 738 | 753 | 752 | 718 | 750 | 735 |
| Softening pt. (° C.) | 900.4 | 907.5 | 916 | 912.5 | 892.2 | 915.6 | 899.4 |
| $T^{35\,kP}$ (° C.) | 1204 | 1209 | 1209 | 1202 | 1206 | 1205 | 1184 |
| $T^{200\,kP}$ (° C.) | 1106 | 1113 | 1113 | 1106 | 1102 | 1111 | 1093 |
| Zircon breakdown temperature (° C.) | | | | | | | |
| Zircon breakdown viscosity (P) | | | | | | | |
| Liquidus temperature (° C.) | 1060 | 1115 | 1160 | 1205 | | | |
| Liquidus viscosity (P) | 5.11E+05 | 1.90E+05 | 8.18E+04 | 3.32E+04 | | | |
| Poisson's ratio | 0.211 | 0.212 | 0.208 | 0.214 | | | |
| Young's modulus (GPa) | 77.01 | 78.05 | 77.57 | 78.74 | | | |
| Refractive index at 589.3 nm | 1.5054 | 1.5055 | 1.5059 | 1.5072 | | | |
| Stress optical coefficient (nm/mm/MPa) | 3.011 | 2.98 | 2.982 | 2.964 | | | |

| | Ex. 64 |
|---|---|
| Density (g/cm³) | 2.428 |
| CTE 25-300° C. (ppm/° C.) | 7.8 |
| Strain pt. (° C.) | 571 |
| Anneal pt. (° C.) | 622 |
| $10^{11}$ Poise temperature (° C.) | |
| Softening pt. (° C.) | 881.4 |
| $T^{35\,kP}$ (° C.) | |
| $T^{200\,kP}$ (° C.) | 1645 |
| Zircon breakdown temperature (° C.) | |
| Zircon breakdown viscosity (P) | |
| Liquidus temperature (° C.) | 1000 |
| Liquidus viscosity (P) | 1524280 |
| Poisson's ratio | 0.211 |
| Young's modulus (GPa) | 76.3 |

TABLE 2-continued

Selected physical properties of the glasses listed in Table 1.

| | |
|---|---|
| Refractive index at 589.3 nm | 1.51 |
| Stress optical coefficient (nm/mm/MPa) | 3.02 |

Where the glass-based article includes a glass-ceramic, the crystal phases may include β-spodumene, rutile, gahnite or other known crystal phases and combinations thereof.

The glass-based article may be substantially planar, although other embodiments may utilize a curved or otherwise shaped or sculpted substrate. In some instances, the glass-based article may have a 3D or 2.5D shape. The glass-based article may be substantially optically clear, transparent and free from light scattering. The glass-based article may have a refractive index in the range from about 1.45 to about 1.55. As used herein, the refractive index values are with respect to a wavelength of 550 nm.

Additionally or alternatively, the thickness of the glass-based article may be constant along one or more dimension or may vary along one or more of its dimensions for aesthetic and/or functional reasons. For example, the edges of the glass-based article may be thicker as compared to more central regions of the glass-based article. The length, width and thickness dimensions of the glass-based article may also vary according to the article application or use.

The glass-based article may be characterized by the manner in which it is formed. For instance, where the glass-based article may be characterized as float-formable (i.e., formed by a float process), down-drawable and, in particular, fusion-formable or slot-drawable (i.e., formed by a down draw process such as a fusion draw process or a slot draw process). In specific embodiments, the glass-based articles are fusion-formable.

A float-formable glass-based article may be characterized by smooth surfaces and uniform thickness is made by floating molten glass on a bed of molten metal, typically tin. In an example process, molten glass that is fed onto the surface of the molten tin bed forms a floating glass ribbon. As the glass ribbon flows along the tin bath, the temperature is gradually decreased until the glass ribbon solidifies into a solid glass-based article that can be lifted from the tin onto rollers. Once off the bath, the glass glass-based article can be cooled further and annealed to reduce internal stress. Where the glass-based article is a glass ceramic, the glass-based article formed from the float process may be subjected to a ceramming process by which one or more crystalline phases are generated.

Down-draw processes produce glass-based articles having a uniform thickness that possess relatively pristine surfaces. Because the average flexural strength of the glass-based article is controlled by the amount and size of surface flaws, a pristine surface that has had minimal contact has a higher initial strength. When this high strength glass-based article is then further strengthened (e.g., chemically), the resultant strength can be higher than that of a glass-based article with a surface that has been lapped and polished. Down-drawn glass-based articles may be drawn to a thickness of less than about 2 mm. In addition, down drawn glass-based articles have a very flat, smooth surface that can be used in its final application without costly grinding and polishing. Where the glass-based article is a glass ceramic, the glass-based article formed from the down draw process may be subjected to a ceramming process by which one or more crystalline phases are generated.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass-based article. The fusion draw method offers the advantage that, because the two glass films flowing over the channel fuse together, neither of the outside surfaces of the resulting glass-based article comes in contact with any part of the apparatus. Thus, the surface properties of the fusion drawn glass-based article are not affected by such contact. Where the glass-based article is a glass ceramic, the glass-based article formed from the fusion process may be subjected to a ceramming process by which one or more crystalline phases are generated.

The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass-based article and into an annealing region.

The glass-based article may be acid polished or otherwise treated to remove or reduce the effect of surface flaws.

Another aspect of this disclosure pertains to a method of forming a fracture-resistant glass-based article. The method includes providing a glass-based substrate having a first surface and a second surface defining a thickness of about 1 millimeter or less and generating a stress profile in the glass-based substrate, as described herein to provide the fracture-resistant glass-based article. In one or more embodiments, generating the stress profile comprises ion exchanging a plurality of alkali ions into the glass-based substrate to form a non-zero alkali metal oxide concentration that varies along a substantial portion of the thickness (as described herein) or along the entire thickness. In one example, generating the stress profile includes immersing the glass-based substrate in a molten salt bath including nitrates of Na+, K+, Rb+, Cs+ or a combination thereof, having a temperature of about 350° C. or greater (e.g., about 350° C. to about 500° C.). In one example, the molten bath may include $NaNO_3$, $KNO_3$ or a combination thereof, and may have a temperature of about 485° C. or less. In another example, the bath may include a mixture of $NaNO_3$ and $KNO_3$ and have a temperature of about 460° C. The glass-based substrate may be immersed in the bath for about 2 hours or more, up to about 48 hours (e.g., from about 2 hours to about 10 hours, from about 2 hours to about 8 hours, from about 2 hours to about 6 hours, from about 3 hours to about 10 hours, or from about 3.5 hours to about 10 hours).

In some embodiments, the method may include chemically strengthening or ion exchanging the glass-based substrate in a single bath or in more than one step using successive immersion steps in more than one bath. For example, two or more baths may be used successively. The composition of the one or more baths may include a single metal (e.g., Ag+, Na+, K+, Rb+, or Cs+) or a combination of metals in the same bath. When more than one bath is utilized, the baths may have the same or different composition and/or temperature as one another. The immersion times in each such bath may be the same or may vary to provide the desired stress profile.

In one or more embodiments of the method, a second bath or subsequent baths may be utilized to generate a greater surface CS. In some instances, the method includes immersing the glass-based substrate in the second or subsequent baths to generate a greater surface CS, without significantly influencing the chemical depth of layer and/or the DOC. In such embodiments, the second or subsequent bath may include a single metal (e.g., $KNO_3$ or $NaNO_3$) or a mixture of metals ($KNO_3$ and $NaNO_3$). The temperature of the second or subsequent bath may be tailored to generate the greater surface CS. In some embodiments, the immersion time of the glass-based substrate in the second or subsequent bath may also be tailored to generate a greater surface CS without influencing the chemical depth of layer and/or the DOC. For example, the immersion time in the second or subsequent baths may be less than 10 hours (e.g., about 8 hours or less, about 5 hours or less, about 4 hours or less, about 2 hours or less, about 1 hour or less, about 30 minutes or less, about 15 minutes or less, or about 10 minutes or less).

In one or more alternative embodiments, the method may include one or more heat treatment steps which may be used in combination with the ion-exchanging processes described herein. The heat treatment includes heat treating the glass-based article to obtain a desired stress profile. In some embodiments, heat treating includes annealing, tempering or heating the glass-based substrate to a temperature in the range from about 300° C. to about 600° C. The heat treatment may last for 1 minute up to about 18 hours. In some embodiments, the heat treatment may be used after one or more ion-exchanging processes, or between ion-exchanging processes.

Another aspect of the disclosure pertains to a glass-based article comprising
  a first surface and a second surface opposing the first surface defining a thickness (t) in a range of 0.1 mm and 2 mm; and
  a stress profile extending along the thickness (t),
  wherein at least one point of the stress profile in a first thickness range from about 0·t up to 0.020·t and greater than 0.98·t comprise a tangent having a slope of from about −200 MPa/micrometer to about −25 MPa/micrometer or about 200 MPa/micrometer to about 25 MPa/micrometer,
  wherein all points of the stress profile in a second thickness range from about 0.035·t and less than 0.965·t comprise a tangent with a slope of from about −15 MPa/micrometer to about 15 MPa/micrometer,
  wherein the stress profile comprises a surface CS of from about 200 MPa to about 1100 MPa, and
  wherein the stress profile comprises a DOC ranging from about 0.1·t to 0.25·t. In some embodiments, all points of the stress profile in a first thickness range from about 0·t up to 0.020·t and greater than 0.98·t comprise a tangent with a slope of from about −200 MPa/micrometer to about −25 MPa/micrometer or about 200 MPa/micrometer to about 25 MPa/micrometer. In some embodiments, the noted slopes for the second thickness range may be in a range from about 0.1·t to 0.9·t, or from 0.15·t to 0.85·t, or from 0.2·t to 0.8·t, or from 0.22·t to 0.78·t, or from 0.24·t to 0.76·t, or from 0.26·t to 0.74·t, or from 0.28·t to 0.72·t, or from 0.3·t to 0.7·t, or from 0.35·t to 0.65·t, or from 0.4·t to 0.6·t, or from 0.45·t to 0.55·t.

One or more embodiments of the glass-based articles described herein comprise a certain stress profile that can impart enhanced scratch performance to the glass surface. Additionally, drop performances (e.g. on both 180 grit sand paper and 30 grit sand paper simultaneously) are not degraded and are kept at reasonable levels of performance for field use. Such experimental rough surfaces introduce a range of flaws in the glass that is significant and relevant to field performance. Thus, these stress profiles show improved resistance to scratching and good resistance to fracture in drop testing are the focus of the present disclosure. These stress profiles are also non-frangible.

According to one or more embodiments, stress profiles for multiple-ion diffusion are disclosed in that impart a surprising improvement in scratch performance. Some stress profiles may be obtained in a single ion exchange step, others are obtained using two or more ion exchange steps. In one or more embodiments, the stress profiles exhibit two regions—a spike region of higher slope followed by a deep tail of substantially smaller slope leading to a very large depth of compression that is defined as the point where the stress changes from compressive to tensile inside the glass.

In embodiments pertaining to thin glasses (i.e., thickness ranging from 0.05 mm to 2 mm), diffusion processes are long enough in duration that a nontrivial fraction of the Na ions exchanged into the glass from the ion exchange bath may reach the center of the glass such that the deep profiles in the two halves of the thickness connect in the middle without a central region of substantially constant Na concentration equal to the original Na concentration in the non-ion-exchanged substrate. In one or more embodiments, duration of the ion exchange is greater than 1 hour, greater than 1.5 hours, greater than 2 hours, greater than 2.5 hours, greater than 3 hours, greater than 3.5 hours, greater than 4 hours, greater than 4.5 hours, greater than 5 hours, greater than 5.5 hours, greater than 6 hours, greater than 6.5 hours, greater than 7 hours, greater than 7.5 hours and greater than 8 hours.

In one or more embodiments, the stress profile provides an article that is non-frangible. As used herein, "non-frangible" means that when the glass breaks, the glass breaks in a few relatively large fragments. In contrast, frangible glass breaks into very small fragments, and with the possibility of ejection of glass particles at large distances due to the high elastic energy stored in the glass article.

The glass-based article of one or more embodiments includes a first surface and a second surface opposing the first surface, defining a thickness t. In one or more embodiments, the thickness t may be about 2 millimeters or less (e.g., in the range from about 0.01 millimeter to about 2 millimeters, from about 0.1 millimeter to about 2 millimeters, from about 0.2 millimeter to about 2 millimeters, from about 0.3 millimeter to about 2 millimeters, from about 0.4 millimeter to about 2 millimeters, from about 0.01 millimeter to about 1.75 millimeters, from about 0.01 millimeter to about 1.5 millimeters, from about 0.01 millimeter to about 1 millimeter, from about 0.01 millimeter to about 0.9 millimeter, from about 0.01 millimeter to about 0.8 millimeter, from about 0.01 millimeter to about 0.7 millimeter, from about 0.01 millimeter to about 0.6 millimeter, from about 0.01 millimeter to about 0.5 millimeter, from about 0.1 millimeter to about 0.5 millimeter, or from about 0.3 millimeter to about 0.5 millimeter.)

The stress profile of one or more embodiments feature the presence of two distinct regions having tangents with a slopes within certain ranges—one with a relatively steep slope and one with a shallow slope. Generally, the stress profile can be achieved two different ways. The first method features a single ion exchange diffusion, wherein two or more ions are diffused simultaneously. The second method features a two or more ion exchange diffusions where two or more ions are diffused simultaneously. Each method has particular advantages. For example, a single ion exchange diffusion step may be simpler and easier to implement and/or control. However, multiple ion exchange diffusion steps may allow for more freedom to tailor the stress profile. In one or more embodiments, duration of the ion exchange is greater than 1 hour, greater than 1.5 hours, greater than 2 hours, greater than 2.5 hours, greater than 3 hours, greater than 3.5 hours, greater than 4 hours, greater than 4.5 hours, greater than 5 hours, greater than 5.5 hours, greater than 6 hours, greater than 6.5 hours, greater than 7 hours, greater than 7.5 hours and greater than 8 hours.

It is thought that the stress profiles described herein which contain the two regions in one step is that the larger K ions diffuse slower. In contrast, it is thought that the smaller Na ions diffuses faster and penetrates more deeply. It is also thought that the larger K ions produce higher stress due to larger specific volume change, hence a shallower spike in CS.

In general, stress profiles having a large DOC and a high CS spike help reduce failures from front-side damage introduction while also keeping the rate of overstress failures acceptable. These profiles can achieve improved results in Li-containing glasses, which offer the ability to achieve a large depth of compression quickly via fast ion-exchange counter-diffusion of Na and Li ions. At the same time they also may achieve a high-compression (spike) surface layer by diffusing potassium (K) to a small depth on the order of 5-15 microns. With a single ion-exchange, there is a trade-off between on the one hand the compressive stress CS at the surface together with moderate to high depth-of-layer of the spike ($DOL_{sp}$), and the knee stress $CS_k$ occurring at the bottom of the high-compression surface layer, which is the depth at which the slope of the stress changes drastically.

A challenge with Li-containing glasses that have substantial amounts of both Li and Na in the non-strengthened substrate is that single-ion-exchange (SIOX, i.e., an ion-exchange that takes place in one bath or step, as opposed to "DIOX" which refers to double ion exchange, i.e., ion exchange performed on the same substrate or glass-based article in two baths or steps) profiles that have relatively high $CS_k$ tend to have limited depth of compression (DOC) due to high positive curvature of the deep portion of the profile resulting from strongly nonlinear diffusion.

The present disclosure offers the ability to break the trade-off between CS and $CS_k$ and achieve combinations that offer high CS and relatively high $CS_k$ at the same time, while still achieving relatively high $DOL_{sp}$. In addition, the invention provides for a substantial increase in DOC by allowing substantial reduction of the positive curvature of the deep portion of the profile, and in some cases even introducing negative curvature in a portion of the compression region.

In some embodiments a two-step process of ion exchange is used, where both steps have a mixture of $Na^+$-ion and $K^+$-ion containing salts, such as $NaNO_3$ and $KNO_3$. The first-step salt mixture may have a higher Na content than the second-step salt mixture. For example, the first-step mixture may have 38-90% $NaNO_3$ by weight when the salt mixture is $NaNO_3+KNO_3$. The first-step salt mixture may produce a $K_2O$-spike near the surface with moderate surface concentration (for example, <5 mol %), allowing development of a substantial $CS_k$ despite the presence of the K-spike. The first step may also develop substantial center tension CT, typically higher than 60 MPa.

The second step may be performed in a salt mixture where Na-containing salt is substantially less (for example, 3-15 wt % $NaNO_3$). In addition, the second step may be substantially shorter than the first step (in some embodiments 3 or more times shorter), or performed at a substantially lower temperature.

The process takes advantage of nonlinear diffusion of K when the base glass has very low level of $K_2O$, lower than about 8% of the molar content of total alkali oxides in the glass. The second-step spike is thus characterized by a substantially higher effective diffusion coefficient for K+ ions compared to the first step, allowing the full DOL of the high-CS spike to be maintained with a short second step, without significant sacrifice of $CS_K$. The small amount of Na in the second-step salt mixture serves the purpose of preventing Na from out-diffusing during the spike, and thus to obtain a relatively stable process where $CS_k$ does not vary too much with relatively small variations of ion exchange temperature or time.

The resulting profile has high CS, similar to the CS obtained by using the second mixture alone. In addition, it has $CS_k$ that is substantially higher than $CS_k$ typical of the second-step salt alone (by more than 10 MPa), but also substantially lower than $CS_K$ of the first step (by more than 10 MPa). The relatively high CT is maintained, or sometime slightly increased after the short second step. This CT is substantially higher than the maximum CT that can be obtained by using only the salt composition of the second step. Finally, the stress profile may have a DOC that is often on the order of 0.2·t (20% of the substrate thickness), and is greater than the maximum depth that is possible in either the first salt mixture or the second salt mixture when used alone.

During service, the same cover-glass component experiences a variety of service stresses (meaning wear-and-tear effects) on the front (outer) side, the back (inner) side, and the edge. The most common causes of failure (fracture) include fractures from introduction of a deep flaw (>10 μm) whose tip depth may sometimes even exceed the depth of compression (DOC) available from the chemical strengthening, and from overstress (OS) of a relatively shallow flaw (1-10 um) subjected to high local tension of several hundred MPa. Quite often a fracture may be initiated when a deep flaw having a tip depth somewhat smaller than the DOC is exposed to moderate tension by minor bending of the cover-glass component during service. Hence, a large DOC and the value of compressive stress at relatively large depths inside the deep compressive layer are among beneficial parameters of chemical strengthening. Such deep flaws may be introduced into the glass during contact with rough surfaces or sharp objects.

A two-step process has an advantage that, if done in an appropriate manner as according to the present disclosure, the deep portion of the profile and the spike are developed essentially independently. The change of the deep portion of the profile during a short and relatively low-temperature "spike" step may be almost negligible (typically less than 1% change in DOL and stress of the deep portion, and a minor change in DOC).

Li-containing glasses offer some useful attributes for obtaining spiked profiles with very large DOC, but also come with some significant challenges. One advantage is the ability to develop very large DOC using a relatively short ion exchange at a temperature much lower than the softening point of the glass. A large DOC is achievable quickly because Na can be exchanged for Li deep into the glass much faster than K can be exchanged for Na to similar depths, owing to the larger diffusivity of the smaller Na and Li, when compared to K and Na, respectively. This advantage creates a challenge at the same time, because the formation of a surface spike of high CS in a Li-containing glass usually requires in-diffusion of K+ ions to the desired depth on the order of 10 μm. The very small diffusivity of K in a Li-based glass, relative to that of Na, generally means that implementing a surface compression spike in a nominally pure KNO3 bath using a second step following a first step of pure NaNO3 ion exchange or exchange in a NaNO3-LiNO3 mixture, would greatly deteriorate the level of compression at depths exceeding the $DOL_{sp}$ (e.g., from the spike depth, $DOL_{sp}$, to the DOC), because the gradient of Na ions obtained after the first ion-exchange step would significantly decrease during the spike-formation (second ion-exchange) step.

Furthermore, some Li-containing glasses of commercial interest contain significant and comparable amounts of both Li2O and Na2O in the base glass. In an example, one commercially available glass from Corning Incorporated (Corning, NY) contains about 6 mol % Li2O and 11 mol % Na2O. Similarly, another commercially available glass from Corning Incorporated (Corning, NY) contains about 6 mol % Li2O and about 9 mol % Na2O. When a glass with such composition having significant amounts of both Li2O and Na2O is ion exchanged in a bath designed to substantially enrich the glass with Na at the expense of Li, the resulting Na concentration profiles tend to poses very significant positive curvature as a result of substantially nonlinear diffusion. As a result, the deep portion of the stress profile at depths greater than the spike depth also has a substantial positive curvature when the knee stress $CS_k$ is significant, such as exceeding 120 MPa. For example, see curves 2801 (Comparative Example 7B) and 2802 (Comparative Example 7C) in FIG. 28, discussed in further detail below. Such profiles tend to provide a significant level of compressive stress at relatively small and intermediate depths, but relatively lower compressive stress at large depths approaching the depth of compression. See FIG. 28 wherein curves 2801 and 2802 drop below curve 2804 (Example 7A). In addition, they also tend to have a smaller depth of compression relative to curves that has a similar $CS_k$ but no curvature (or with portions of negative curvature) of the compressive stress in the region between the spike depth $DOL_{sp}$ and the DOC. In particular, in profiles with substantial positive curvature, most often compressive stress is significant from the surface to about ⅓ of the DOC, but is not as high in the region from ⅓ or ½ of the DOC to DOC. See, for example, FIG. 28, wherein curve 2801 has about the same CS as curve 2804 at 50 microns (⅓ the DOC of about 150 microns), but has a CS that drops below that of curve 2804 by 100 microns (about ⅔ of the DOC). Similarly, again in FIG. 28, curve 2802 has a CS that is already below that of curve 2804 by 50 microns (about ⅓ DOC) and remains below that of curve 2802 at 75 microns (about ½ DOC) and 100 microns (about ⅔ DOC). In addition, such profiles (as curves 2801 and 2802) tend to have somewhat smaller DOC than profiles with similar spike and similar knee stress that have less curvature in the deep portion of the compression region, e.g., profiles that could be obtained in a glass that has a lot of Li2O but little or no Na2O in the non-strengthened composition.

In chemically strengthened Li-containing cover glasses, one benefit of the chemical strengthening is achieved when the DOC is in a stable regime. The DOC is stabilized on the order of 20% of the thickness (DOC is about 0.2t), and profiles with higher positive curvature usually have somewhat smaller values, while profiles with lower positive curvature, or even with a portion having negative curvature, tend to have somewhat higher values of DOC. In this stable-DOC regime, during service in the field the cover glass could be subjected to formation of deep flaws by sharp objects such as sand particles or small rocks. The strength-limiting flaws are most often the deepest flaws, and having more compressive stress at large depths such as the range 0.3DOC-DOC may be beneficial for reducing the probability of fracture as a result of sharp-contact events. This becomes particularly important for smaller thicknesses such as equal to or less than 1 mm, for example equal to or less than 0.8 mm, or equal to or less than 0.6 mm, because the DOC is reduced in proportion to the thickness and the tips of the flaws that need to be arrested by compressive stress reach an increasingly larger portion of the DOC.

The present disclosure sets forth a particular double-ion-exchanged process that allows simultaneously achievement of a significant spike DOL, significant spike CS, deep DOC, significant $CS_k$, and significant compressive stress at large depths 0.3DOC-DOC (in some embodiments as a result of reduced positive curvature of the deep portion of the compressive-stress profile).

Some embodiments may include improvement of scratch resistance, as a result of the benefit of simultaneous achievement of a good depth of the spike and high CS while achieving the desired level of $CS_k$ for good fracture resistance.

In some embodiments, stress profiles obtained by two-step (or more) ion exchange of a Lithium containing glass have substantial benefits compared to profiles that can be obtained in the same glass by either a single-step ion exchange in a mixed bath of Na and K-containing salt, or in prior two-step ion exchanges.

A stress profile obtained using DIOX with a relatively long step in 100% $NaNO_3$ followed by a shorter second step in a mixture of $NaNO_3$ and $KNO_3$ provides mostly a tradeoff between higher $CS_k$ and reduced $DOL_{sp}$, when compared with a SIOX process using the same salt mixture as the second step of the DIOX. A better a DIOX profile is obtained when both the first step and the second step of ion exchange are performed in mixtures of $KNO_3$ and $NaNO_3$, but, unlike a DIOX (having step 1 with 65% Na; step 2 40% Na), the second-step bath has a molar ratio of Na:K that is substantially smaller (for example, 3-10 times smaller) than the Na:K molar ratio of the first-step bath.

A stress profile in a Li-containing glass, according to some embodiments, is obtained by a two-step ion-exchange wherein both steps of ion exchange are completed in a bath including both a Na-containing salt and a K-containing salt, wherein the ratio of Na ions to K ions in the first bath is 2.5 or more times higher than the ratio of Na ions to K ions in the second bath, for example 3 or more times higher, or 5 or 8 or more times higher, but 800 or less times higher, for example 600, 500, or 400, or less, times higher, depending on the Na:Li ratio in the glass composition. Furthermore, in some embodiments, the second salt has a ratio of Na to K that is 0.03 or more, for example 0.04 or more, or 0.047 or more, and in some cases 0.06 or 0.07 or more, and that is less than or equal to 0.4, or 0.35, or 0.30, or 0.21, 0.16, or 0.13, depending on the glass composition. Generally, compositions having substantially more Na in the glass than Li would tolerate higher ratios of Na:K in the bath, for example 0.21 and 0.16 in the second bath.

In some embodiments, the effective diffusion time of the second step is from ½₀ to ½ of the diffusion time of the first step, for example from ½₀ to ⅓, or from ½₀ to ¼.

Some features of the DIOX process described herein are as follows.

In some embodiments, high surface CS, very similar to the high surface CS that would have been obtained with the low-Na composition of the second step, and substantially higher than the surface CS that is normally produced with the high-Na first-step bath. For example, see curve 2801 having a high surface CS produced by the 70Na/30K bath of Comparative Example 7B, and compare with Example 7A, curve 2804. The surface CS of the DIOX profile can be 600 MPa or more, for example 650 MPa or more, 700 MPa or more, 750 MPa or more, 800 MPa or more, or 850 MPa or more.

In some embodiments, the $DOL_{sp}$ is comparable to the $DOL_{sp}$ of the first step, and significantly larger than $DOL_{sp}$ that would have been obtained with the second step alone (often twice as large, even more). This means that $DOL_{sp}$ is relatively large, when compared to a $DOL_{sp}$ that would be obtained if only the second step had $KNO_3$ in the salt bath and provided K ions for spike formation through ion exchange. In some embodiments, $DOL_{sp}$ attained with the DIOX process disclosed herein is: in the range of from 5 to 16 microns, and represents from 0.5 to 1.5% of the thickness when the thickness is from 1 to 1.3 mm; in the range of from 0.6 to 2% of thickness when the thickness is from 0.8 to 1 mm; in the range of 0.7 to 2.5% when the thickness is from 0.65 to 0.8 mm; in the range of 0.9 to 3% when the thickness is from 0.5 to 0.65 mm; and in the range of 1 to 3% when the thickness is from 0.3 to 0.5 mm.

In some embodiments, relatively high $CS_k$, substantially higher than $CS_k$ that would be typical of the composition of the second-step bath alone, and lower than the first-step $CS_k$. For example, in Example 7A, the first-step $CS_k$ is about 160 MPa, the DIOX $CS_k$ is 125 MPa, whereas a bath having the composition of the second step, 7% $NaNO_3$+93% $KNO_3$ by weight would produce $CS_k$ below 75 MPa when stable DOC is reached.

In some embodiments, there is attained a high DOC, higher than the DOC that would be obtained by a single-step ion exchange in the first-step salt. For example, for a 0.8 mm sample the DIOX DOC of Example 7A is about 160 um, or 20% of the thickness.

In some embodiments, there is attained minimization or even elimination of positive curvature in the compressive-stress profile in the depth range from about 1.5 DOLs, to DOC. In particular, the curvature in that depth range preferably does not exceed the curvature of a force-balanced parabolic profile centered in the middle of the substrate and having the same $CS_k$ as the inventive DIOX profile. Note that for the purposes of this comparison, a sign convention is assumed where compressive stress is positive, tensile stress is negative. Also it should be noted that while for the purposes of quality control a simplified representation of the profile as a spiked power-law profile may be assumed. The deep portion of a spiked parabolic profile is fitted with a parabola having a power coefficient of 2. In some embodiments, the power coefficient may range from 1 to 3, or from 1.7 to 2.6 for the shape of the deep region of the profile, or the CT region. The inventive DIOX profile demonstrates curvature in the region between $DOL_{sp}$ and the DOC that over the same depth range does not exceed the curvature of a parabolic profile having the same stress at depth=$DOL_{sp}$.

In some embodiments, there can be attained a relatively high compression in the depth range from DOC/3 to DOC. In particular, the DIOX profile has similar or higher compression than the first-step profile in this depth range. For example, compare curve 2804 in FIG. 28 with curves 2802 and 2803 in the range of from about 50 to 150 microns, showing a higher CS in this range. This higher CS is a result of the combined effect of force balance and the reduction or elimination of positive curvature of the profile in the depth range between about $1.5DOL_{sp}$ and DOC.

In some embodiments, there can be attained a relatively high CT, usually within +/−3 MPa of the first-step CT, and usually 5-15 MPa higher than CT that would be obtained with just the step 2 salt composition for an equivalent total ion-exchange time. In Example 7, shown in FIG. 28, the DIOX profile (curve 2804) has a CT of about 70 MPa, approximately the same as the CT of the 1 step, curve 2801 profile (70% Na, 4 hours, 380 C), while an ion exchange in the second-step bath (7% Na) for a comparable time as the DIOX total time of 4 hr+40 min would result in a CT in the range 50-55 MPa. The high CT of the DIOX profile indicates a high stress-depth integral in the compression zone, which helps provide resistance of the glass article to fracture initiated by a flaw introduced in the compression zone.

In some embodiments, there is attained better scratch resistance compared to other fracture-resistant profiles with similar deep portion and similarly high $CS_k$, but substantially lower surface CS or lower $DOL_{Sp}$. For example, compare the curve 2802 SIOX profile of FIG. 28 prepared in the bath having 40% $NaNO_3$ and 60% $KNO_3$ having a similar $CS_k$ at 125 MPa, similar DOC, and $DOL_{sp}$ as the DIOX profile curve 2804, but the surface CS of curve 2802 is lower by about 250 MPa (550-570 MPa vs. 800-820 MPa for the curve 2804 DIOX profile).

In some embodiments, the DIOX profile and method of making it provide superb strengthening of the peripheral area of the glass article, particularly when the thickness of the glass article decreases gradually toward the edge ("2.5D cover glass"). For traditional ("2D") cover glass, the thickness of the glass article is constant essentially to the very edge of the glass sheet, or to within less than 0.3t of the edge tip when the edge is chamfered, where t is the thickness of the sheet. The profiles according to embodiments described herein do provide superior strengthening of this type of edge when compared to prior-art profiles, as the depth of compression measured from any point around the edge is similar to the large depth of compression in the interior of the sheet. More significantly, for 2.5D cover glass, where the thickness of the sheet gradually declines toward the edge, starting to decline usually 1-3 mm from the edge, or from a distance greater than or equal to 0.3t from the edge, but most often from a distance greater than or equal to 0.5t, or greater than or equal to 1.0t, from the edge, there is a major strengthening of the edge in the sense that a flaw initiated in the periphery of the glass article (e.g., form edge contact) is substantially more likely than usual to be arrested or deflected by the compressive-stress distribution compared to prior-art profiles. This crack arresting effect is a major advantage because when electronic devices are accidentally dropped, they more often experience contact events on the edge, so strengthening the edge is beneficial for significant improvement in resistance to fracture in actual service.

Accordingly, in one or more embodiments at least one point of, and in other embodiments all points of, the stress profile in a first thickness range from about 0·t up to 0.020·t and greater than 0.98·t comprise a tangent with a slope of from about −200 MPa/micrometer to about −25 MPa/micrometer or about 200 MPa/micrometer to about 25 MPa/micrometer. The first thickness range may span from about 0·t up to about 0.020·t, 0.025·t, 0.0275·t, 0.030·t, or 0.035·t, and greater than 0.98·t, 0.975·t, 0.9725·t, 0.97·t, or 0.965·t. The slope may range from about −200 MPa/micrometer to about −25 MPa/micrometer or about 200 MPa/micrometer to about 25 MPa/micrometer. In further embodiments, the slope may range from about −200, −190, −180, −170, −160, −150 or −140 MPa/micrometer to about −25, −27, −30, −31, −32, −33, −34 or −35 MPa/micrometer; or about 25, 27, 30, 31, 32, 33, 34, or 35 to about 140, 150, 160, 170, 180, 190 or 200. Thus, for example, in one or more embodiments at least one point of, and in other embodiments all points of, the stress profile in the first thickness range comprise a tangent with a slope of from about −170 MPa/micrometer to about −30 MPa/micrometer or about 30 MPa/micrometer to about 170 MPa/micrometer. In some embodiments at least one point of, and in other embodiments all points of, the stress profile in the first thickness range comprise a tangent with a slope of from about −140 MPa/micrometer to about −35 MPa/micrometer or about 35 MPa/micrometer to about 140 MPa/micrometer.

The above slope ranges may be combined with any of the first thickness ranges. Thus, for example, in one or more embodiments at least one point of, and in other embodiments all points of, the stress profile in a first thickness range from about 0·t up to 0.025·t and greater than 0.975·t comprise a tangent with a slope of from about −200 MPa/micrometer to about −25 MPa/micrometer or about 25 MPa/micrometer to about 200 MPa/micrometer. In further embodiments at least one point of, and in other embodiments all points of, the stress profile in a first thickness range from about 0·t up to 0.025·t and greater than 0.975·t comprise a tangent with a slope of from about −170 MPa/micrometer to about −30 MPa/micrometer or about 30 MPa/micrometer to about 170 MPa/micrometer. In further embodiments at least one point of, and in other embodiments all points of the stress profile in a first thickness range from about 0·t up to 0.025·t and greater than 0.975·t comprise a tangent with a slope of from about −140 MPa/micrometer to about −35 MPa/micrometer or about 35 MPa/micrometer to about 140 MPa/micrometer.

In some embodiments at least one point of, and in other embodiments all points of the stress profile in a first thickness range from about 0·t up to 0.035·t and greater than 0.965·t comprise a tangent with a slope of from about −200 MPa/micrometer to about −25 MPa/micrometer or about 25 MPa/micrometer to about 200 MPa/micrometer. In further embodiments at least one point of, and in other embodiments all points of the stress profile in a first thickness range from about 0·t up to 0.035·t and greater than 0.965·t comprise a tangent with a slope of from about −170 MPa/micrometer to about −30 MPa/micrometer or about 30 MPa/micrometer to about 170 MPa/micrometer. In yet further embodiments at least one point of, and in other embodiments all points of the stress profile in a first thickness range from about 0·t up to 0.035·t and greater than 0.965·t comprise a tangent with a slope of from about −140 MPa/micrometer to about −35 MPa/micrometer or about 35 MPa/micrometer to about 140 MPa/micrometer. In some embodiments, as the first thickness range becomes shorter, the slopes of tangents at points in the first thickness may become steeper.

In one or more embodiments of this aspect, all points of the stress profile in a second thickness range from about 0.035·t and less than 0.965·t comprise a tangent with a slope of from about −15 MPa/micrometer to about 15 MPa/micrometer. That is, going along the span of 0.035·t and through 0.965·t, the slope begins negative, approaches zero, and then becomes positive, approximating a power-law function. As used herein, "power-law function" refers to a curve in which the stress is exponentially proportional to the depth or thickness. In one or more embodiments, the exponent ranges from about 1.2 to about 3.2. In further embodiments, the exponent ranges from about 1.2 to about 2.8. In some embodiments, the noted slopes for the second thickness range may be in a range from about 0.1·t to 0.9·t, or from 0.15·t to 0.85·t, or from 0.2·t to 0.8·t, or from 0.22·t to 0.78·t, or from 0.24·t to 0.76·t, or from 0.26·t to 0.74·t, or from 0.28·t to 0.72·t, or from 0.3·t to 0.7·t, or from 0.35·t to 0.65·t, or from 0.4·t to 0.6·t, or from 0.45·t to 0.55·t.

The points in the second thickness range can also be described as comprising tangents with slopes. In one or more embodiments, the slopes of the tangents range from about −15, −10, −5, −4, −3, −2 or −1 MPa/micrometer to about 1, 2, 3, 4, 5, 10 or 15 MPa/micrometer. In some embodiments, the noted slopes for the second thickness range may be in a range from about 0.1·t to 0.9·t, or from 0.15·t to 0.85·t, or from 0.2·t to 0.8·t, or from 0.22·t to 0.78·t, or from 0.24·t to 0.76·t, or from 0.26·t to 0.74·t, or from 0.28·t to 0.72·t, or from 0.3·t to 0.7·t, or from 0.35·t to 0.65·t, or from 0.4·t to 0.6·t, or from 0.45·t to 0.55·t.

The above slope ranges may be combined with any of the second thickness ranges. Thus, for example, in one or more embodiments, all points of the stress profile in a second thickness range from about 0.035·t and less than 0.965·t comprise a tangent with a slope of from about −2 MPa/micrometer to about 2 MPa/micrometer. In some embodiments, the all points of the stress profile in the second thickness range from about 0.025·t and less than 0.975·t comprise a tangent with a slope of from about −15 MPa/micrometer to about 15 MPa/micrometer. In further embodiments, the points of the stress profile in the second thickness range from about 0.025·t and less than 0.975·t comprise a tangent with a slope of from about −2 MPa/micrometer to about 2 MPa/micrometer. In one or more embodiments, all points of the stress profile in the second thickness range from about 0.02·t and less than 0.98·t comprise a tangent with a slope of from about −15 MPa/micrometer to about 15 MPa/micrometer, or from about −2 MPa/micrometer to about 2 MPa/micrometer.

In one or more embodiments, the glass-based article comprises a surface CS of from about 200 MPa to about 1100 MPa. In further embodiments, the surface CS is greater than about 300, 350, 400, 450, 500, 550, 600, 610, 620 650, 700, 750, and/or less than about 650, 700, 750 800, 850, 900, 950, 1000 or 1100.

The glass-based articles described in or more embodiments of this aspect comprise a stress profile comprises a DOC ranging from about 0.1·t to 0.25·t, or 0.3·t.

In one or more embodiments, the glass-based article comprises a composition comprising between about 0.5 mol % $P_2O_5$ and 10 mol % $P_2O_5$.

The stress profiles of the glass-based articles of this aspect can be obtained either via a single ion exchange step or using two or more ion exchange steps. In one or more embodiments, the ion exchange step(s) can include or incorporate any of the features described above in previous aspects. In one or more embodiments, the first thickness range is obtained by ion exchange in a potassium-containing salt.

In one or more embodiments pertaining to a single-step ion-exchange process on a Li-containing glass, it is thought that a main control parameter is the bath concentration ratio between Na and K, driving the relative magnitude of the spike CS and the stress in the deep portion of the profile. Secondary parameters with smaller influence on that relative magnitude are the ion exchange time and temperature, both of which may be affected by the requirements for the depth of the spike and the overall stress in the profile. Thus, according to one or more embodiments, methods are provided that include a single ion exchange step including varying the concentration ratio between Na and K for a duration to achieve the stress profiles described herein.

In one or more embodiments pertaining to chemical strengthening having two or more ion exchange steps, it is possible to further tailor the profile shape by using different Na/K ratios and different relative times of these two or more steps. In some embodiments, a range of power coefficients for the tail region of the profile can be achieved by tailoring the $KNO_3/NaNO_3$ ratio and ion exchange time. Experimental profiles provided in the present disclosure can have a power coefficient falling in a range of from 1 to 3, or from 1.7 to 2.6 for the shape of the deep region of the profile. It is thought that profiles with lower power coefficients generally have smaller slopes in the deep region, typically below 1 MPa/micrometer. Thus, according to one or more embodiments, methods are provided that include two or more ion exchange steps including varying the concentration ratio between Na and K for a duration to achieve the stress profiles described herein.

Another aspect of the disclosure pertains to a glass-based article comprising a center plane, wherein the center plane comprises from about 2 to about 20 mol-% $Li_2O$; a first surface and a second surface opposing the first surface defining a thickness (t) in a range of 0.1 mm and 2 mm; and a stress profile extending along the thickness (t), wherein at least one point of the stress profile in a first thickness range from about 0·t up to 0.020·t and greater than 0.98·t comprises a tangent with a slope of from about −200 MPa/micrometer to about −25 MPa/micrometer or about 25 MPa/micrometer to about 200 MPa/micrometer, wherein the stress profile comprises a surface CS of from about 200 MPa to about 1100 MPa, and wherein the stress profile comprises a DOC ranging from about 0.05·t to 0.25·t. Any of the embodiments described above, particularly with respect to the previous aspect may be applied to this aspect. In other embodiments, all points of the stress profile in the first thickness range from about 0·t up to 0.020·t and greater than 0.98·t comprise a tangent with a slope of from about −200 MPa/micrometer to about −25 MPa/micrometer or about 25 MPa/micrometer to about 200 MPa/micrometer.

In one or more embodiments, the first thickness range is obtained by ion exchange in a K-containing salt.

In one or more embodiments, the second thickness range is obtained by ion exchange in a Na- or K-containing salt.

In one or more embodiments, the stress profile is obtained using a single ion-exchange step.

In one or more embodiments, the stress profile is obtained using two or more ion-exchange steps.

In one or more embodiments, the surface CS ranges from about 690 MPa and 950 MPa.

In one or more embodiments, all points of the stress profile in the second thickness range from a power-law profile having a power exponent, wherein the power exponent is between about 1.2 to 3.4. In some embodiments, the power exponent is between about 1.3 and 2.8.

In one or more embodiments, the glass-based article comprises a composition comprising from about 0.5 mol % $P_2O_5$ to about 10 mol % $P_2O_5$.

In one or more embodiments, the center-plane further comprises a composition comprising from about 0.5 mol % to about 20 mol % $Na_2O$. In some embodiments, the center-plane further comprises a composition comprising from about 2 mol % to about 10 mol % $Li_2O$. In some embodiments, the concentration of $Na_2O$ in the center plane of the glass article is between about 5 mol % and 16 mol %. In some embodiments, the concentration of $Na_2O$ in the center plane of the glass article is between about 10 mol % and 15 mol %. In some embodiments, the concentration of $Li_2O$ in the center plane of the glass article is between about 3 mol % and 10 mol %.

The glass-based articles according to one or more embodiments of the disclosure described herein provide an improved level of scratch resistance without penalty to the drop performance, particularly for glass-based articles comprising Li-based. The glass-based articles according to one or more embodiments of the disclosure described herein provide superior drop performance, as demonstrated both in 30 grit and 180 grit sand paper. The glass-based articles according to one or more embodiments of the disclosure described herein provide recipes that are non-frangible and breakage of the glass is quasi-uniform in large parts. The glass-based articles according to one or more embodiments of the disclosure described herein provide for acceptable levels of glass shape distortion for the temperatures and composition used in the ion exchange process. The glass-based articles according to one or more embodiments of the disclosure described herein comprise stress profiles that can be implemented without added complexity in the manufacturing process In one or more embodiments, it has been observed that the concentration profiles in glasses according to the present disclosure differ from complementary error function-based profiles that can be calculated using linear diffusion approximation. Thus, glasses according to one or more embodiments described herein do not exhibit complementary error function-based profiles that can be calculated using linear diffusion approximation.

According to one or more embodiments, mutual diffusivities that can be used to describe Na/Li, K/(Na+Li) counter-diffusion in glasses according to one or more embodiments are dependent on the local concentration of Li, Na, and K. Li-containing glasses that are chemically strengthened have been described in the literature. However, such glasses described in the literature neglect the effects of concentration-dependent diffusivity on the curvature of the stress profile, and such glasses exhibit profiles consistent with a linear diffusion approximation (i.e., erfc-shaped shallow and deep branch of a two segment profile), distinguishing glasses of one or more embodiments of the present disclosure from those in the literature. Another difference between glasses described according to one or more embodiments of the present disclosure and those in the literature is that diffusion of the strengthening ion species (e.g., Na+ or K+ or a combination thereof) in known strengthened substrates do not extend to deeper depths of the substrate or, in some cases, to the center (i.e., in the range from about 0.4t to about 0.6t) of the substrate. Moreover, the literature does not disclose the combination of glass diffusivity, substrate thickness, and ion exchange conditions that result in the stress profiles described herein. In particular, the literatures describes thicker substrates (e.g., substrates having thicknesses exceeding 2.5 mm). These differences, among others, between glasses according to one of more embodiments of the present disclosure and those described in the literature also results in a difference in the overall shape of the profile, more specifically, the power-law approximation according to one or more embodiments.

EXAMPLES

Various embodiments will be further clarified by the following examples. In the Examples, prior to being strengthened, the Examples are referred to as "substrates". After being subjected to strengthening, the Examples are referred to as "articles" or "glass-based articles".

Example 1

Figure 5:
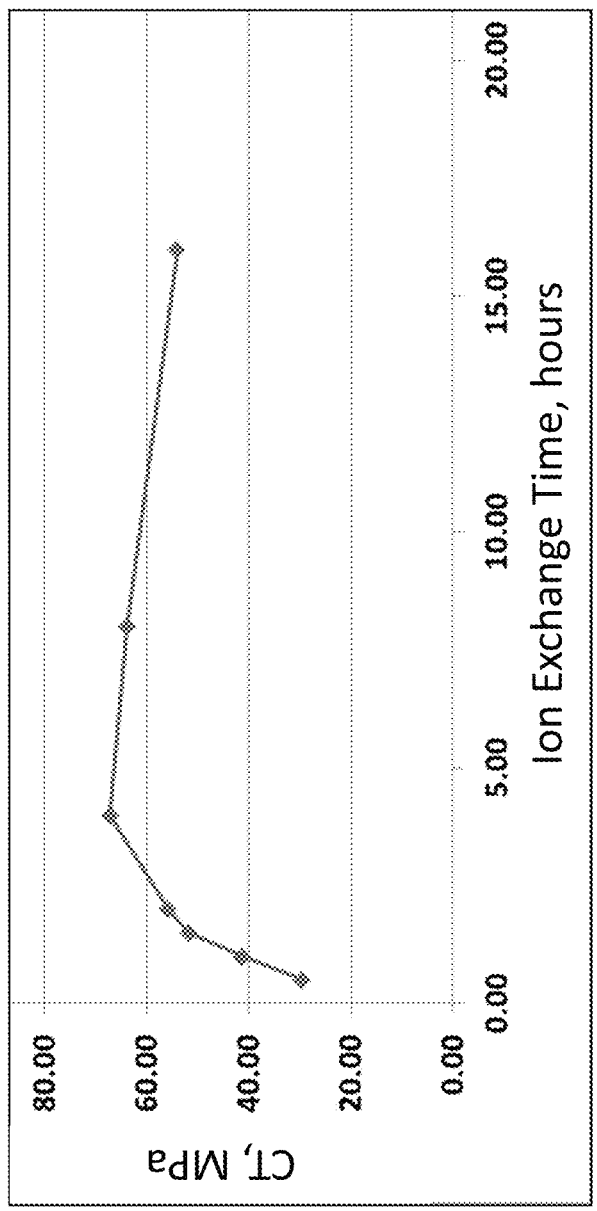
FIG. 5 is a graph showing the maximum CT values for Examples 1A-1G as a function of ion exchange time.

Examples 1A-1G included glass substrates having a nominal composition of about 63.46 mol % $SiO_2$, 15.71 mol % $Al_2O_3$, 6.37 mol % $Li_2O$, 10.69 mol % $Na_2O$, 0.06 mol % MgO, 1.15 mol % ZnO, 2.45 mol % $P_2O_5$, and 0.04 mol % $SnO_2$. The glass substrates have a thickness of 0.8 mm. The glass substrates of Examples 1A-1G were ion exchanged in a molten salt bath including 100% $NaNO_3$ and having a temperature of about 390° C., according to the conditions provided in Table 2. The resulting glass-based articles exhibited maximum CT values, which are plotted as a function of ion exchange time in FIG. 5.

TABLE 2

Ion exchange conditions for Examples 1A-1G.

| Example | Time immersed in bath (hours) | Maximum CT |
| --- | --- | --- |
| 1A | 0.5 | 30 |
| 1B | 1 | 42 |
| 1C | 1.5 | 52 |
| 1D | 2 | 56 |
| 1E | 3.75 | 67 |
| 1F | 8 | 63 |
| 1G | 16 | 55 |

Figure 6:
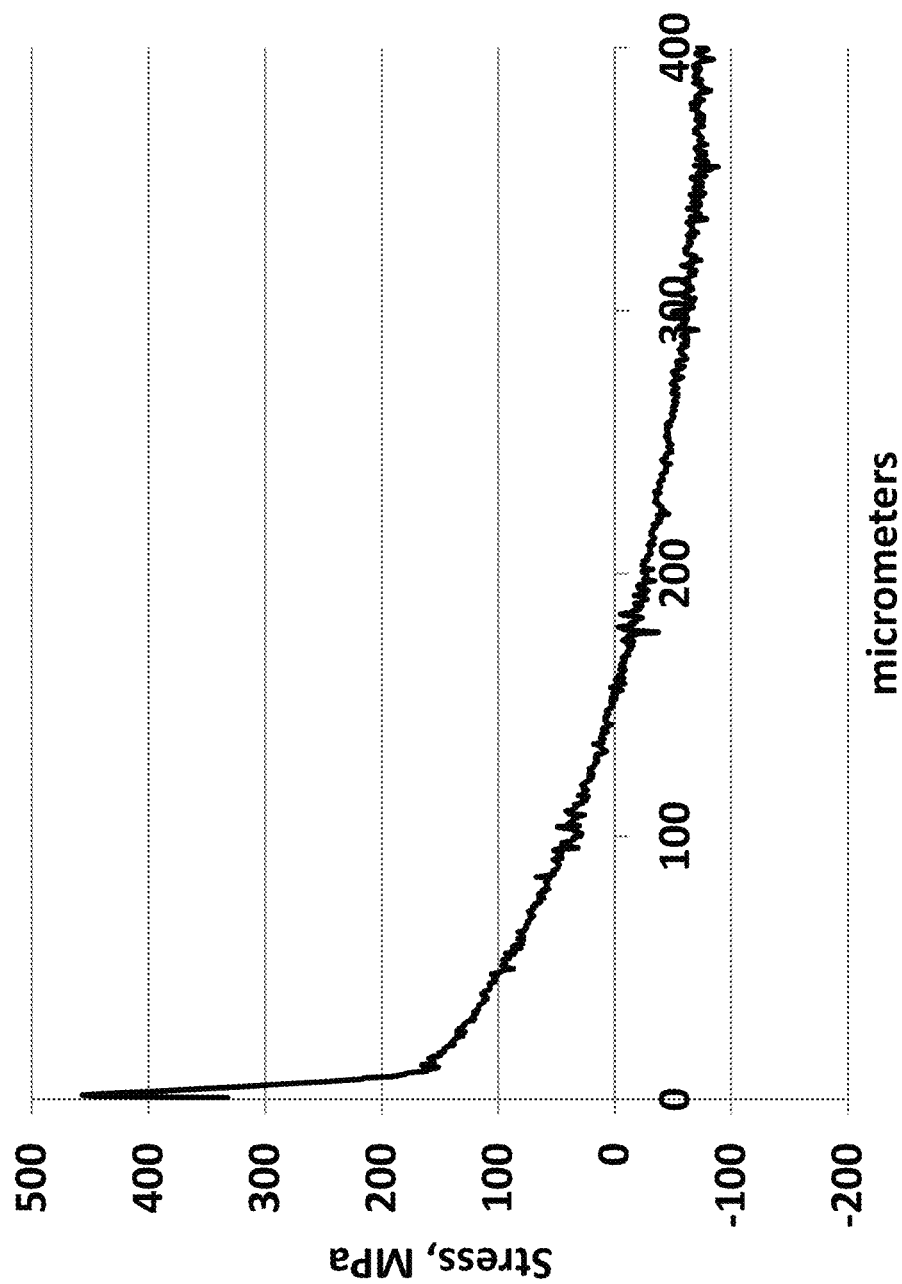
FIG. 6 is a graph showing the measured stress of Example 1E as a function of depth extending from the surface of the glass-based article of Example 1E into the glass-based article.

The stress profile for Example 1E was measure using a refracted near-field (RNF) measurement, as described in U.S. Pat. No. 8,854,623, entitled "Systems and methods for measuring a profile characteristic of a glass sample", which is incorporated herein by reference in its entirety. FIG. 6 shows the measured stress as a function of depth extending from the surface of the glass-based article of Example 1E into the glass-based article. The stress at specific depths is shown in Table 3, including at the knee. In FIG. 6, positive numbers are used for compressive stress, and negative numbers indicate tensile stress. This same convention (compressive stress is indicated as positive values on the y axis, and tensile stress is indicated by negative values on the y axis) is used for FIGS. 1-3, 23, and 27, also. However, in the remainder of the figures, compressive stress is indicated as negative values on the y axis and tensile stress is indicated as positive values on the y axis.

TABLE 3

Stress at specific depths of Example 1E.

| Depth (micrometers) | Stress (MPa) |
| --- | --- |
| 12 ("knee") | 161 |
| 50 | 95 |

TABLE 3-continued

Stress at specific depths of Example 1E.

| Depth (micrometers) | Stress (MPa) |
| --- | --- |
| 100 | 36 |
| 150 | 0 |

Example 2

Example 2A included a glass substrate having the same composition as Example 1 and a thickness of 0.8 mm. The glass substrate was ion exchanged in a single molten salt bath including 51% KNO3 and 49% $NaNO_3$, and having a temperature of about 380° C., for 3.75 hours. The resulting glass-based article exhibited the stress profile as described in Table 4.

TABLE 4

Stress profile of Example 2A.

| | |
| --- | --- |
| Surface Compressive Stress | 500 MPa |
| Depth of layer for potassium | 12 micrometers |
| Stress at DOL of potassium | 161 MPa |
| Maximum CT | 70 MPa |
| DOC | 150 micrometers |

Figure 7:
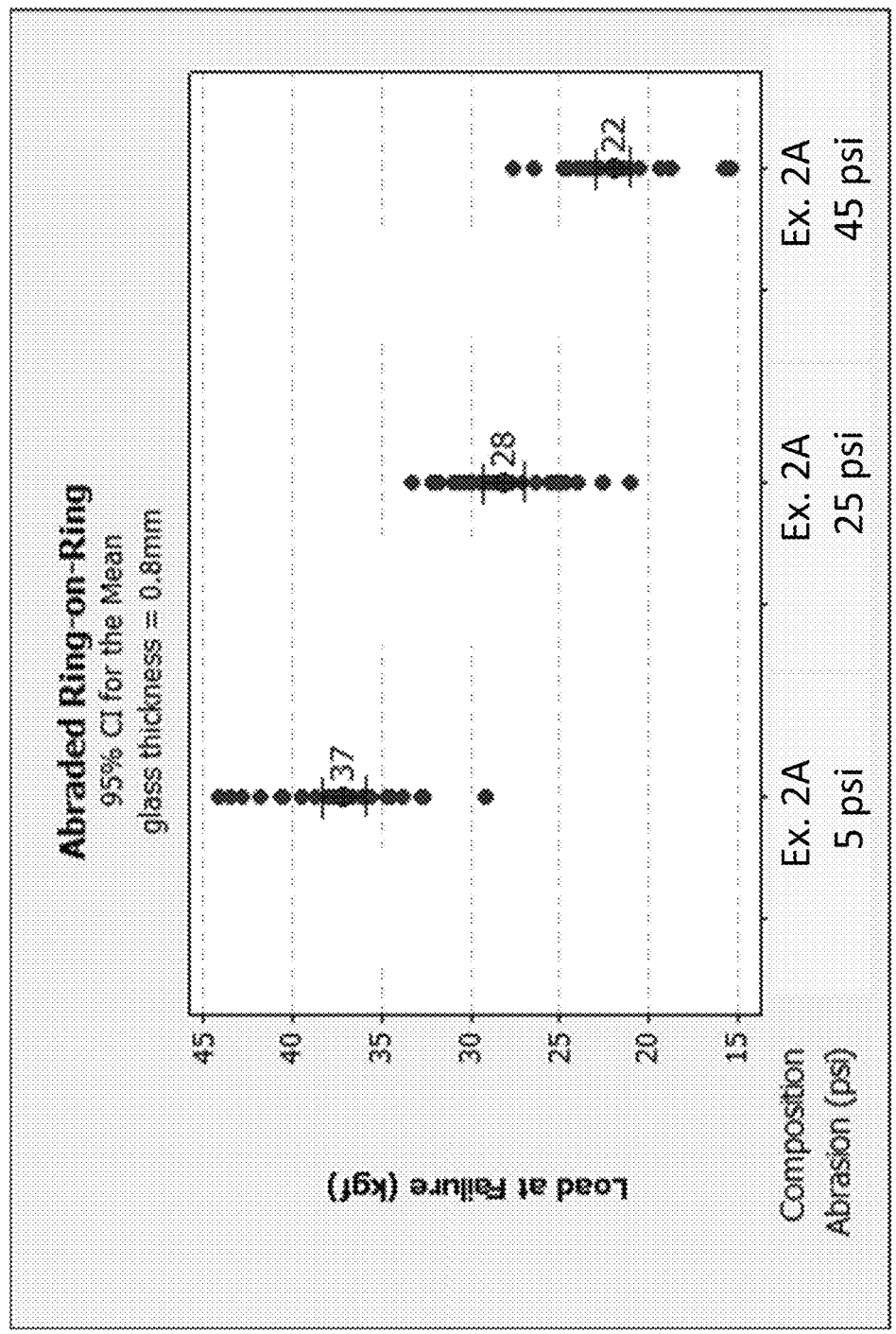
FIG. 7 is a graph showing the load to failure values for glass-based articles according to Example 2A after being abraded at different loads or pressures.

Glass-based articles according to Example 2A were subjected to AROR testing as described herein. One set of glass-based articles was abraded using a load or pressure of 5 psi, a second set of glass-based articles was abraded using a load or pressure of 25 psi, and a third set of glass-based articles was abraded using a load or pressure of 45 psi. The AROR data is shown in FIG. 7. As shown in FIG. 7, all of the glass-based articles according to Example 2A exhibited an average load to failure of greater than about 20 kgf.

Figure 8:
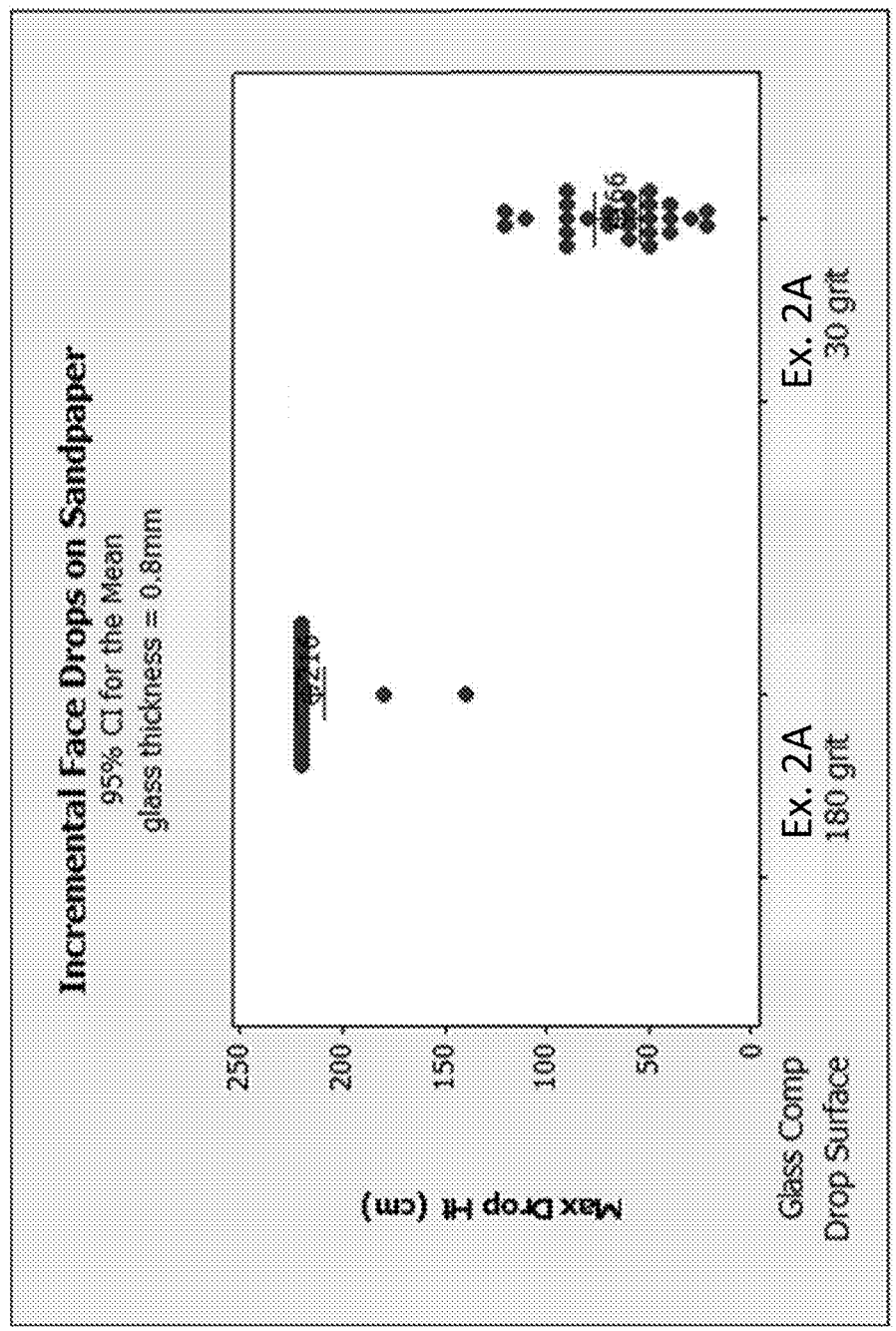
FIG. 8 is a graph showing the heights at which the glass-based articles according to Example 2A failed after being dropped onto 180 grit sandpaper and then onto 30 grit sandpaper.

Glass-based articles according to Example 2A were retrofitted onto identical mobile phone devices. The phone devices were dropped from incremental heights starting at 20 centimeters onto 180 grit sandpaper. If a glass-based article survived the drop from one height (e.g., 20 cm), the mobile phone was dropped again from a greater height (e.g., 30 cm, 40 cm, 50 cm, etc.) up to a height of 225 cm. The surviving glass-based articles were then dropped onto 30 grit sandpaper (in the same phone devices). The height at which the glass-based article failed on both 180 grit sandpaper and 30 grit sandpaper is plotted in FIG. 8. As shown in FIG. 8, all but two glass-based articles of Example 2A survived being dropped onto 180 grit sandpaper up to heights of about 225 cm (providing an average survival drop height of about 216 cm). The average survival drop height onto 30 grit sandpaper was 66 cm, with some surviving over 100 cm drop heights.

The glass based articles according to Example 2A exhibited a dielectric constant of about 6.9 to about 7.05 over a frequency range from about 480 mHz to about 3000 mHz. The glass-based articles according to Example 2A exhibited a dielectric loss tangent in the range from about 0.012 to about 0.015 over a frequency range from about 480 mHz to about 3000 mHz.

The refractive index of the glass-based articles according to Example 2A is in the range from about 1.158 to about 1.49 over a range from about 380 nm to about 1550 nm, and from about 1.518 to about 1.497 over a wavelength range from about 380 nm to about 800 nm.

The glass-based articles according to Example 2A were subjected to various chemical treatments as shown in Table 5. The chemical durability of the glass-based articles was compared to Comparative Examples 2E, 2F and 2G. Comparative Example 2E was a glass substrate having a nominal composition of 64.3 mol % $SiO_2$, 7.02 mol % $B_2O_3$, 14 mol % $Al_2O_3$, 14 mol % $Na_2O$, 0.5 mol % $K_2O$, 0.03 mol % $Fe_2O_3$, and 0.1 mol % $SnO_2$. Comparative Example 2F was a glass substrate having a nominal composition of 64.75 mol % $SiO_2$, 5 mol % $B_2O_3$, 14 mol % $Al_2O_3$, 13.75 mol % $Na_2O$, 2.4 mol % MgO, and 0.08 mol % $SnO_2$. Comparative Example 2G included a glass substrate having a nominal composition of 57.5 mol % $SiO_2$, 16.5 mol % $Al_2O_3$, 16.71 mol % $Na_2O$, 2.8 mol % MgO and 0.05 mol % $SnO_2$.

TABLE 5

Chemical durability of Example 2A.

| Chemical Treatment | Weight loss (mg/cm2) | | | |
| --- | --- | --- | --- | --- |
| | Comparative Example 2E | Comparative Example 2F | Comparative Example 2G | Example 2A |
| 5% w/w HCl, 95° C., 24 hours | 29.3 | 6.7 | 50 | 5.77 |
| 5% w/w NaOH, 95° C., 6 hours | 2.8 | 2.4 | 5.8 | 2.68 |
| 10% HF, room temperature, 20 minutes | 20.8 | 18.1 | 37.4 | 24.03 |
| 10% ammonium bifluoride (ABF), room temperature, 20 minutes | 2 | 2.7 | 3.2 | 0.98 |

Example 3

Example 3A included glass substrates having the same composition as Example 1 and a thickness of 0.8 mm. Comparative Example 3B included glass substrates having the same composition as Comparative Example 2G and a thickness of 0.8 mm. The glass substrates of Example 3A were chemically strengthened in a single step using a single bath, as described in Table 6. The glass substrates of Comparative Example 3B was ion exchanged in a two-step process, as described in Table 6.

TABLE 6

Ion exchange conditions for Example 3A and Comparative Example 3B.

| | | Example 3A | Comparative Example 3B |
| --- | --- | --- | --- |
| 1$^{st}$ Step | Molten salt bath composition | 49% NaNO3/ 51% KNO3 | 49% NaNO3/ 51% KNO3 |
| | Bath Temperature | 380° C. | 460° C. |
| | Immersion time | 3.75 hours | 14 hours |
| 2$^{nd}$ Step | Molten salt bath composition | — | 99.5% KNO3/ 0.5% NaNO3 |
| | Bath Temperature | — | 390° C. |
| | Immersion time | — | 0.25 hours |

TABLE 6-continued

Ion exchange conditions for Example 3A and Comparative Example 3B.

| | | Example 3A | Comparative Example 3B |
| --- | --- | --- | --- |
| Properties of resulting glass article | Surface CS | 500 MPa | 825 MPa |
| | DOL of potassium | 12 micrometers | 10 micrometers |
| | Stress at DOL of potassium | 160 MPa | 220 MPa |
| | DOC | 150 micrometers | 100 micrometers |

Figure 9:
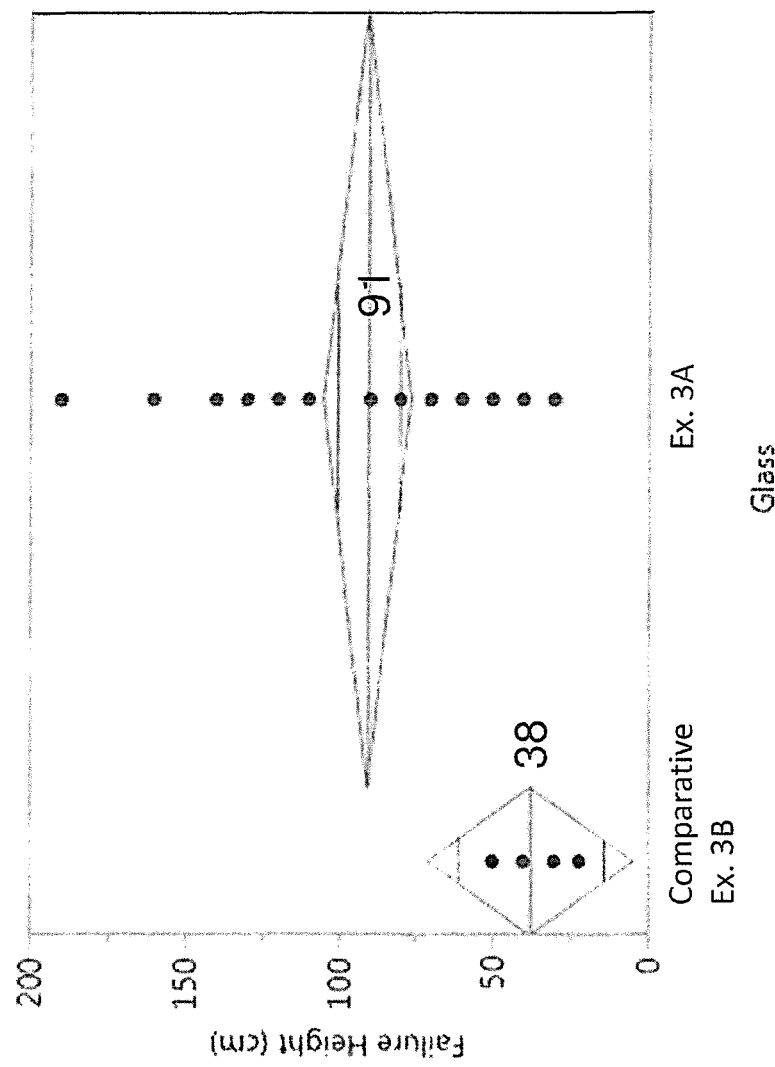
FIG. 9 is a graph showing the heights at which the glass-based articles according to Example 3A and Comparative Example 3B failed after being dropped onto 30 grit sandpaper.

The glass-based articles according to Example 3A and Comparative Example 3B were retrofitted onto identical mobile phone devices. The phone devices were dropped from incremental heights starting at 20 centimeters onto 30 grit sandpaper. The height at which the glass-based article failed on 30 grit sandpaper is plotted in FIG. 9. As shown in FIG. 9, the glass-based articles of Example 3A exhibited an average survival drop height that is more than two times (i.e., 91 cm) the average survival drop height of Comparative Example 3B (i.e., 38 cm).

Figure 10:
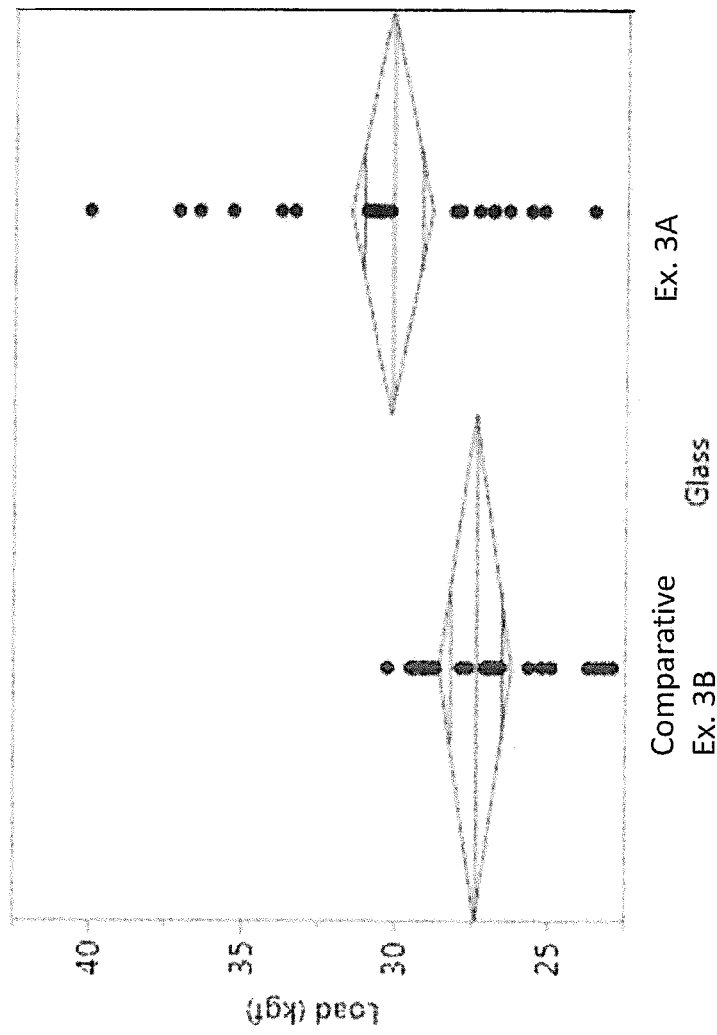
FIG. 10 is a graph comparing the average load to failure of glass-based articles according to Example 3A and Comparative Example 3B, after being abraded at a load or pressure of 25 psi.
Figure 11:
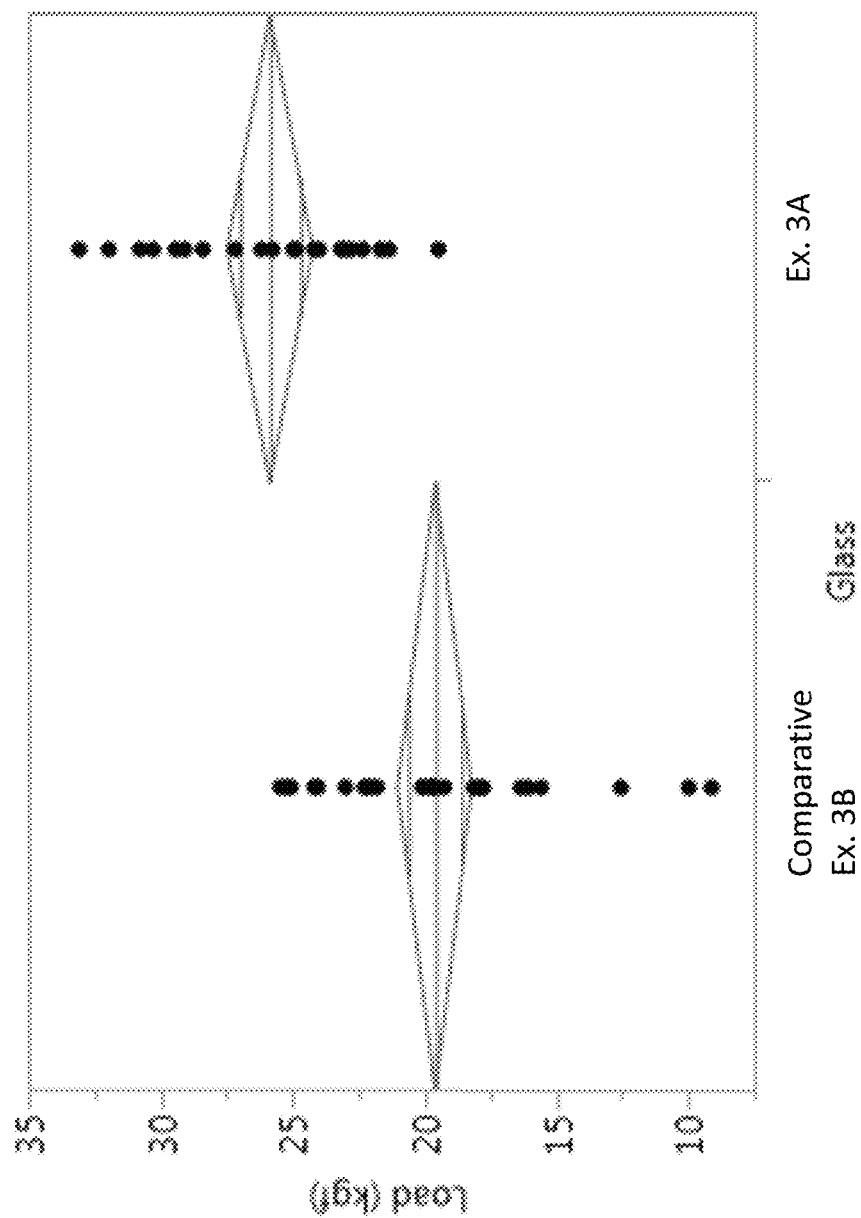
FIG. 11 is a graph comparing the average load to failure of glass-based articles according to Example 3A and Comparative Example 3B, after being abraded at a load or pressure of 45 psi.
Figure 12:
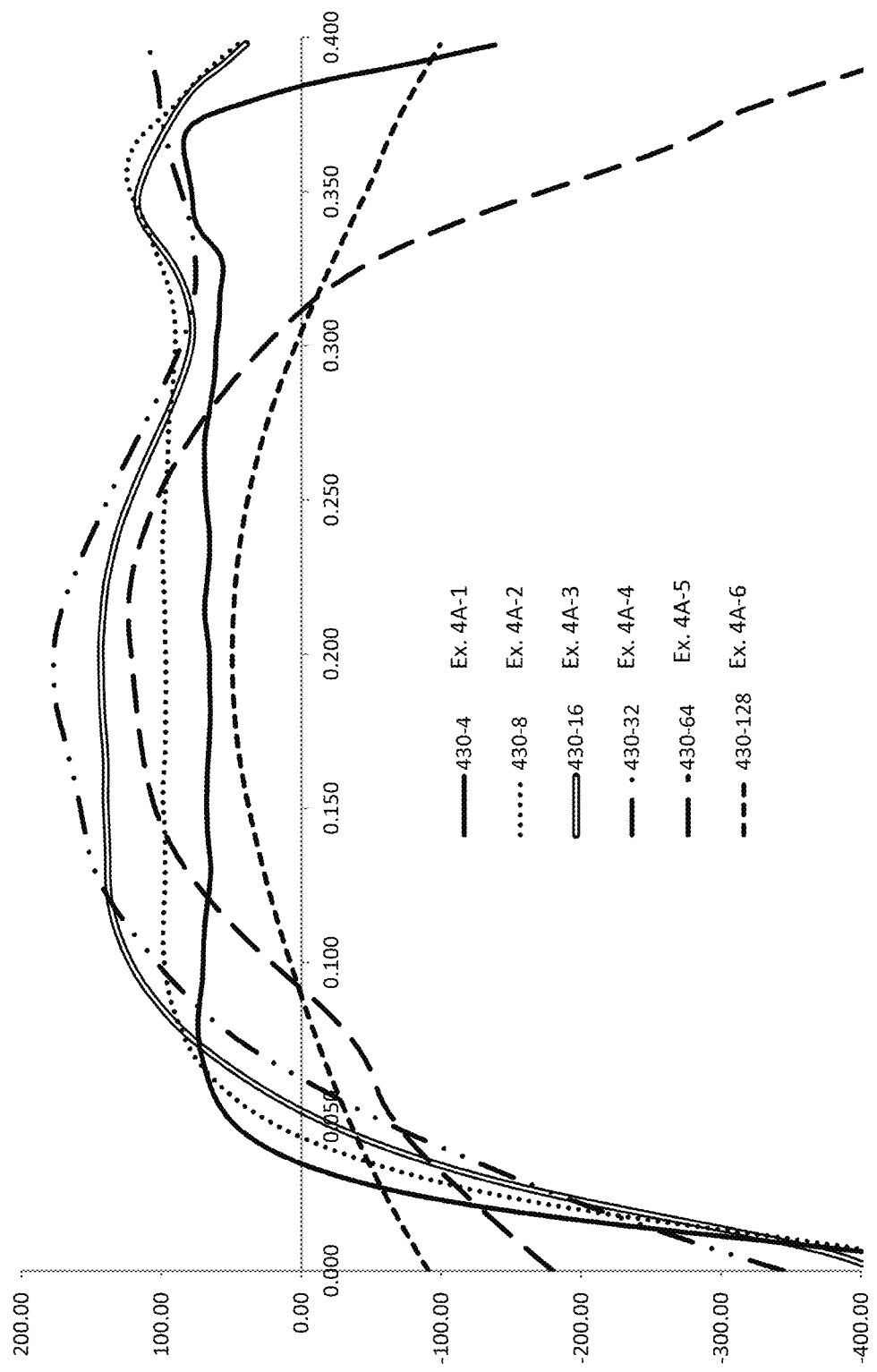
FIG. 12 is a graph showing the stress profiles of Examples 4A-1 through 4A-6 as a function of depth.
Figure 13:
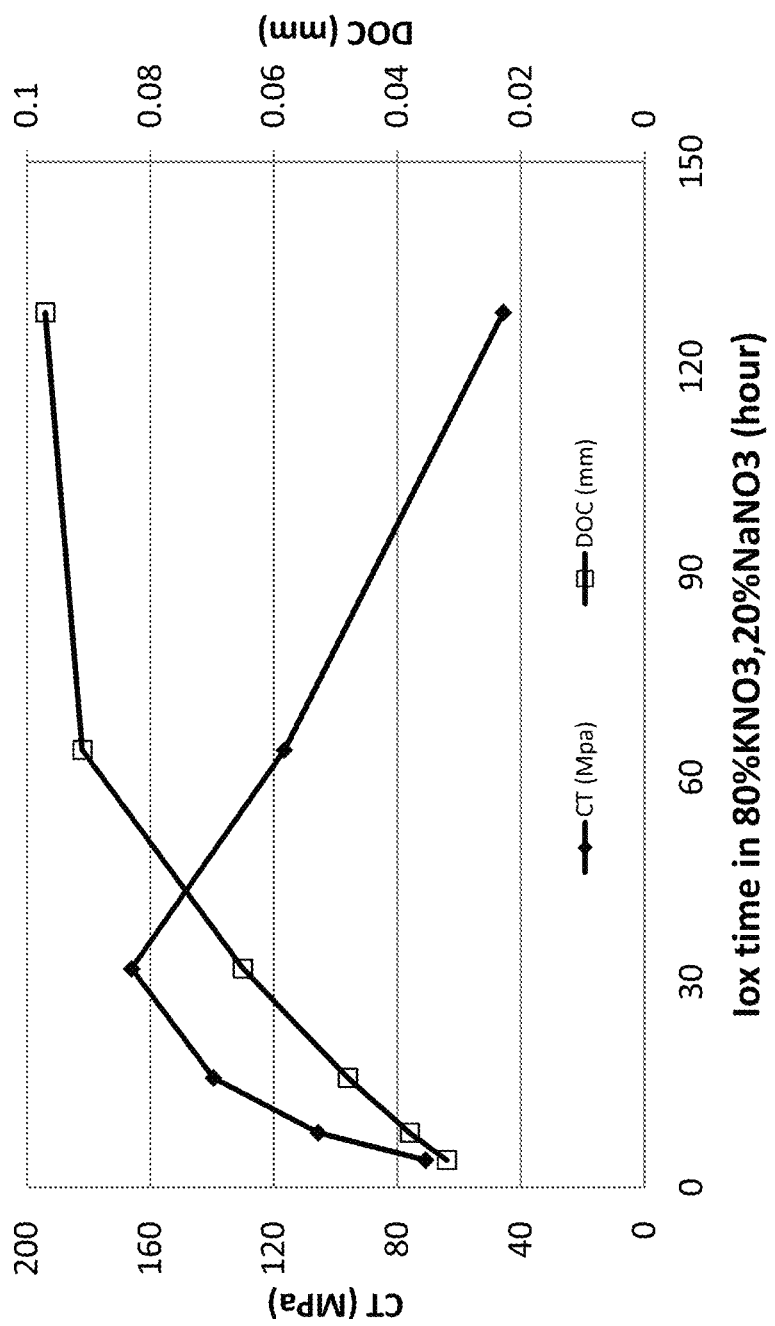
FIG. 13 is a graph showing the maximum CT and DOC values of Examples 4A-1 through 4A-6 as a function of ion exchange time.
Figure 14:
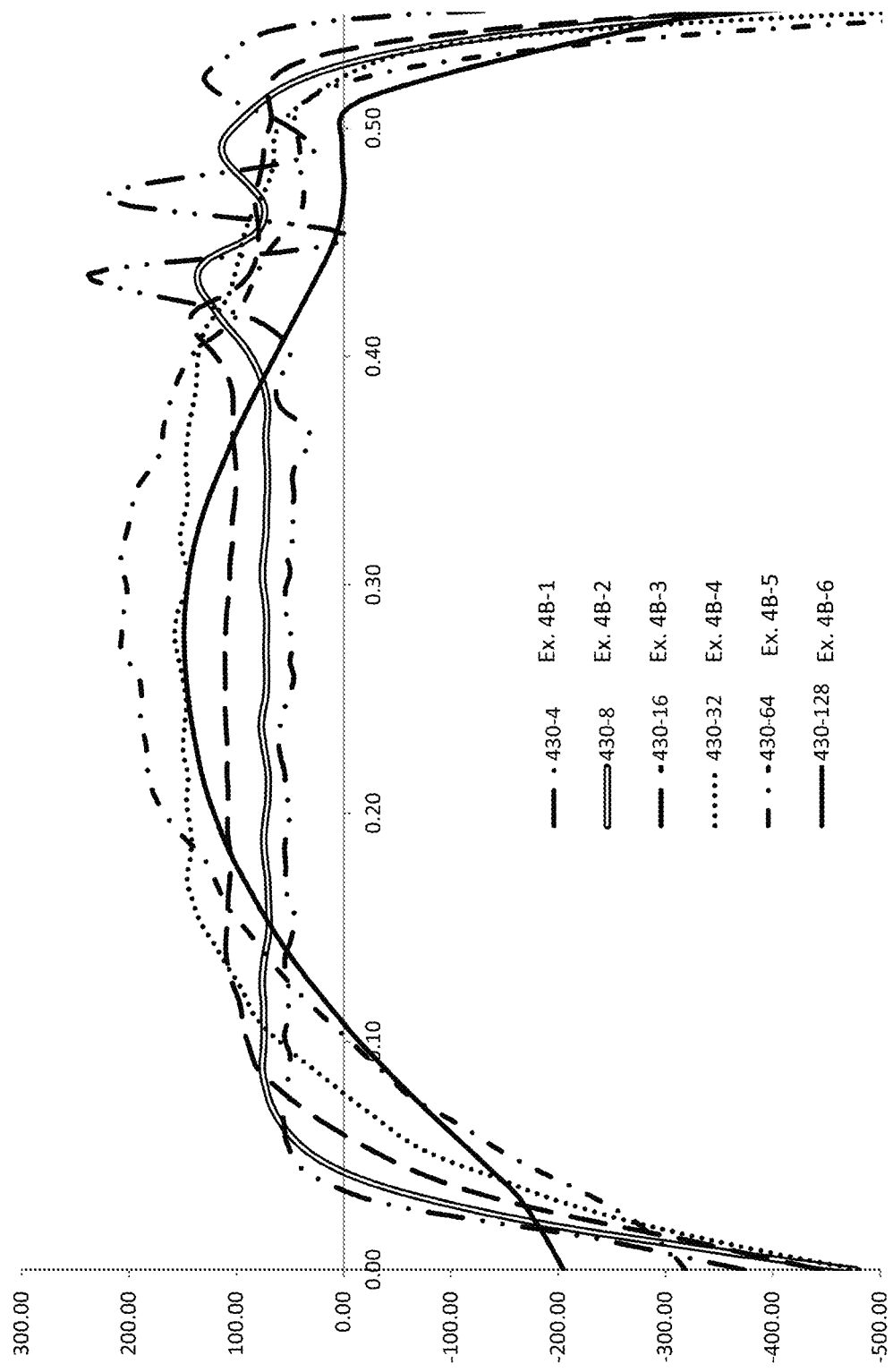
FIG. 14 is a graph showing the stress profiles of Examples 4B-1 through 4B-6 as a function of depth.
Figure 15:
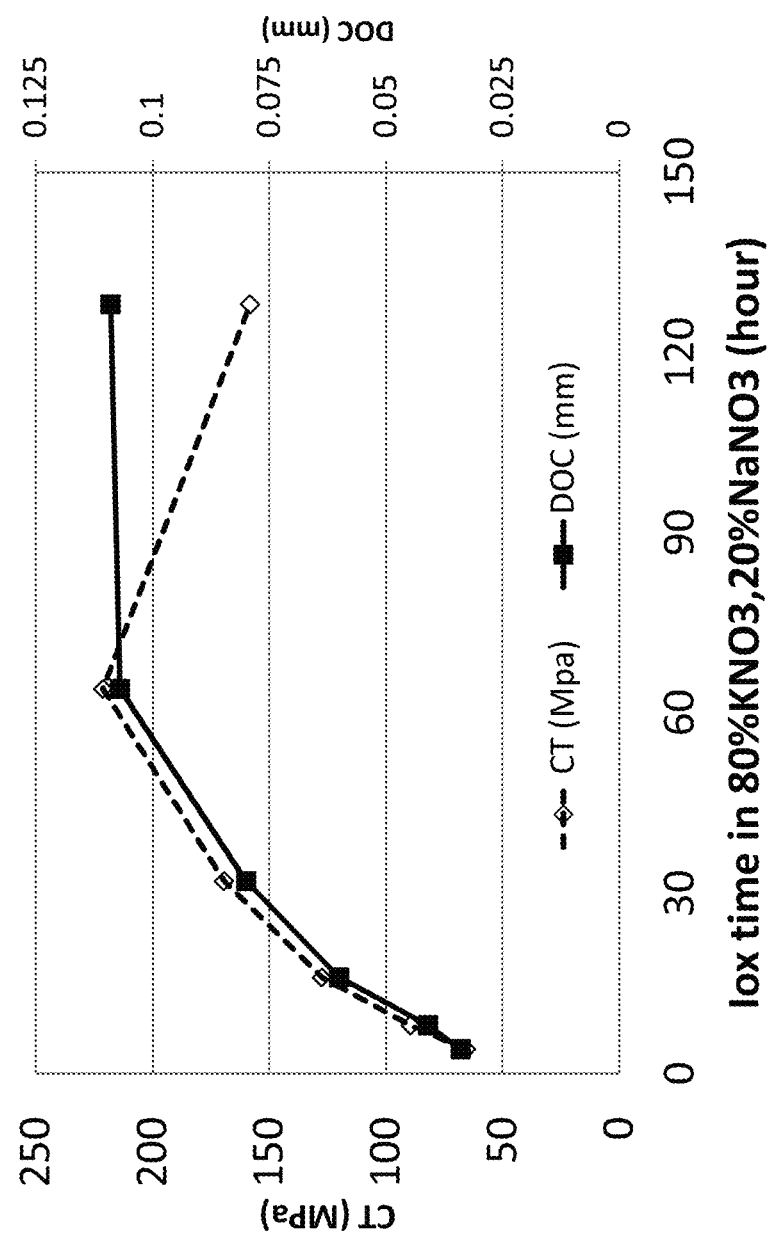
FIG. 15 is a graph showing the maximum CT and DOC values of Examples 4B-1 through 4B-6 as a function of ion exchange time.
Figure 16:
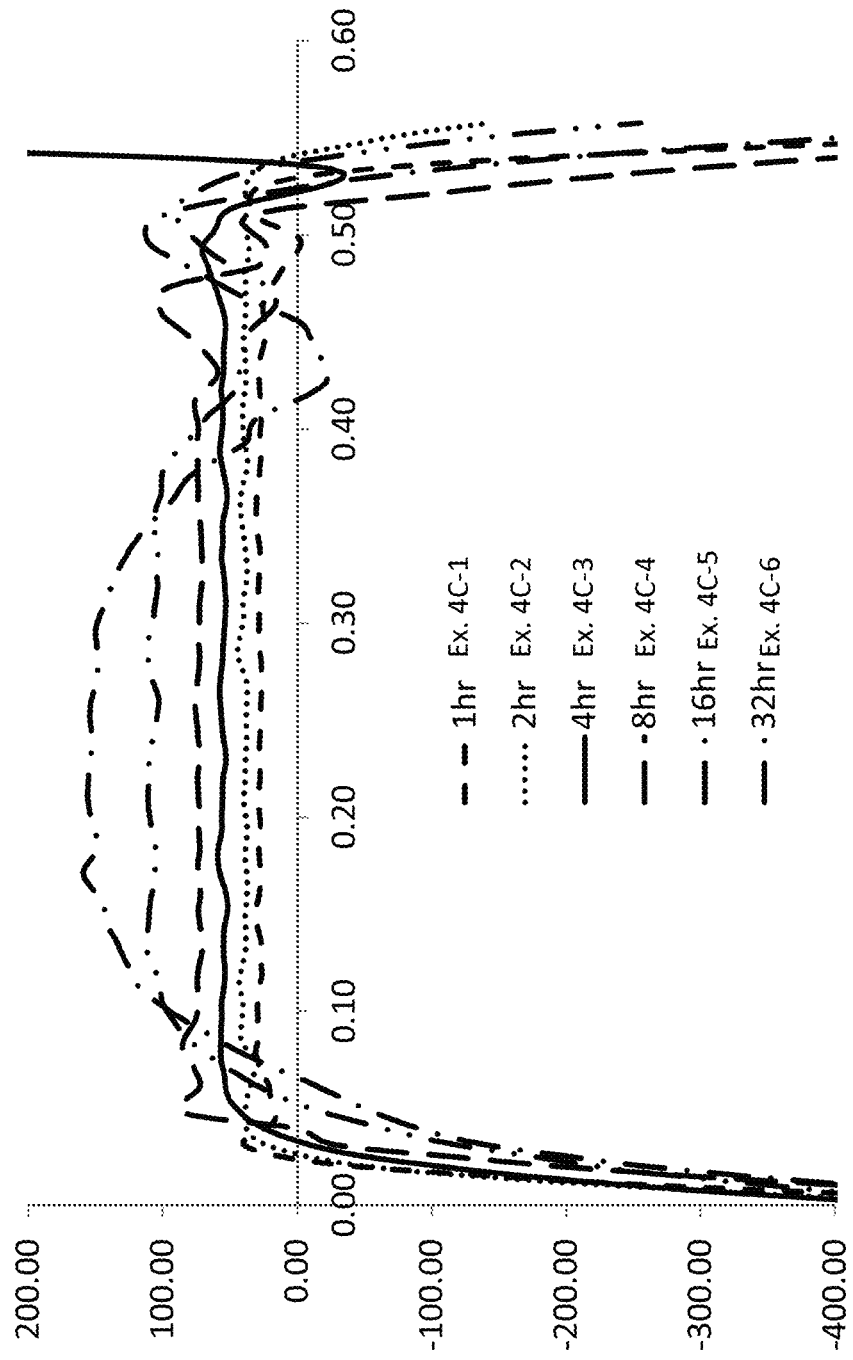
FIG. 16 is a graph showing the stress profiles of Examples 4C-1 through 4C-6 as a function of depth.
Figure 17:
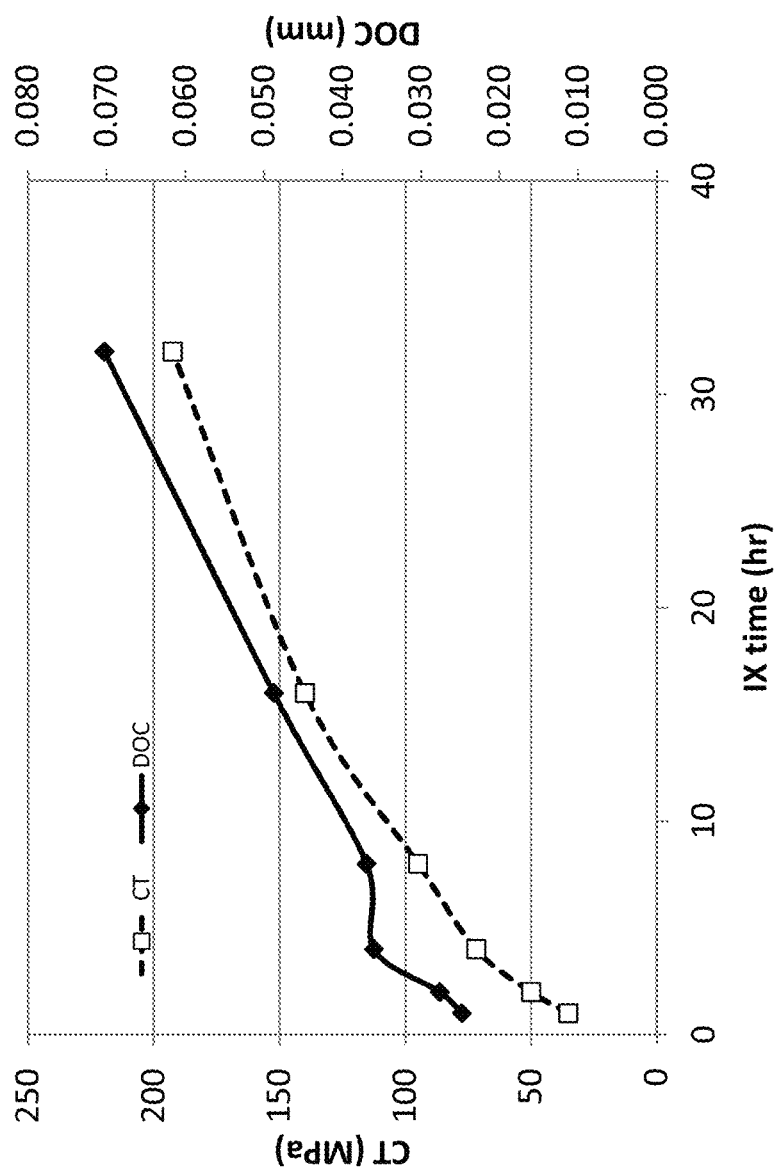
FIG. 17 is a graph showing the maximum CT and DOC values of Examples 4C-1 through 4C-6 as a function of ion exchange time.
Figure 18:
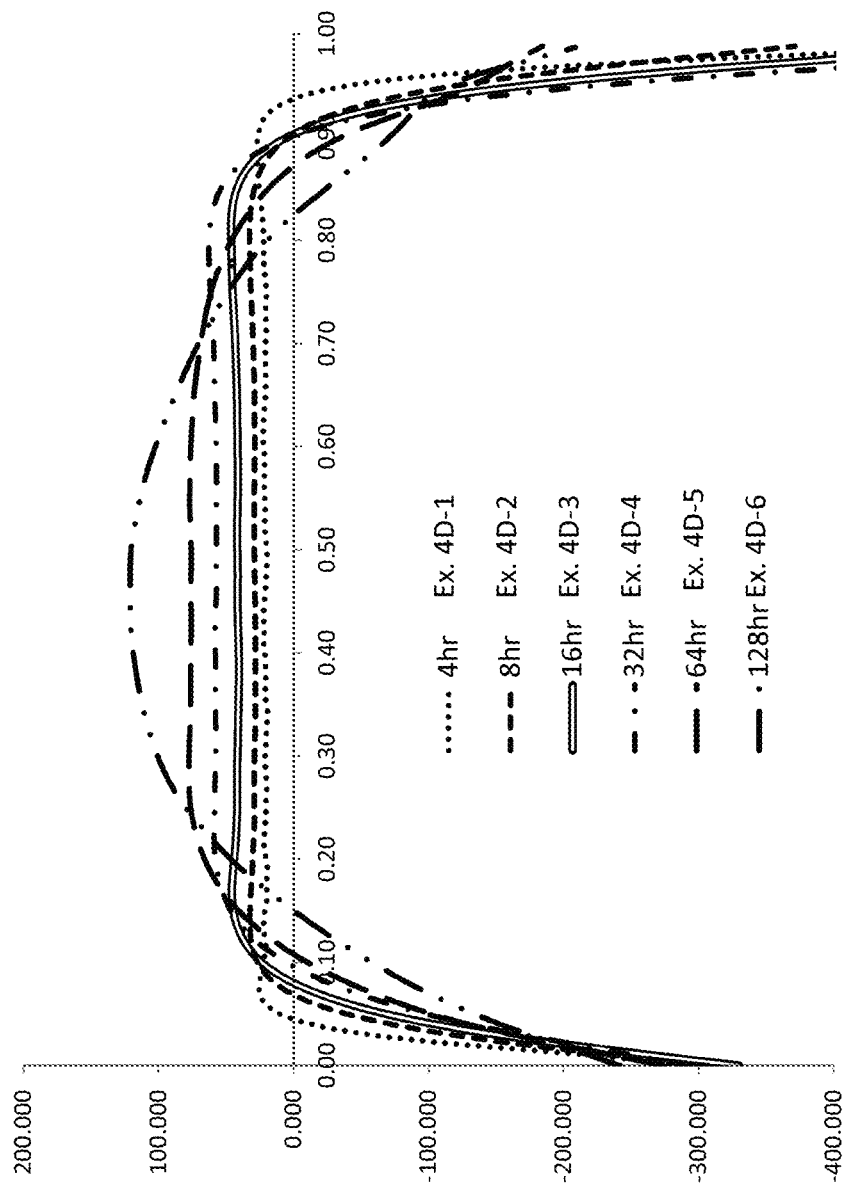
FIG. 18 is a graph showing the stress profiles of Examples 4D-1 through 4D-6 as a function of depth.
Figure 19:
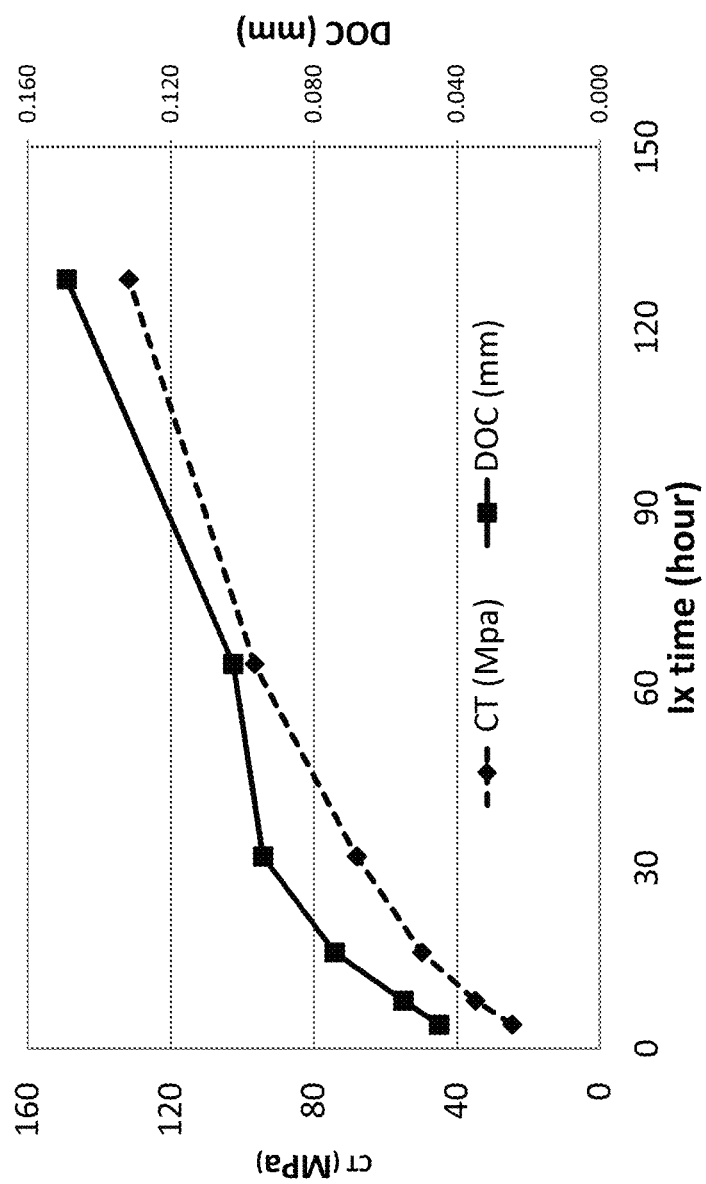
FIG. 19 is a graph showing the maximum CT and DOC values of Examples 4D-1 through 4D-6 as a function of ion exchange time.

Glass-based articles according to Example 3A and Comparative Example 3B were subjected to AROR testing, as described herein, using a load or pressure of 25 psi. The glass-based substrates of Example 3A exhibited an average load to failure of about 30 kgf, while the glass-based substrates of Comparative Example 3B exhibited an average load to failure of about 27 kgf, as shown in FIG. 10. When the abrasion load or pressure was increased to 45 psi, the difference in average load to failure for Example 3A and Comparative Example 3B increased. Specifically, under a 45 psi load or pressure, Example 3A exhibited an average load to failure of about 25.9 kgf, while Comparative Example 3B exhibited an average load to failure of about 19.6 kgf, as shown in FIG. 11.

Example 4

Glass substrates having a nominal composition of 57.5 mol % $SiO_2$, 16.5 mol % $Al_2O_3$, 16.7 mol % $Na_2O$, 2.5 mol % MgO, and 6.5 mol % $P_2O_5$, and having a thicknesses of about 0.4 mm, 0.55 mm, or 1 mm were subjected to chemical strengthening. The thicknesses and conditions of chemical strengthening are shown in Table 7.

TABLE 7

Thickness and chemical strengthening conditions for Examples 4A-4D.

| Ex. | Thickness | Bath Composition | Bath Temperature |
| --- | --- | --- | --- |
| 4A | 0.4 mm | 80% KNO3, 20% NaNO3 | 430° C. |
| 4B | 0.55 mm | 80% KNO$_3$, 20% NaNO$_3$ | 430° C. |
| 4C | 0.55 mm | 90% KNO$_3$, 10% NaNO$_3$ | 430° C. |
| 4D | 1.0 mm | 70% KNO$_3$, 30% NaNO$_3$ | 430° C. |

Example 4A was immersed in a molten salt bath, as indicted in Table 7, for 4 hours, 8 hours, 16 hours, 32 hours, 64 hours and 128 hours (Examples 4A-1 through 4A-6). Example 4B was immersed in a molten salt bath, as indicated in Table 7, for 4 hours, 8 hours, 16 hours, 32 hours, 64 hours and 128 hours (Examples 4B-1 through 4B-6). Example 4C was immersed in a molten salt bath, as indicated in Table 7, for 1 hour, 2 hours, 4 hours, 8 hours, 16 hours and 32 hours (Examples 4C-1 through 4C-6). Example 4D was immersed in a molten salt bath, as indicated in Table 7, for 4 hours, 8 hours, 16 hours, 32 hours, 64 hours and 128 hours (Examples 4D-1 through 4D-6). The stress profiles of Examples 4A-1 through 4A-6, 4B-1 through 4B-6, 6C-1 through 4C-6, and 4D-1 through 4D-6 are shown in FIGS. 12, 14, 16 and 18, respectively. In FIGS. 12, 14, 16 and 18, the depth or thickness of the glass articles is plotted on the x-axis and stress is plotted on the y-axis. The positive stress values are CT values and the negative stress values are the CS values.

The CT and DOC values as a function of time immersed in the molten salt bath for Examples 4A-1 through 4A-6, Examples 4B-1 through 4B-6, Examples 4C-1 through 4C-6 and 4D-1 through 4D-6, are shown in FIGS. 13, 15, 17, and 19, respectively.

Example 5

Glass substrates having a nominal composition as shown in Table 8 and having a thicknesses of about 0.8 mm each were subjected to chemical strengthening in a molten salt bath including a mixture of $NaNO_3$ and $NaSO_4$ and a temperature of 500° C. for 15 minutes (Comparative Example 5A) and for 16 hours (Example 5B).

TABLE 8

Composition of the glass substrate of Example 5, prior to chemical strengthening.

| Example=▶ | 5 |
|---|---|
| Oxide [mole %] | |
| $SiO_2$ | 69.2 |
| $Al_2O_3$ | 12.6 |
| $B_2O_3$ | 1.8 |
| $Li_2O$ | 7.7 |
| $Na_2O$ | 0.4 |
| MgO | 2.9 |
| ZnO | 1.7 |
| $TiO_2$ | 3.5 |
| $SnO_2$ | 0.1 |
| $\frac{[Li_2O+Na_2O+MgO+ZnO+K_2O]}{[Al_2O_3+B_2O_3]}$ | $\frac{12.7}{14.4} = 0.88$ |
| $\frac{[TiO_2+SnO_2]}{[SiO_2+B_2O_3]}$ | $\frac{3.6}{71} = 0.051$ |

Figure 20:
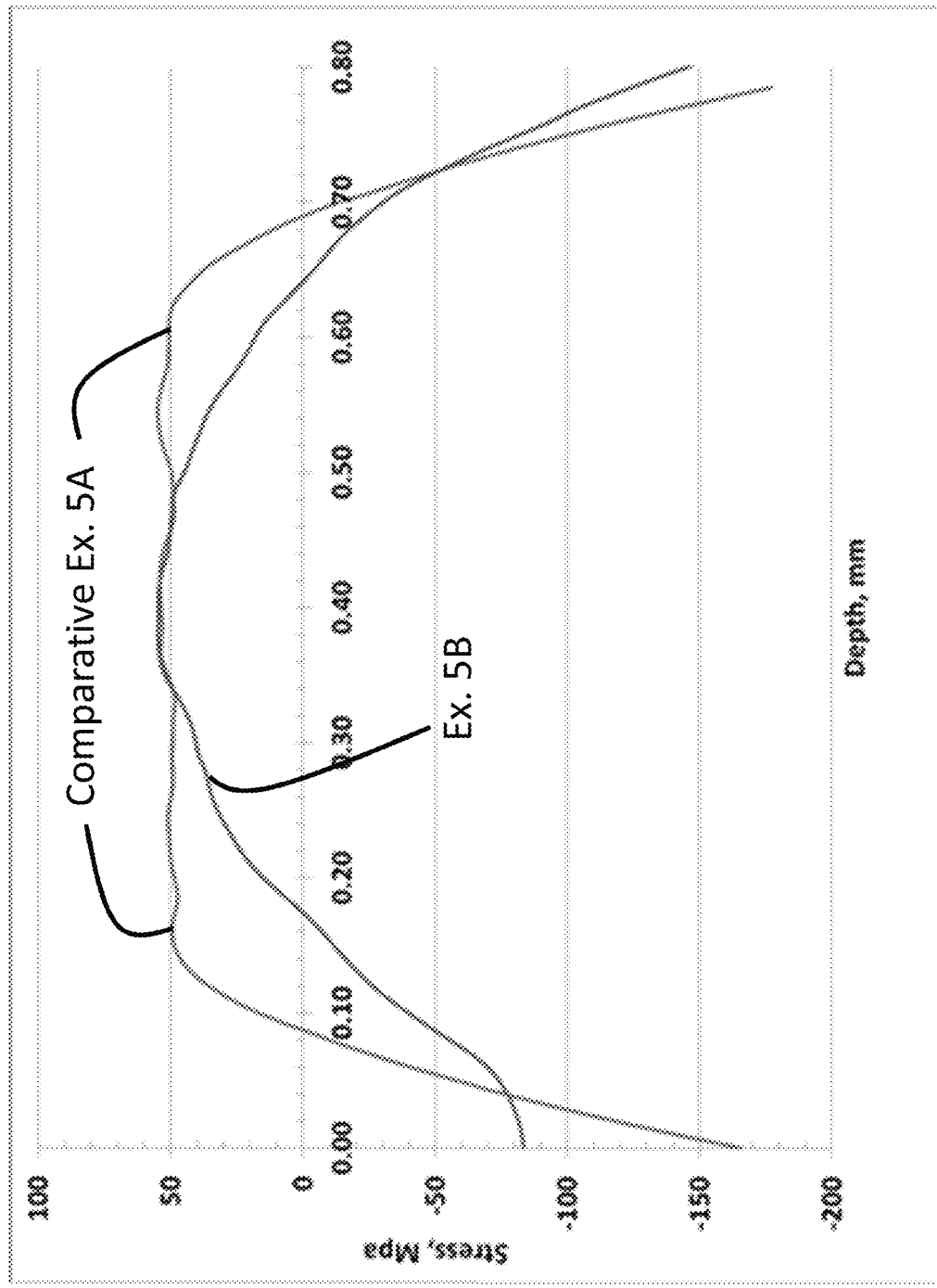
FIG. 20 is a graph showing the stress profiles of Comparative Example 5A and Example 5B as a function of depth.

The stress profile of the glass-based articles of Examples 5A and 5B are shown in FIG. 20. A shown in FIG. 20, Comparative Example 5A exhibited a known stress profile, whereas, Example 5B showed a stress profile according to one or more embodiments of this disclosure. The stored tensile energy of the glass-based articles of Examples 5A and 5B was calculated from the measured SCALP stress profile data and using equation (3) above. The calculated stored tensile energy is plotted as a function of measured CT (MPa), as shown in FIG. 21.

Figure 21:
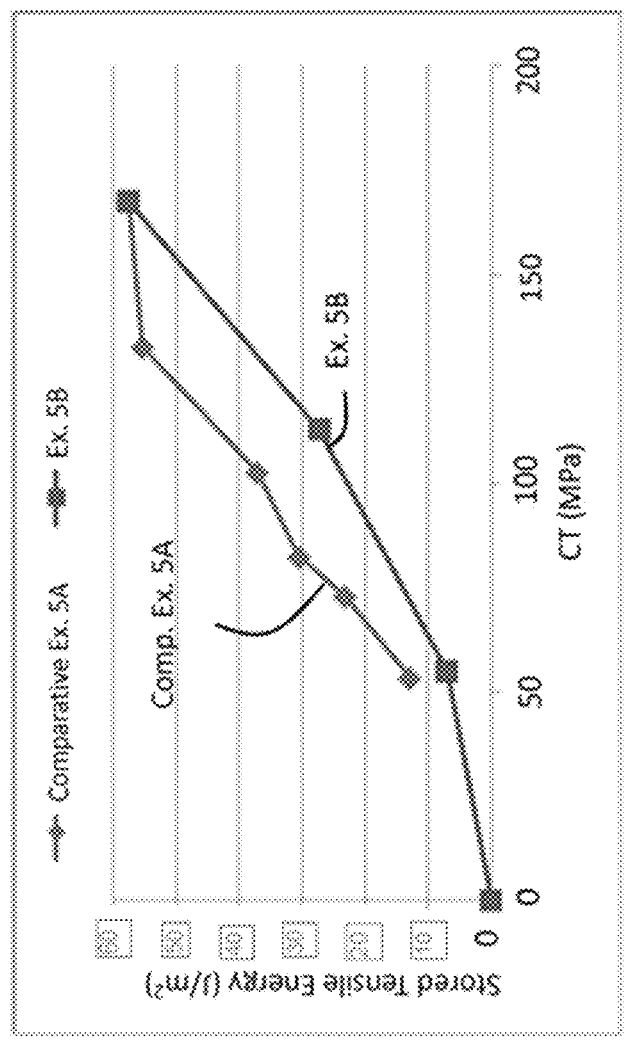
FIG. 21 is a graph showing the stored tensile energy of Comparative Example 5A and Example 5B as a function of maximum CT.

As shown in FIG. 21, Comparative 5A exhibited much greater stored tensile energy values for a given CT value than Example 5B (for the same CT value). In this figure, CT is the maximum CT in the sample. Specifically, at a CT of about 55 MPa, Comparative Example 5A exhibited a stored tensile energy of about 12 $J/m^2$, whereas Example 5B exhibited a stored tensile energy of about 9 $J/m^2$. Comparative Example 5A and Example 5B were fractured and Example 5B fractured into fewer pieces than Comparative Example 5A, which fractured into a significantly greater number of pieces. Accordingly, without being bound by theory, it is believed that controlling the stored tensile energy may provide a way to control or predict fragmentation patterns or the number of fragments that result from fracture. In these examples, the CT was varied by keeping a sample in the ion exchange bath for a longer period of time while using the same bath temperature and composition. In FIG. 21, the point 0,0 was not experimental, but is would one of ordinary skill in the art would expect to be the case, i.e., when there is 0 CT, there will be 0 stored tensile energy.

Glass substrates having a nominal composition as shown in Table 8 and having a thicknesses of about 1 mm each were subjected to chemical strengthening in a molten salt bath including $NaNO_3$ and a temperature of 430° C. for 4 hours (Comparative Example 5C) and for 61.5 hours (Example 5D). Comparative Example 5C exhibited a known stress profile, whereas, Example 5D showed a stress profile according to one or more embodiments of this disclosure. The stored tensile energy of Examples 5C and 5D was calculated using the same method used with Examples 5A-5B and plotted as a function of measured CT (MPa), as shown in FIG. 22.

Figure 22:
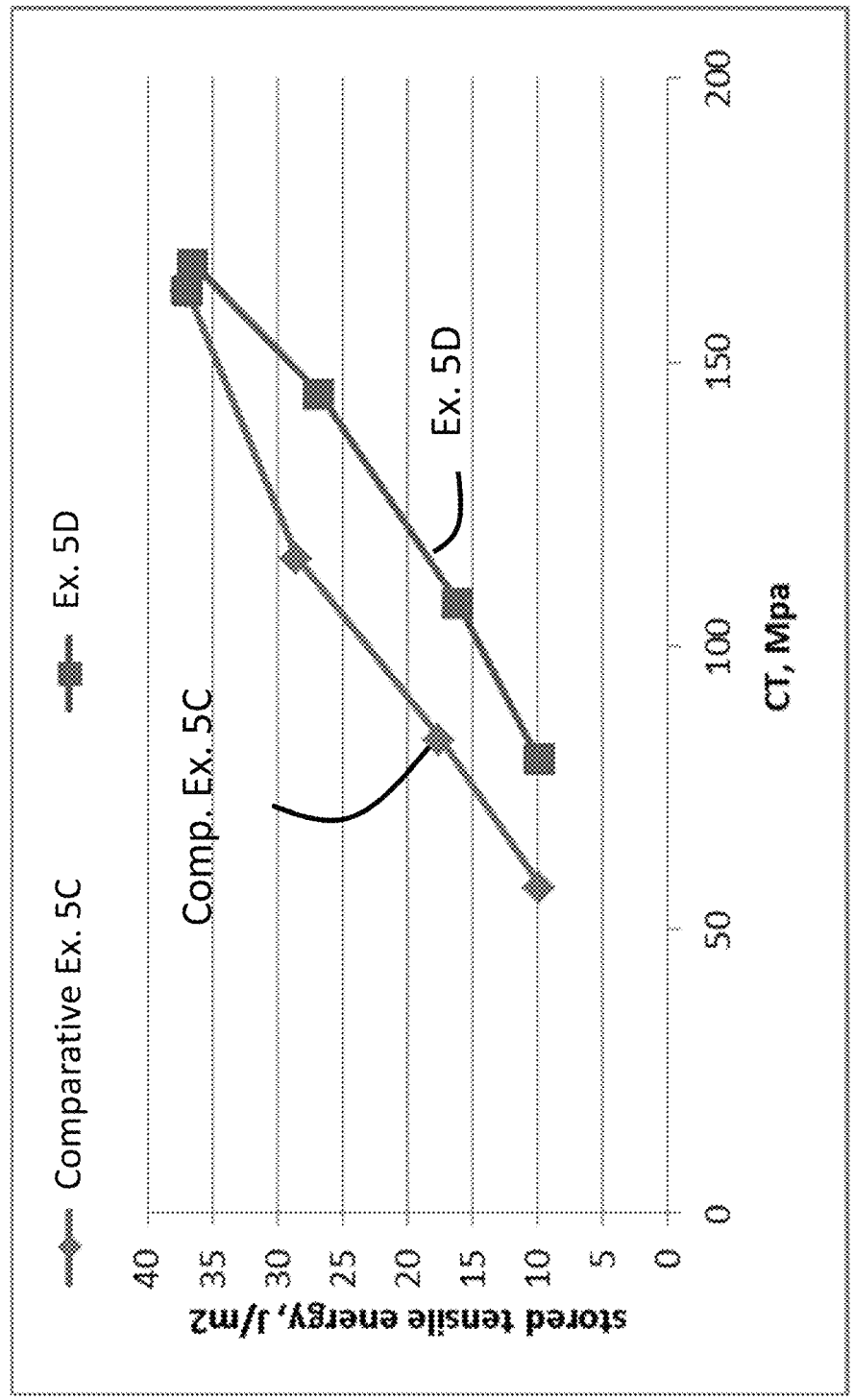
FIG. 22 is a graph showing stored tensile energy of Comparative Example 5C and Example 5D as a function of maximum CT.

As shown in FIG. 22, Comparative 5C exhibited much greater stored tensile energy values for a given CT value (again, as with FIG. 21, these are maximum CT values, and again the values were varied by using the same ion exchange bath temperature and composition, but with longer periods of time) than Example 5D (for the same CT value). Comparative Example 5C and Example 5D were fractured and Example 5D fractured into fewer pieces than Comparative Example 5C, which fractured into a significantly greater number of pieces.

Example 6

Examples 6A-6D included glass substrates in accordance with one or more embodiments of the disclosure and having about 10 mol % $Na_2O$ and 6 mol-% $Li_2O$ in the base glass. For example, a nominal composition has about 63.46 mol % $SiO_2$, 15.71 mol % $Al_2O_3$, 6.37 mol % $Li_2O$, 10.69 mol % $Na_2O$, 0.06 mol % MgO, 1.15 mol % ZnO, 2.45 mol % $P_2O_5$, and 0.04 mol % $SnO_2$. The glass substrates have a thickness of 0.8 mm. The glass substrates of Examples 6A-6D were ion exchanged in a molten salt bath including to the conditions provided in Table 9, in which "SIOX" refers to single ion exchange, and "DIOX" refers to double ion exchange.

Different trials for stress profiles were implemented in the glass substrates. The glass substrate has a composition containing Na and Li in the base glass. It is possible to exchange more than one ion, such as Na and K primarily for Li, simultaneously. Typically, in glasses that have just one free ion such as Na in its composition, it would take a two-step IOX process with different $KNO_3/NaNO_3$ mixtures in order to achieve a profile that has a long tail towards the center of the glass and a spike in its surface.

TABLE 9

IOX Conditions and Resultant Properties for Example 6

| Parameter | 6A. SIOX 3.75 h/380 C. 51% K/49% Na | 6B. SIOX 3.00 h/390 C. 80% K/20% Na | 6C. SIOX 7.50 h/390 C. 80% K/20% Na | 6D. DIOX Step1 3.60 h/380 C. 15% K/85% Na | 6D. DIOX Step2 0.50 h/390 C. 95% K/5% Na |
|---|---|---|---|---|---|
| Power coefficient | 2.6 | 2.0 | 1.7 | — | ~2.2 |
| CS range | >465 | 600-750 | 570-720 | 320-400 Traditional FSM | 780-950 |
| Knee stress range | 127-160 | 80-110 | 60-90 | — | 115-150 |
| DOL spike range | 11-12.4 | 12-15 | 20-24 | 9.5-11.2 Traditional FSM | 7.3-8.7 |

Table 9 also shows parameters and measured values via point-by point method plus prism coupler measurements (FSM instrument) for stress at immediate external surface for different ion exchange recipes. The parameters shown in Table 9 include the power coefficient of the deep region of the profile, the Surface Compressive Stress (CS), the stress at the knee where the spike connects to the deep tail, and the Depth of layer of the spike where the knee occurs. As can be seen from Examples 6A-D, the DOL of the spike can be from about 0.01·t to about 0.035·t (for example about 0.015·t, 0.02·t, 0.025·t, 0.30·t, or 0.35·t, and any and all subranges therebetween), i.e., from about 7.3 microns to about 24 microns of an 800 micron thick sample. The spike DOL generally corresponds to the potassium DOL. In a Li-containing glass, even a single IOX diffusion creates a spike and a tail in the stress profile. This is thought to be due to the fact that the glass containing different amounts of Li, Na and K is exchanged simultaneously at different diffusion rates. Due to minor local deviations between the actual deep stress profile and the power-law approximation, as well as precision limitations in the point-to-point stress profile measurements, up to 10-15 MPa difference between the actual stress at the bottom of the spike and the knee stress of the model spiked power profile is possible.

Figure 23:
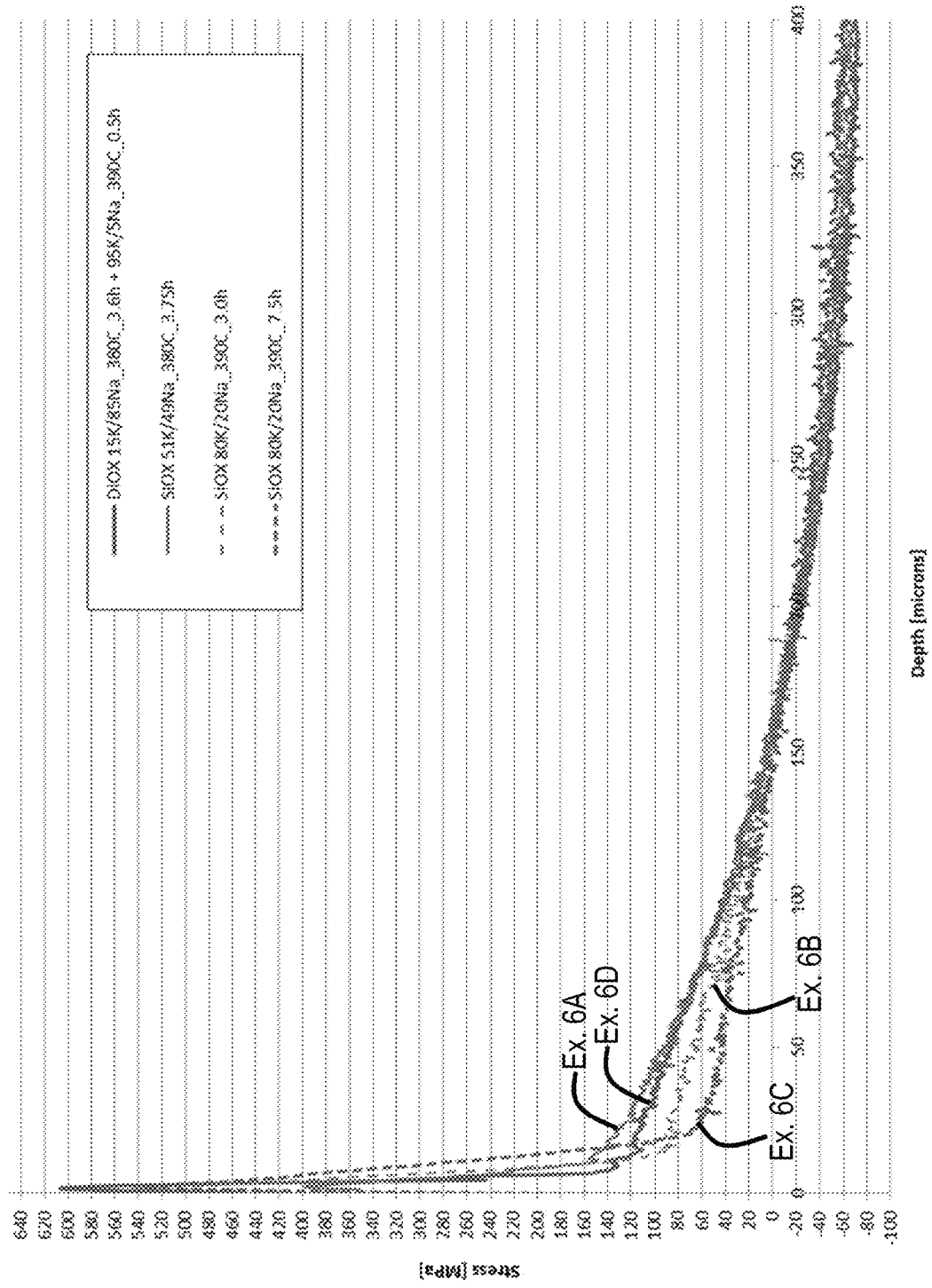
FIG. 23 is a cross-sectional view across a thickness of four chemically strengthened glass-based article according to one or more embodiments of this disclosure.

FIG. 23 shows the measured stress profile via point by point refractive index metrology at TE and TM polarizations. It is noted that the stress at the surface is under-represented in the top 5 microns due resolution limitation of the measurement technique. Surface stress values in practice are higher than shown here, and are separately measured by prism-coupling techniques. A more complete range of attributes are shown in Table 9. It is noted that even a single ion exchange (SIOX) diffusion creates a spike and a tail in the stress profile when a Li-containing glass is immersed in a bath having both K and Na. While not wishing to be bound to any particular theory, it is thought that this spike and tail are due to the fact that the glass contains different amounts of Li, Na and K being exchanged simultaneously at different diffusion rates.

Examples of the stress profiles can be observed in FIG. 23. As can be seen from the Figure, for Example 6A, the spike region is obtained by the nonlinear diffusion of potassium, while the tail of the profile is obtained by the nonlinear diffusion of Na and Li. Even for short diffusion times where the Na from the ion exchange bath does not reach the center of the thickness, the tail of the profile in this case would not be described by a complementary error function which is only applicable to substantially linear diffusion.

Again in FIG. 23 one can observe the measured stress profile for a variety of stress profiles tested via point by point refractive index metrology at TE and TM polarizations. Here the stress at the surface is under-represented due to limited resolution of the measurement combined with a high slope of the spike profile. Surface stress values in practice may be higher than shown in in this figure, and are measured separately using analysis of mode spectrum obtained using prism-coupling (FSM-6000). It is noted that a single ion exchange diffusion creates a spike and a tail in the stress profile due to the diffusion of more than one ion simultaneously.

Figure 24:
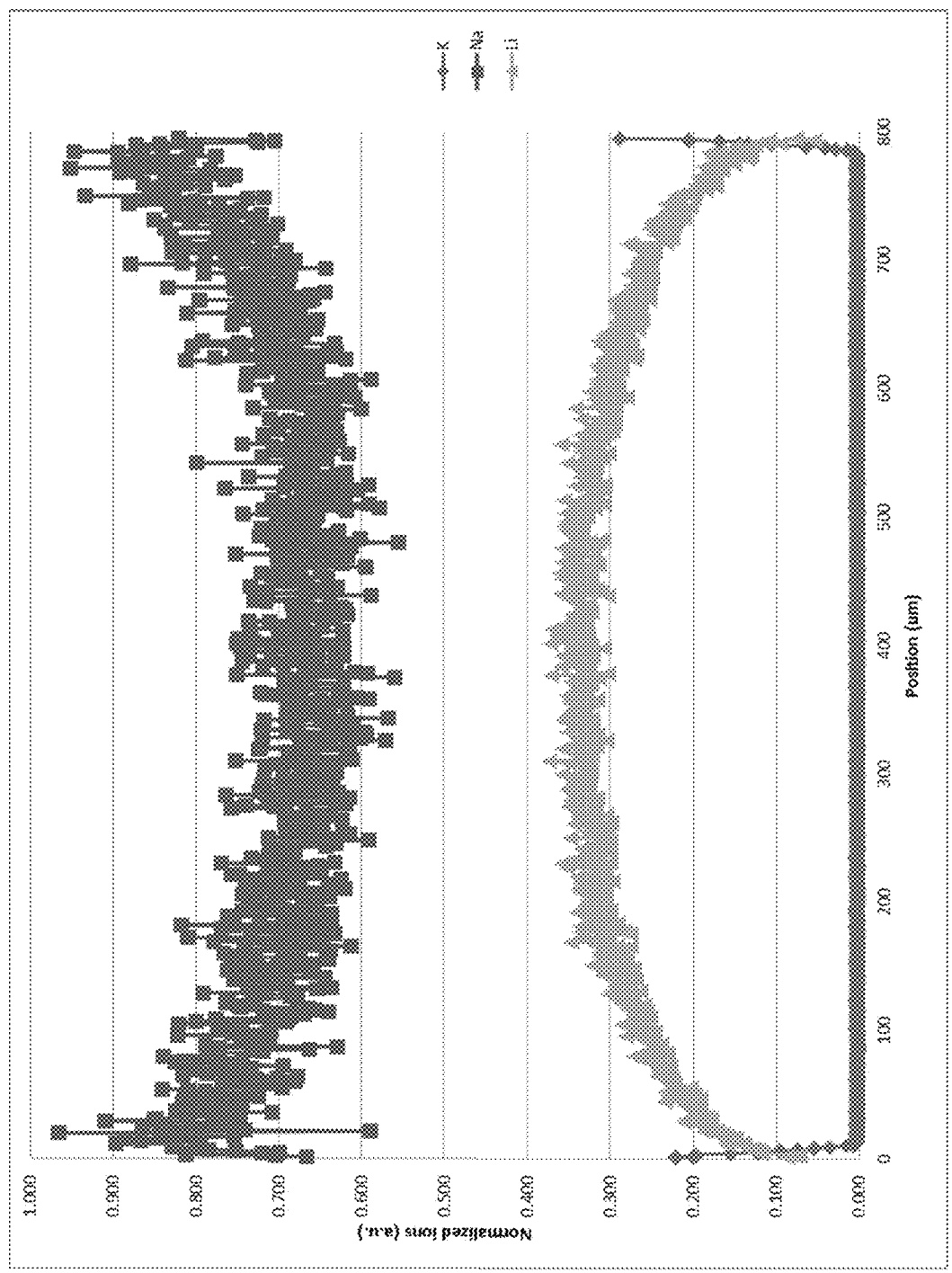
FIG. 24 is a graph showing the normalized microprobe concentration profiles for K, Na and Li of a chemically strengthened glass-based article according to one or more embodiments of this disclosure.

FIG. 24 shows the measured normalized microprobe data for K, Na and Li diffused using the recipe of 51 wt % K/49 wt % Na at 380° C. for 3.75 h (6A) in a glass in accordance with one or more embodiments of the disclosure and having about 10 mol % $Na_2O$ and 6 mol-% $Li_2O$ in the base glass. As can be seen from the figure, the potassium diffusion is limited to near the glass surface, producing a surface peak in the stress profile. However, the Na profile penetrates very deeply, all the way to the center of the glass. Once the Na concentration in the center starts increasing in a substantial way as a result of the two profiles of in-diffused Na meeting in the center, the shape of the Na profile becomes possible to approximate reasonably well with a power law, and is substantially different from the shape before this condition is met. In addition, the depth of compression becomes stable, changing very little with additional diffusion time.

In FIG. 24, after ion exchange diffusion using the recipe of 51 wt % K/49 wt % Na at 380° C. for 3.75 h (Example 6A) in a glass originally containing Na and Li only is provided. One can see that the potassium diffuses only in the near-surface region generating the surface peak (spike) in the stress profile. However the Na and Li exchange relatively deeply to the center of the glass, generating a substantially curved stress profile throughout the thickness. The present inventors have obtained a regime of ion exchange where profiles of desired curvature can be obtained, and quantified using a power-law model.

Figure 25:
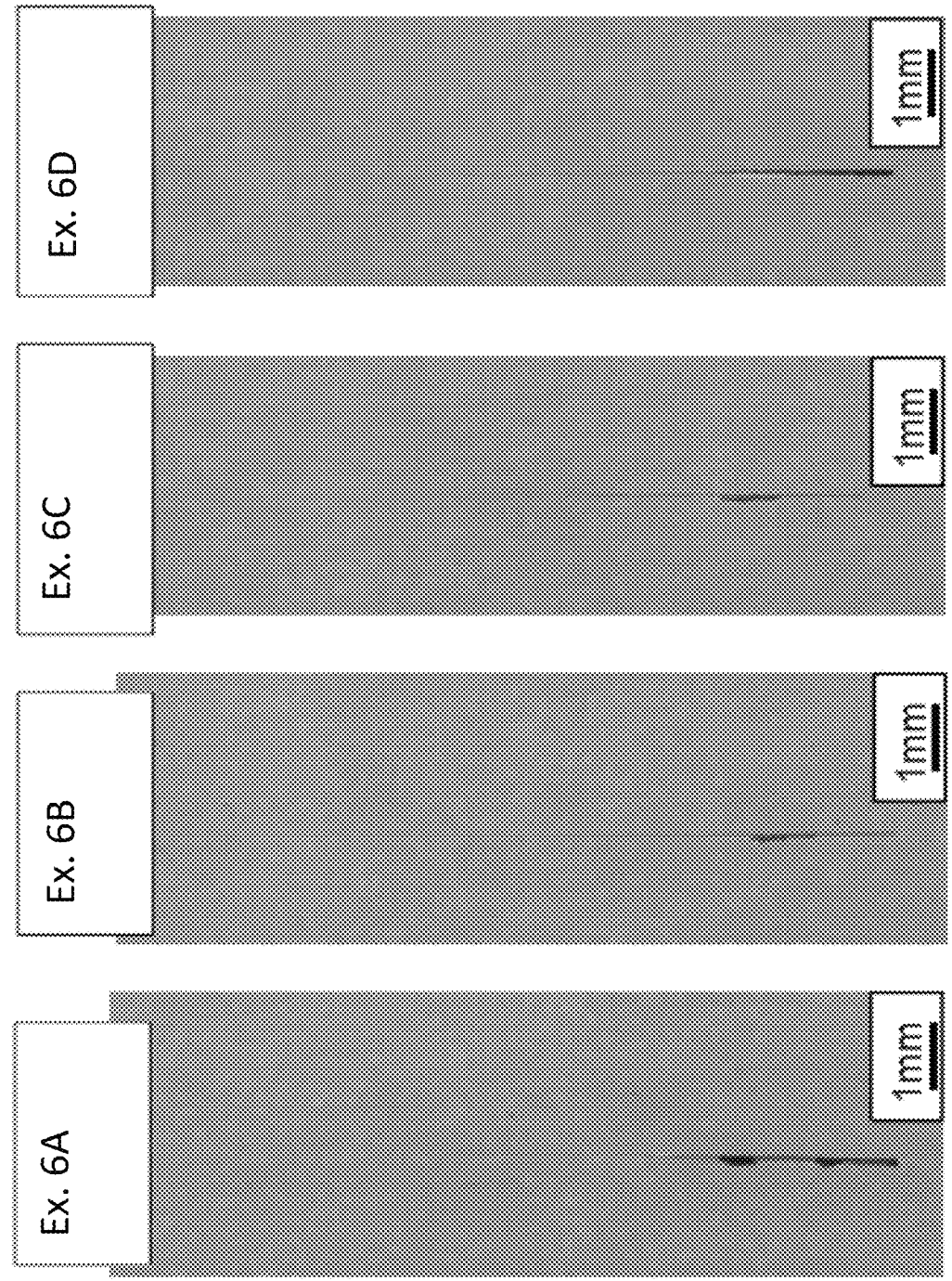
FIG. 25 is an image of scratch test results of four chemically strengthened glass-based article according to one or more embodiments of this disclosure.

FIG. 25 shows an example of ramped scratch tests for 6A-6D with a diamond tip with 30 micron radius at angle of 76.5 degree in cone angle in a ramp mode from 0 Newtons to 4 Newtons linearly increasing from top to bottom of the figure.

Table 10 below shows the percentage of scratches with cracking as evaluated by an optical microscope for the ramp scratch test as exemplified in FIG. 25.

TABLE 10

| Example | 30 μm Conospherical Scratch (0-4 N ramp) # scratches showing cracks/ total # scratches; (% scratches showing cracks) |
|---|---|
| 6A | 3/3 (100%) |
| 6B | 1/3 (33%) |
| 6C | 2/4 (50%) |
| 6D | 1/3 (33%) |

Tables 11-18 show a ranking of severity of scratches in several test via microscope evaluation.

TABLE 11

| Width (microns) = scratch characterization letter |
|---|
| 0-5 = A |
| 6-10 = B |
| 11-20 = C |
| 21-40 = D |
| 41-60 = E |
| 61-80 = F |

TABLE 12

| | Ramped Scratch 20 micron tip 76 degrees | | Score | |
|---|---|---|---|---|
| | 6A | Reference Glass | 6A | Reference Glass |
| Start | 5 | 3 | A | A |
| 2 N | 10 | 9 | B | B |
| 4 N | 17 | 27 | C | D |
| max width anywhere | 28 | 28 | D | D |

TABLE 13

| | Ramped Scratch 30 microns tip 76 degrees with NO ETC | | | | | | | | | |
|---|---|---|---|---|---|---|---|---|---|---|
| | 6A | 6B | 6C | 6D | Reference Glass | 6A | 6B | 6C | 6D | Reference Glass |
| Start | 1 | 1 | 1 | 1 | 1 | A | A | A | A | A |
| 2 N | 5 | 5 | 5 | 5 | 5 | A | A | A | A | A |
| 4 N | 12 | 6 | 6 | 9 | 15 | C | B | B | B | C |
| max width anywhere | 12 | 8 | 8 | 9 | 17 | C | B | B | B | C |

TABLE 14

| | Ramped Scratch 30 microns tip 76 degrees with ETC | | | | | | | | | |
|---|---|---|---|---|---|---|---|---|---|---|
| | 6A | 6B | 6C | 6D | Reference Glass | 6A | 6B | 6C | 6D | Reference Glass |
| Start | 1 | 1 | 1 | 1 | 1 | A | A | A | A | A |
| 2 N | 4 | 4 | 4 | 4 | 5 | A | A | A | A | A |
| 4 N | 10 | 13 | 8 | 7 | 11 | B | C | B | B | C |
| max width anywhere | 12 | 13 | 11 | 9 | 12 | C | C | C | B | C |

TABLE 15

| | Ramped Scratch 50 micron tip 76 degrees with ETC | | Score | |
|---|---|---|---|---|
| | 6A | Reference Glass | 6A | Reference Glass |
| Start | 6 | 6 | A | A |
| 2 N | 6 | 6 | A | A |
| 4 N | 6 | 6 | A | A |
| max width anywhere | 6 | 6 | A | A |

TABLE 16

| | Ramped Scratch 110 degrees 0-2 N with ETC | | | | | | | | | |
|---|---|---|---|---|---|---|---|---|---|---|
| | 6A | 6B | 6C | 6D | Reference Glass | 6A | 6B | 6C | 6D | Reference Glass |
| Start | 15 | 16 | 14 | 12 | 16 | C | C | C | C | C |
| 1 N | 30 | 38 | 26 | 42 | 26 | D | D | D | E | D |
| 2 N | 53 | 100 | 83 | 36 | 55 | E | F | F | D | E |
| max width anywhere | 193 | 193 | 83 | 166 | 55 | F | F | F | F | E |

TABLE 17

| | Ramped Scratch 136 degree 0-2 N with ETC | | | | | | | | | |
|---|---|---|---|---|---|---|---|---|---|---|
| | 6A | 6B | 6C | 6D | Reference Glass | 6A | 6B | 6C | 6D | Reference Glass |
| Start | 10 | 26 | 25 | 3 | 10 | B | D | D | A | B |
| 1 N | 80 | 103 | 86 | 86 | 116 | F | F | F | F | F |
| 2 N | 93 | 74 | 56 | 226 | 133 | F | F | E | F | F |
| max width anywhere | 198 | 123 | 132 | 226 | 200 | F | F | F | F | F |

TABLE 18

| | Ramped Scratch 150 degree 0-2 N with ETC | | | | | | | | | |
|---|---|---|---|---|---|---|---|---|---|---|
| | 6A | 6B | 6C | 6D | Reference Glass | 6A | 6B | 6C | 6D | Reference Glass |
| Start | 12 | 12 | 12 | 11 | 11 | C | C | C | C | C |
| 1 N | 27 | 18 | 23 | 28 | 31 | D | C | D | D | D |
| 2 N | 27 | 28 | 23 | 30 | 31 | D | D | D | D | D |
| max width anywhere | 27 | 28 | 24 | 30 | 31 | D | D | D | D | D |

The different stress profiles present different levels of scratch susceptibility under certain conditions. In FIG. 25, one example is given of a ramped scratch test with a diamond tip having a 30 micron radius and a supporting-cone angle of 76.5 degree. The applied scratch force was ramped linearly over the range from 0 Newtons to 4 Newtons. Here, one can observe that compared to the Example 6A recipe of Table 9, the Example 6B-6D recipes modified to increase the spike CS, provide an improvement in scratch performance observable as narrower and less visible scratch defects. The presented images for each recipe are of 5 severe trials performed for that recipe. Observation of the scratch performance with an optical microscope, revealed some potential trends if one ranks the severity by the width developed in the scratch process. In addition, the percentage of the scratches showing cracking showed some difference, as indicated in Tables 11-18. It is noted that the knee stress is changed along with the surface CS in the modified recipes. Although not wishing to be bound to any particular theory, this example scratch test indicated that the combination of the stress at the surface, the position of the knee, and the stress at knee, and possibly even the exponent of the profile may play a role in certain types of scratch events, and the visibility of scratches. A variety of scratch tests were tried on the profiles shown in FIG. 23, and Examples 6B-D modified for higher CS showed on average better performance against scratching when compared to Example 6A.

Figure 26:
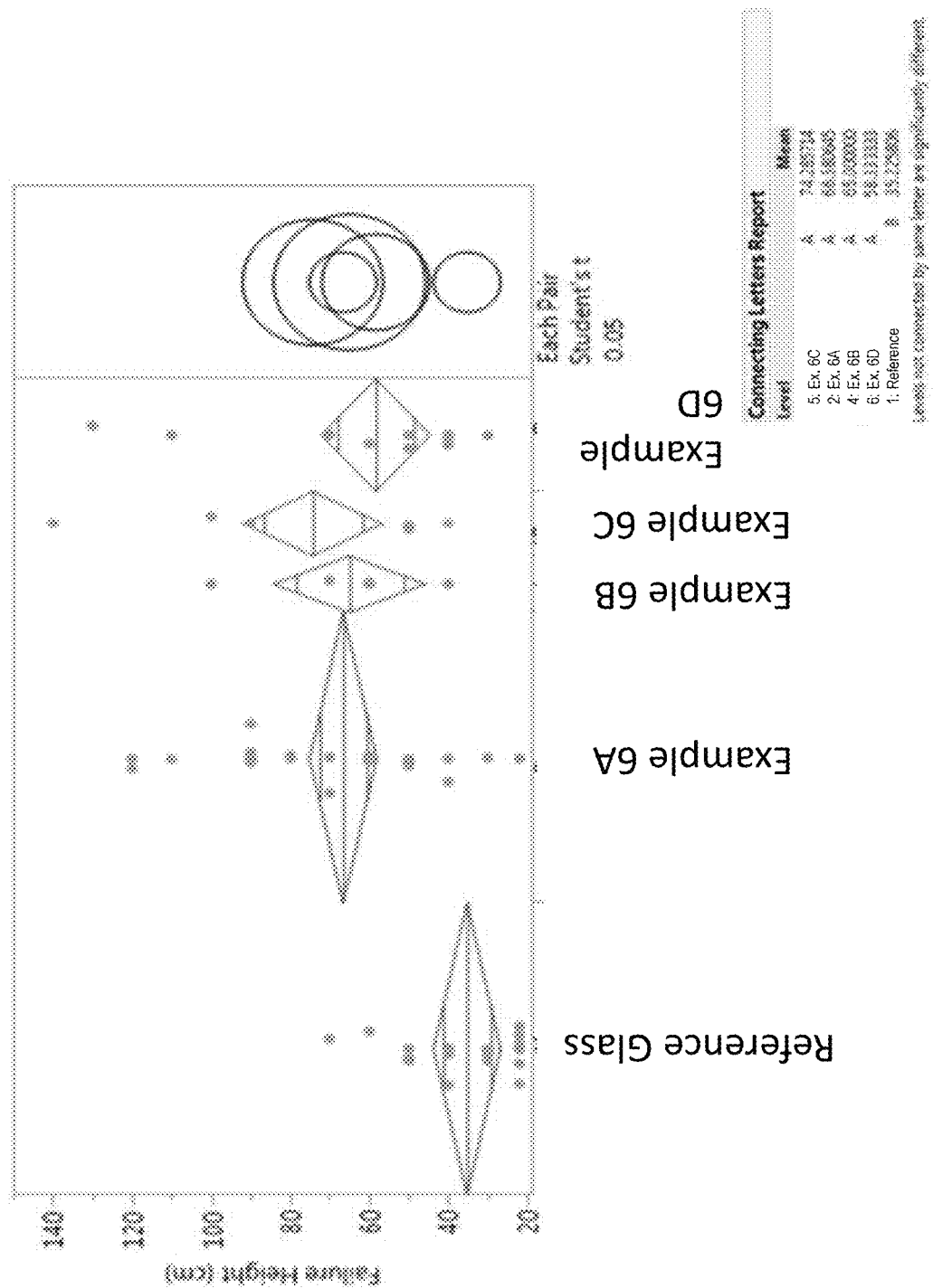
FIG. 26 is a graph comparing the average load to failure of glass-based articles according to one or more embodiments of this disclosure.

FIG. 26 shows the drop performance of samples in a 30 grit sandpaper from the different conditions in Examples 6A-D compared to a reference glass having a nominal value of 57.5 mol % SiO2, 16.5 mol % Al2O3, 16.5 mol % Na2O, 2.8 mol % MgO, 6.5 mol % P2O5, and 0.05 mol % SnO2. One can notice that Examples 6A-D have similar performance and have an improvement in drop performance in comparison to the reference glass. In some embodiments, desirable stress profiles are resistant to fracture upon face-drop on a rough surface. In FIG. 26 are shown the controlled drop tests of samples on a 30 grit sandpaper from the different conditions in the inventive glass compared to the reference glass which has the most fracture-resistant profile for this test among cover glasses on products that have recently reached the market. One can notice that all the tested profiles with large depth of compression DOC>130 um have similar performance in this test, and have a substantial improvement in drop performance in comparison to the reference glass. That leads us to believe that these nonlinear-diffusion curved profiles with a spike and large DOC can provide a significant improvement in drop performance, and in some cases improved scratch resistance.

Example 7

Examples 7A, and Comparative Examples 7B-7D included glass substrates in accordance with one or more embodiments of the disclosure, having a thickness of 0.8 mm and having a nominal composition of 64 mol % $SiO_2$, 15 mol % $Al_2O_3$, 2.4 mol % $B_2O_3$, 9.2 mol % $Na_2O$, 5.9 mol % $Li_2O$, 1.2 mol % ZnO, 2.5 mol % P2O5. 0.05 mol % $SnO_2$, using 3 different mixtures of $NaNO_3$ and KNO3. The glass substrates of Examples 7A-7D were ion exchanged in a molten salt bath(s) including to the conditions provided in Table 19, with the resulting properties also listed in that table.

TABLE 19

IOX Conditions and Resultant Properties for Example 7

| Parameter | 7A. DIOX Step1 4.0 h, 380 C. 70% Na/ 30% K | 7A DIOX Step2 40 min, 380 C. 7% Na/ 93% K | 7B. SIOX 4.0 h, 380 C. 70% Na/ 30% K | 7C SIOX 3.5 h, 390 C. 40% Na/ 60% K | 7D SIOX 3.6 h, 390 C. 28% Na/ 72% K |
|---|---|---|---|---|---|
| Na:K molar ratio | 2.28 | 0.09 | 2.78 | 0.79 | 0.46 |
| Surface CS | 400 MPa | 800 MPa | 400 MPa | 550-570 MPa | — |
| $CS_k$ | 160 MPa | 125 MPa | 160 MPa | 125 MPa | Lower than others |
| $DOL_{sp}$ | 9.4 microns | 8.7 microns | 9.4 microns | 8.7 microns | Larger than others |
| DOC | — | 160 microns | 160 microns | 160 microns | About the same as others |
| CT | 70 MPa | 50-55 MPa | 70 MPa | — | — |
| Curve in FIG. 28 | — | 2804 | 2801 | 2802 | 2803 |

FIG. 2

36 shows 3 stress profiles, namely curves 2801, 2802, and 2803 corresponding to Comparative Examples 7B3-D, and measured by RNF (refracted near-field scan). Due to the limited resolution of RNF, the surface CS of the spike is not fully represented (the spike is rounded in the RNF profile and has lower maximum stress than the actual CS). The salt mixtures have 70, 40, and 28% $NaNO_3$ by weight, the rest of the mass being $KNO_3$, and up to 0.5 wt % silicic acid for eliminating effects of salt contaminants. This corresponds to Na:K molar ratio in the salt of 2.78, 0.79, and 0.46, respectively. All three profiles were obtained using ion-exchange conditions that lead to a regime of stable DOC, and high CT, obtained by about 3.5 hour ion exchange at 390 C (curve 2802), or about 4 hour at 380° C. (curves 2801 and 2803). As can be seen from the figure, decreasing the Na:K molar ratio leads to substantial increase in the surface CS of the spike, but this is achieved at the expense of significant loss of stress $CS_k$ at the bottom of the spike, and hence significant loss of compressive stress area beyond the spike (depth integral of compressive stress from the surface to the DOC, but especially from bottom of the spike to the DOC). A phone having cover glass with a stress profile like the first SIOX profile (70% $NaNO_3$, curve 2801) in FIG. 28 will have good resistance to fracture from deep damage introduction when dropped on a crude surface, but may tend to have failures from overstress of shallow flaws around the edge or on the back side (e.g., when falling on its edge or when hitting against a blunt object) because of the relatively low surface CS. A phone having cover glass with a stress profile having the third stress profile (28% $NaNO_3$, curve 2803) will have better resistance to fracture from significant overstress of shallow flaws, but less resistance to fracture from deep damage introduction from sharp contact. The intermediate profile (40% NaNO3 by weight, curve 2802) will exhibit a compromise between the two main modes of fracture. However, it would be beneficial to have a spike with higher CS than the third profile (28% NaNO3, curve 2803), but at the same time have a similar compression integral over the entire compression zone (e.g., similar to the first profile, curve 2801, 70% NaNO3). It would be further beneficial to increase the compressive stress at depths>0.3 DOC, and to further increase DOC. The curve 2804, produced according to some embodiments disclosed herein, achieves these goals.

Figure 36:
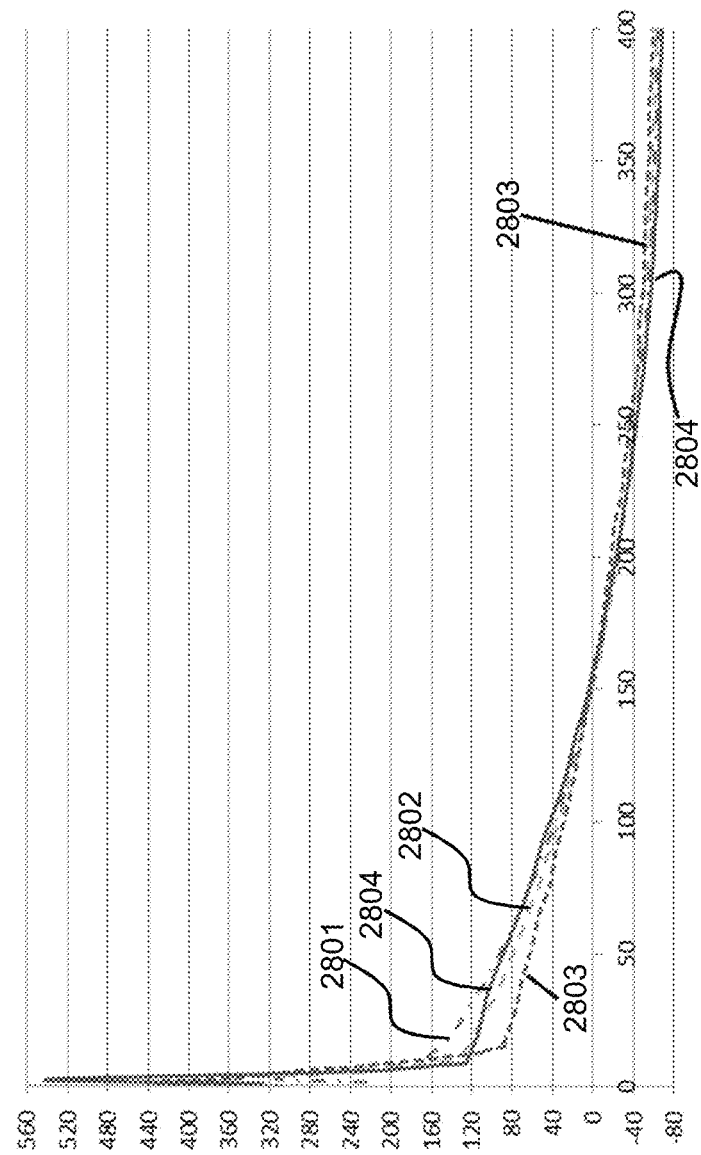
FIG. 36 is a graph showing various stress profiles according to some embodiments.

FIG. 36 shows a DIOX stress profile according to some embodiments of the present invention cure 2804 (Example 7A), together with three SIOX profiles (curves 2801-2803 of Comparative Examples 7B-7D) for the same 0.8 mm-thick Corning Incorporated glass having a nominal composition of 64 mol % $SiO_2$, 15 mol % $Al_2O_3$, 2.4 mol % $B_2O_3$, 9.2 mol % $Na_2O$, 5.9 mol % $Li_2O$, 1.2 mol % ZnO, 2.5 mol % P2O5. 0.05 mol % $SnO_2$. The DIOX profile was obtained by a first step of ion exchange for 4 hours at 380 C in a salt having 70% $NaNO_3$ and 30% $KNO_3$ by weight (Na:K ratio of 2.78), and a second step of ion exchange for 40 min at 380 C in a salt having 7% $NaNO_3$ and 93% $KNO_3$ by weight (Na:K ratio of about 0.09). As can be seen, the Na:K ratio in the second bath is about 31 times lower than that in the first bath, and the second-bath effective ion exchange time is about 6 times shorter than the first-step ion-exchange time. The first step developed a surface spike due to K enrichment, having a surface CS of about 400 MPa and $DOL_{sp}$ of about 9.4 µm. The second step increased the CS of the spike to about 800 MPa, and also resulted in an effective $DOL_{sp}$ of about 8.7 µm. Note that the apparent reduction in the $DOL_{Sp}$ in this particular example is an artifact resulting from a change in the shape of the spike, from mostly linear shape after step 1 to a somewhat curved shape with positive curvature after step 2. Since the DOLs, in both cases is calculated assuming a linear spike, the $DOL_{sp}$ appears to be somewhat smaller after step 2. This mostly means that the high-compression portion of the spike developed during step 2 is somewhat shallower than the original depth of the spike after step 1. In other examples, particularly with thinner glass (e.g., 0.5 mm) where the effective diffusion time of the second step is only 3-5 times shorter than that of the first step, and where the CS change from step 1 to step 2 is less pronounced, the effective $DOL_{Sp}$ after step 2 is similar and often somewhat larger than that of the first-step $DOL_{sp}$.

Samples were prepared according to Example 7A, and Knoop Scratch Threshold (KST) was measured as described above. The KST was greater than 10 and less than 16.

Figure 37:
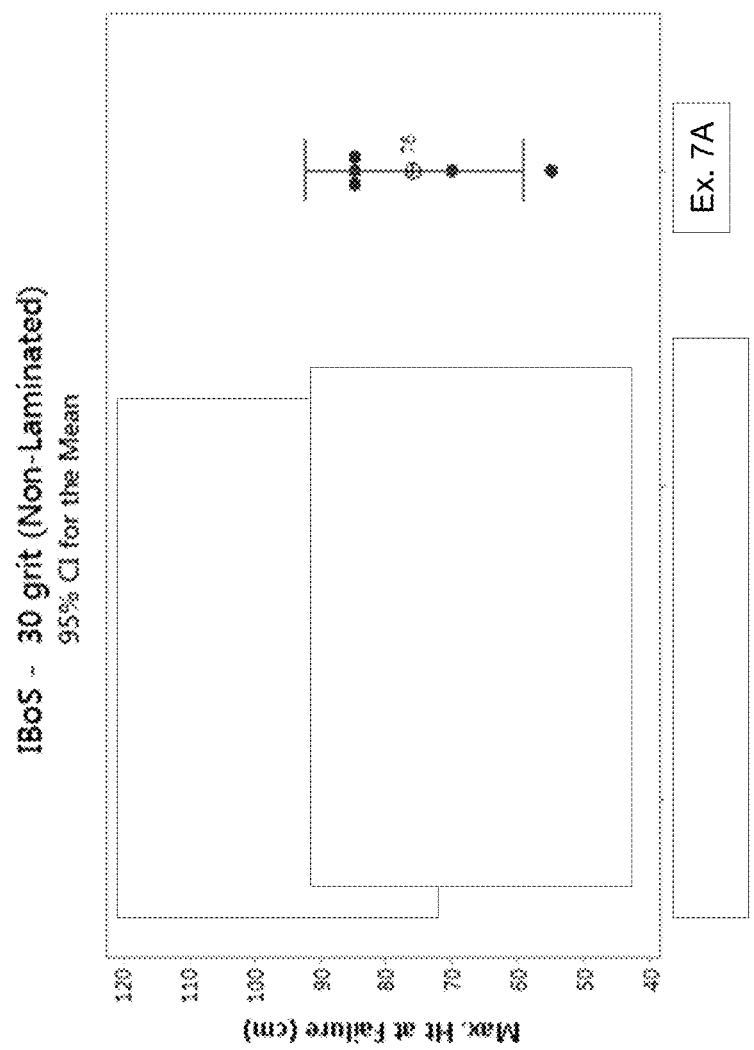
FIG. 37 is a graph showing IBoS test results for samples according to some embodiments.

Further, an IBoS test was performed on the samples, with a stainless steel ball having a weight of 4.2 grams and a diameter of 10 mm, and 30 grit non-laminated sandpaper. The results of the IBoS test are shown in FIG. 37. Particularly, the average drop height survived was 76 cm. Sixty percent (3 out of 5) samples survived a drop height of over 80 cm. More specifically, the strengthened glass articles had at least a 60% survival rate when subjected to an IBoS test with a 4.2 g stainless steel ball having a diameter of 10 mm from a height of about 80 cm onto a 30 grit sandpaper positioned above the surface of the glass so there is a 100 µm air gap between the sandpaper and the surface of the glass, wherein the survival rate was based on testing at least 5 samples.

Impact threshold value testing was then conducted with the apparatus as shown in FIGS. 29 to 35, i.e., on both the major surface of the samples, as well as on its edges. The results are shown in FIG. 38 for face impact, and in FIG. 39 for edge impact.

More specifically, for the face impact test, 180 grit sandpaper was used, and a 110 mm×56 mm×0.8 mm substrate having a bullnose finished edge was put into a 0.4 m bend radius according to FIG. 34. As can be seen from FIG. 38, the samples according to Example 7 were able to survive an impact force of over 200 N, for example 250 N or more, 300 N or more, 350 N or more, 400 N or more, 450 N or more, 500 N or more, 550 N or more, 600 N or more, 650 N or more, 700 N or more, 750 N or more, 800 N or more, and even 850 N or more. In fact, the samples of Example 7A reached the highest impact load of 851 N and did not break.

Figure 38:
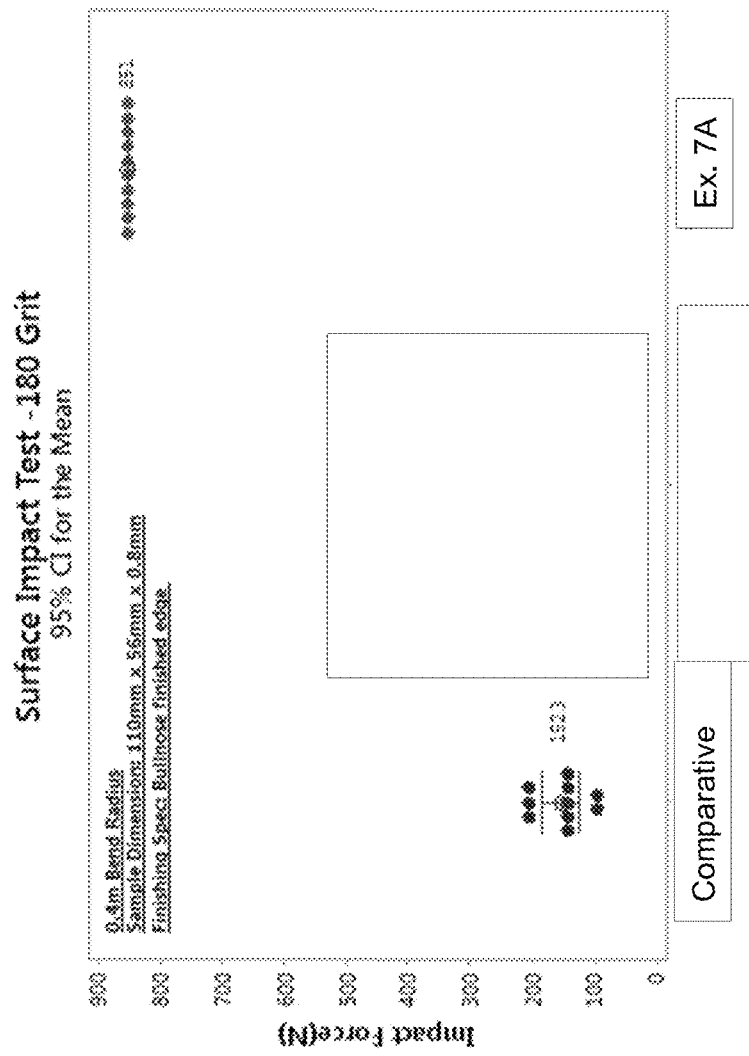
FIG. 38 is a graph showing surface Impact Threshold Test results for samples according to some embodiments, and to some Comparative samples.

The results of the samples of Example 7A are compared to another glass labeled "Comparative" in FIG. 38, but not necessarily Comparative Examples 7B-D. In particular, the Comparative Sample set consists of commercially available alkali aluminosilicate glasses (Dragontrail® Glass, manufactured by Asahi Glass Company) of identical composition (nominal composition about 65 mol % $SiO_2$, about 8 mol % $Al_2O_3$, about 12 mol % $Na_2O$, about 4 mol % $K_2O$, about 0.3 mol % CaO, about 10 mol % MgO, and about 0.5 mol % $ZrO_2$) and thickness (0.8 mm). The glasses of the Comparative sample set were ion exchanged so as to have a compressive depth of layer DOL of 24 µm and a surface compressive stress CS of 804 MPa. In contrast, the samples in the Comparative set reached an average impact force of only about 152 N, with only three out of 10 (or 30%) of the samples surviving an impact force of over 200 N. Accordingly, the strengthened glass according to the present disclosure, and to Example 7 in particular, is well suited to use in a mobile device, wherein drop is likely.

Figure 39:
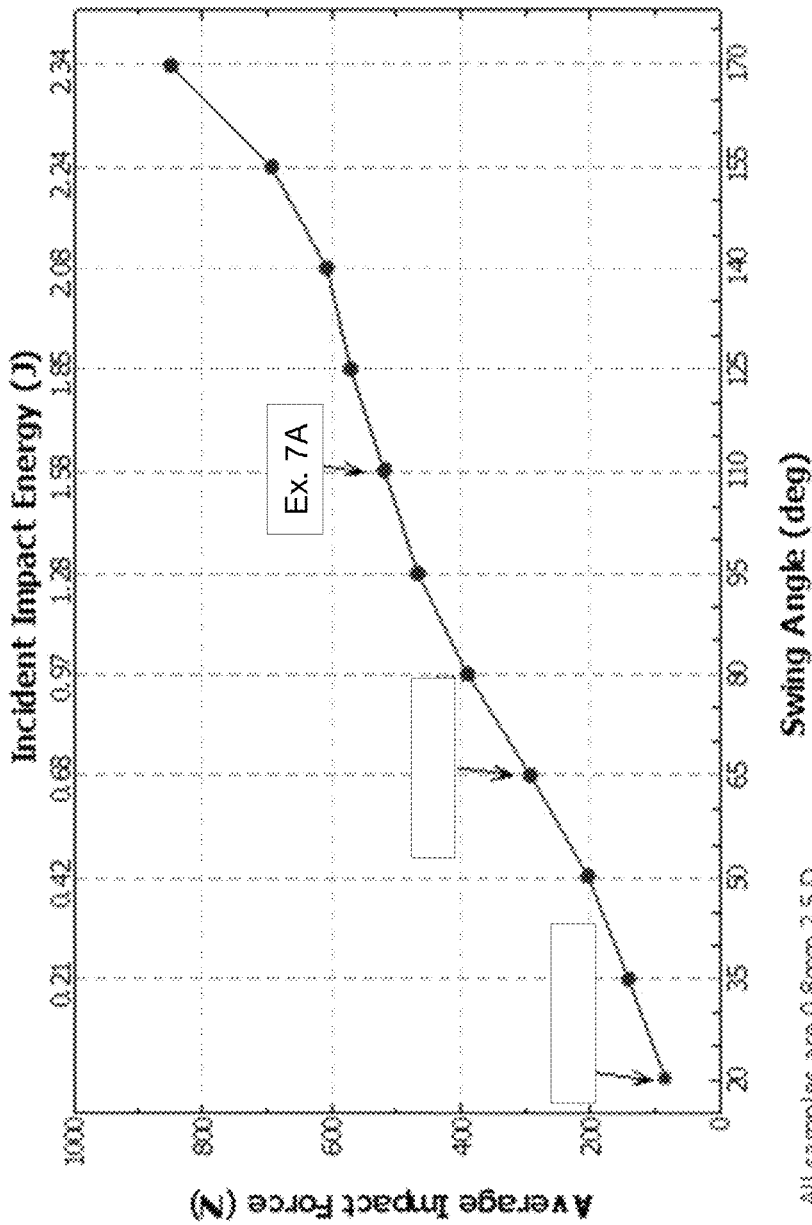
FIG. 39 is a graph showing edge impact test results for samples according to some embodiments.

Next, samples according to Example 7A were tested with the configuration of FIG. 35 to evaluate the survival when the glass edge is impacted by sharp contact. The results are shown in FIG. 39. The arrow labeled for the glass of Example 7A highlights the impact force (N) or Impact Energy (J) where the onset of glass fracture was observed, so higher values translate to improved performance. In the case of samples of Example 7A, all samples that were tested survived the 1.28 J condition but then all fractured at 1.58 J. All samples used to generate this plot were ion exchanged, had 2.5D geometry: having ~0.8 mm thickness in center and ~0.3 mm at the edge. Accordingly, according to some embodiments, glass-based articles made according to Example 7A can survive an edge impact force of 400 N or more (for example 450 N), or an impact energy of 1.28 J or more.

It will be apparent to those skilled in the art that various modifications and variations can be made without departing from the spirit or scope of the disclosure.

For example, the glass-based articles disclosed herein may be incorporated into another article such as an article with a display (or display articles) (e.g., consumer electronics, including mobile phones, tablets, computers, navigation systems, wearable devices (e.g., watches) and the like), architectural articles, transportation articles (e.g., automotive, trains, aircraft, sea craft, etc.), appliance articles, or any article that would benefit from some transparency, scratch-resistance, abrasion resistance or a combination thereof. An exemplary article incorporating any of the glass-based articles disclosed herein is shown in FIGS. 40A and 40B. Specifically, FIGS. 40A and 40B show a consumer electronic device 4100 including a housing 4102 having front 4104, back 4106, and side surfaces 4108; electrical components (not shown) that are at least partially inside or entirely within the housing and including at least a controller, a memory, and a display 4110 at or adjacent to the front surface of the housing; and a cover substrate 4112 at or over the front surface of the housing such that it is over the display. In some embodiments, the cover substrate 4112 may include any of the glass-based articles disclosed herein. In some embodiments, at least one of a portion of the housing or the cover glass comprises the glass-based articles disclosed herein.

Additionally, for example, the various features can be combined according to the following exemplary embodiments.

Embodiment 1. A glass-based article comprising:
- a first surface and a second surface opposing the first surface defining a thickness (t) in a range of 0.1 mm and 2 mm; and
- a stress profile extending along the thickness (t),
- wherein at least one point of the stress profile in a first thickness range from about 0·t up to 0.020·t and greater than 0.98·t comprises a tangent with a slope of from about −200 MPa/micrometer to about −25 MPa/micrometer or about 25 MPa/micrometer to about 200 MPa/micrometer,
- wherein all points of the stress profile in a second thickness range from about 0.035·t and less than 0.965·t comprise a tangent with a slope of from about −15 MPa/micrometer to about 15 MPa/micrometer,
- wherein the stress profile comprises a surface CS of from about 200 MPa to about 1100 MPa, and
- wherein the stress profile comprises a DOC ranging from about 0.1·t to 0.25·t.

Embodiment 2. The glass-based article of embodiment 1, wherein all points of the stress profile in the second thickness range comprise a tangent with a slope of from about −2 MPa/micrometer to about 2 MPa/micrometer.

Embodiment 3. The glass-based article of embodiment 1, wherein the second thickness range extends from 0.025·t to 0.035·t, and from 0.965·t to 0.975·t, and all points of the stress profile in the extension of the second thickness range comprise a tangent with a slope of from about −15 MPa/micrometer to about 15 MPa/micrometer.

Embodiment 4. The glass-based article of embodiment 3, wherein all points of the stress profile in the second thickness range comprise a tangent with a slope of from about −2 MPa/micrometer to about 2 MPa/micrometer.

Embodiment 5. The glass-based article of embodiment 1 or embodiment 3, wherein the second thickness range further extends from 0.02·t to 0.025·t, and from 0.975·t to 0.98·t, and all points of the stress profile in the further extension of the second thickness comprise a tangent with a slope of from about −15 MPa/micrometer to about 15 MPa/micrometer.

Embodiment 6. The glass-based article of embodiment 5, wherein all points of the stress profile in the further extension of the second thickness range comprise a tangent with a slope of from about −2 MPa/micrometer to about 2 MPa/micrometer.

Embodiment 7. The glass-based article of any one of embodiments 1-6, wherein the stress profile in the second thickness range forms a power-law profile having a power exponent, wherein the power exponent is between about 1.2 to 3.2.

Embodiment 8. The glass-based article of embodiment 7, wherein the power exponent is between about 1.3 and 2.8.

Embodiment 9. The glass-based article of any one of embodiments 1-8, wherein the surface CS is from about 300, 350, 400, 450, 500, 550, 600, 610, 620 MPa to about 650, 700, 750, 800, 850, 900, 950, 1000 or 1100 MPa.

Embodiment 10. The glass-based article of any one of embodiments 1-9, wherein at least one point of the stress profile in the first thickness range comprises a tangent with a slope of from about −170 MPa/micrometer to about −30 MPa/micrometer or about 30 MPa/micrometer to about 170 MPa/micrometer.

Embodiment 11. The glass-based article of embodiment 10, wherein at least one point of the stress profile in the first thickness range comprises a tangent with a slope of from about −140 MPa/micrometer to about −35 MPa/micrometer or about 35 MPa/micrometer to about 140 MPa/micrometer.

Embodiment 12. The glass-based article of embodiment 1, wherein the first thickness range extends from about 0.02·t up to 0.025·t and greater than 0.975·t to 0.98·t, and at least one point of the stress profile in the extended first thickness range comprises a tangent with a slope of from about −200 MPa/micrometer to about −25 MPa/micrometer or about 25 MPa/micrometer to about 200 MPa/micrometer.

Embodiment 13. The glass-based article of embodiment 12, wherein at least one point of the stress profile in the extended first thickness range comprises a tangent with a slope of from about −170 MPa/micrometer to about −30 MPa/micrometer or about 30 MPa/micrometer to about 170 MPa/micrometer.

Embodiment 14. The glass-based article of embodiment 13, wherein at least one point of the stress profile in the extended first thickness range comprises a tangent with a slope of from about −140 MPa/micrometer to about −35 MPa/micrometer or about 35 MPa/micrometer to about 140 MPa/micrometer.

Embodiment 15. The glass-based article of embodiment 1 or embodiment 12-14, wherein the first thickness range further extends from about 0.025·t up to 0.035·t and greater than 0.965·t up to about 0.975·t, and at least one point of the stress profile in the further extension of the first thickness range comprises a tangent with a slope of from about −200 MPa/micrometer to about −25 MPa/micrometer or about 25 MPa/micrometer to about 200 MPa/micrometer.

Embodiment 16. The glass-based article of embodiment 15, wherein at least one point of the stress profile in the further extension of the first thickness range comprises a tangent with a slope of from about −170 MPa/micrometer to about −30 MPa/micrometer or about 30 MPa/micrometer to about 170 MPa/micrometer.

Embodiment 17. The glass-based article of embodiment 16, wherein at least one point of the stress profile in the further extension of the first thickness range comprises a tangent with a slope of from about −140 MPa/micrometer to about −35 MPa/micrometer or about 35 MPa/micrometer to about 140 MPa/micrometer.

Embodiment 18. The glass-based article of any one of embodiments 1-17, wherein the first thickness range is obtained by ion exchange in a potassium-containing salt.

Embodiment 19. The glass-based article of any one of embodiments 1-18, wherein the second thickness range is obtained by ion exchange in a Na-containing salt.

Embodiment 20. The glass-based article of any one of embodiments 1-19, wherein the stress profile is obtained using a single ion-exchange step.

Embodiment 21. The glass-based article of any one of embodiments 1-19, wherein the stress profile is obtained using two or more ion-exchange steps.

Embodiment 22. The glass-based article of any one of embodiments 1-21, wherein the surface CS is between about 690 MPa and 950 MPa.

Embodiment 23. The glass-based article of any one of embodiments 1-22, wherein the glass-based article comprises a composition comprising from about 0.5 mol % to about 10 mol % P2O5.

Embodiment 24. A glass-based article comprising:
a center plane, wherein the center plane comprises from about 2 to about 20 mol-% Li2O; and
a stress profile extending along the thickness (t),
wherein at least one point of the stress profile in a first thickness range from about 0·t up to 0.020·t and greater than 0.98·t comprises a tangent with a slope of from about −200 MPa/micrometer to about −25 MPa/micrometer or about 25 MPa/micrometer to about 200 MPa/micrometer,
wherein the stress profile comprises a surface CS of from about 200 MPa to about 1100 MPa, and
wherein the stress profile comprises a DOC ranging from about 0.05·t to 0.25·t.

Embodiment 25. The glass-based article of embodiment 24, wherein the first thickness range is obtained by ion exchange in a potassium-containing salt.

Embodiment 26. The glass-based article of embodiment 24, wherein the second thickness range is obtained by ion exchange in a Na- or K-containing salt.

Embodiment 27. The glass-based article of any one of embodiments 24-26, wherein the stress profile is obtained using a single ion-exchange step.

Embodiment 28. The glass-based article of one of embodiments 24-26, wherein the stress profile is obtained using two or more ion-exchange steps.

Embodiment 29. The glass-based article of one of embodiments 24-28, wherein the surface CS ranges from about 690 MPa and 950 MPa.

Embodiment 30. The glass-based article of one of embodiments 24-29, wherein the stress profile in the second thickness range forms a power-law profile having a power exponent, wherein the power exponent is between about 1.2 to 3.4.

Embodiment 31. The glass-based article of embodiment 30, wherein the power exponent is between about 1.3 and 2.8.

Embodiment 32. The glass-based article of one of embodiments 24-31, wherein the glass-based article comprises a composition comprising from about 0.5 mol % to about 10 mol % P2O5.

Embodiment 33. The glass-based article of one of embodiments 24-32, wherein the center-plane further comprises a composition comprising from about 0.5 mol % to about 20 mol % Na2O.

Embodiment 34. The glass-based article of one of embodiments 24-33, wherein the center-plane further comprises a composition comprising from about 2 mol % to about 10 mol % Li2O.

Embodiment 35. The glass-based article of embodiment 33 or embodiment 34, wherein the concentration of Na2O in the center plane of the glass article is from about 5 mol % to about 16 mol %.

Embodiment 36. The glass-based article of embodiment 33 or embodiment 34, wherein the concentration of Na2O in the center plane of the glass article is between about 10 mol % and 15 mol %.

Embodiment 37. The glass-based article of embodiment 36, wherein the concentration of Li2O in the center plane of the glass article is between about 3 mol % and 10 mol %.

Embodiment 38. The glass-based article of any one of embodiments 24-37, wherein over a thickness of from 0·t up to 0.3·t, the stress profile further comprises a tangent comprising a minimum slope and a tangent comprising a maximum slope, wherein the difference between the maximum slope and the minimum slope is 3.5 MPa per micrometer or less.

Embodiment 39. The glass-based article of any one of embodiments 24-38, wherein all points of the stress profile between a thickness from about 0·t to about 0.3·t and from greater than 0.7·t, comprise a tangent that is less than about −0.1 MPa/micrometer, or that is greater than about 0.1 MPa/micrometer.

Embodiment 40. The glass-based article of any one of embodiments 24-39, further comprising a potassium DOL that extends over the first thickness range.

Embodiment 41. The glass-based article of any one of embodiments 24-40, further comprising a first surface and a second surface opposing the first surface defining a thickness (t) in a range of 0.1 mm and 2 mm.

Embodiment 42. The glass-based article of any one of embodiments 1-23, wherein over a thickness of from 0·t up to 0.3·t, the stress profile further comprises a tangent comprising a minimum slope and a tangent comprising a maximum slope, wherein the difference between the maximum slope and the minimum slope is 3.5 MPa per micrometer or less.

Embodiment 43. The glass-based article of any one of embodiments 1-23, or 42, wherein all points of the stress profile between a thickness from about 0·t to about 0.3·t and from greater than 0.7·t, comprise a tangent that is less than about −0.1 MPa/micrometer, or that is greater than about 0.1 MPa/micrometer.

Embodiment 44. The glass-based article of any one of embodiments 1-23, or 42-43, further comprising a potassium DOL that extends over the first thickness range.

Embodiment 45. The glass-based article of any one of embodiments 1-23, or 41-44, further comprising a concentration of metal oxide that decreases from the first surface to a value at a point between the first surface and the second surface and increases from the value to the second surface.

Embodiment 46. A method of chemically strengthening a glass-based substrate comprising a first major surface, a second major surface, an average thickness t extending perpendicularly between the first and second major surfaces, and an edge extending between the first and second major surfaces, the method comprising:
performing a first IOX step by holding the glass-based substrate for a first period of time in a first bath comprising a mixture of sodium and potassium ions;
performing a second IOX step, after the first IOX step, by holding the glass-based substrate for a second period of time in a second bath comprising a mixture of sodium and potassium ions to form a stress profile in the glass-based substrate, the stress profile having a CS region and a CT region;
the second bath has a molar ratio of Na:K that is 3-10 times smaller than the Na:K molar ratio of the first bath.

Embodiment 47. The method of embodiment 46, wherein both steps of ion exchange are completed in a bath including both a Na-containing salt and a K-containing salt, wherein the ratio of Na ions to K ions in the first bath is one of: (i) 2.5 or more times higher than the ratio of Na ions to K ions in the second bath; (ii) 3 or more times higher; (iii) 5 or more times higher; or (iv) 8 or more times higher; and one of: (i) 800 or less times higher; (ii) 600 or less times higher; (iii) 500 or less times higher; and (iv) 400, or less times higher.

Embodiment 48. The method of any one of embodiments 46-47, the second bath has a molar ratio of Na to K that is one of: (i) 0.03 or more; (ii) 0.04 or more; (iii) 0.047 or more; (iv) 0.06 or more; and (v) 0.07 or more, and that is one of less than or equal to: (i) 0.4; (ii) 0.35; (ii) 0.30; (iii) 0.21; (iv) 0.16; or (v) 0.13.

Embodiment 49. The method of any one of embodiments 46-48, an effective diffusion time of the second IOX step is one of: (i) from 1/20 to % that of the first step; (ii) from 1/20 to 1/3 that of the first step; and (iii) from 1/20 to % that of the first step.

Embodiment 50. The method of any one of embodiments 46-49, wherein a surface CS of the glass-based article after the second IOX step is one of: (i) 600 MPa or more; (ii) 650 MPa or more; (iii) 700 MPa or more; (iv) 750 MPa or more; (v) 800 MPa or more; (vi) 850 MPa or more.

Embodiment 51. The method of any one of embodiments 46-50, a $DOL_{sp}$ is: (i) from 0.5 to 1.5% of the thickness when the thickness is from 1 to 1.3 mm; (ii) in the range of from 0.6 to 2% of thickness when the thickness is from 0.8 to 1 mm; (iii) in the range of 0.7 to 2.5% of the thickness when the thickness is from 0.65 to 0.8 mm; (iv) in the range of 0.9 to 3% of the thickness when the thickness is from 0.5 to 0.65 mm; and (v) in the range of 1 to 3% when the thickness is from 0.3 to 0.5 mm.

Embodiment 52. The method of any one of embodiments 46-51, a DOC that is one of: (i) 0.1t or more; (ii) 0.15t or more; (iii) 0.2t or more.

Embodiment 53. The method of any one of embodiments 46-52, the stress profile in the CT region comprises a power-law profile having a power exponent, wherein the power exponent is one of: (i) from 1 to 3.4; (ii) from 1.2 to 3.0; and (iii) from 1.7 to 2.6.

Embodiment 54. The method of any one of embodiments 46-53, the Knoop Scratch Threshold of the strengthened glass-based substrate is greater than 10 N.

Embodiment 55. The method of embodiment 54, the Knoop Scratch Threshold of the strengthened glass-based substrate is less than 16 N.

Embodiment 56. The method of any one of embodiments 46-55, wherein the strengthened glass-based substrate has at least a 60% survival rate when subjected to an inverted ball drop test with a 4.2 g stainless steel ball having a diameter of 10 mm from a height of about 80 cm onto a 30 grit sandpaper positioned above the surface of the glass so there is a 100 μm air gap between the sandpaper and the surface of the glass, wherein the survival rate is based on testing at least 5 samples.

Embodiment 57. The method of any one of embodiments 46-56, wherein the strengthened glass-based substrate has a survival rate of one of: (i) 60% or more; (ii) 70% or more; (iii) 80% or more; (iv) 90% or more; (v) 100% or less, when impacted on one of the first and second major surfaces with a force of one of: (i) 200 N or more; (ii) 250 N or more; (iii) 300 N or more; (iv) 350 N or more; (v) 400 N or more; (vi) 450 N or more; (vii) 500 N or more; (viii) 550 N or more; (ix) 600 N or more; (x) 650 N or more; (xi) 700 N or more; (xii) 750 N or more; (xiii) 800 N or more; (xiv) 850 N or more according to the surface Impact Threshold Test with 180 grit abrasive.

Embodiment 58. The method of embodiment 57, wherein the strengthened glass-based substrate has a survival rate of 100% or less when impacted on one of the first and second major surfaces with a force of 900 N or less according to the surface Impact Threshold Test with 180 grit abrasive.

Embodiment 59. The method of any one of embodiments 46-46, wherein the strengthened glass-based substrate can survive an edge-impact of: (i) more than 300 N; (ii) 400 N or more; (iii) 450 N or more, or an edge-impact of (i) more than 0.68 J; (ii) 0.97 J or more; (iii) 1.28 J or more.

Embodiment 60. The method of embodiment 59, wherein the strengthened glass-based substrate can survive an edge-impact of less than 500 N, or an edge-impact of less than 1.58 J.

Embodiment 61. The glass-based article of any one of embodiments 1-45, the Knoop Scratch Threshold of the strengthened glass-based substrate is greater than 10 N.

Embodiment 62. The glass-based article of embodiment 61, the Knoop Scratch Threshold of the strengthened glass-based substrate is less than 16 N.

Embodiment 63. The glass-based article of any one of embodiments 1-45, wherein the strengthened glass-based substrate has at least a 60% survival rate when subjected to an inverted ball drop test with a 4.2 g stainless steel ball having a diameter of 10 mm from a height of about 80 cm onto a 30 grit sandpaper positioned above the surface of the glass so there is a 100 μm air gap between the sandpaper and the surface of the glass, wherein the survival rate is based on testing at least 5 samples.

Embodiment 64. The glass-based article of any one of embodiments 1-45, wherein the strengthened glass-based substrate has a survival rate of one of: (i) 60% or more; (ii) 70% or more; (iii) 80% or more; (iv) 90% or more; (v) 100% or less, when impacted on one of the first and second major surfaces with a force of one of: (i) 200 N or more; (ii) 250 N or more; (iii) 300 N or more; (iv) 350 N or more; (v) 400 N or more; (vi) 450 N or more; (vii) 500 N or more; (viii) 550 N or more; (ix) 600 N or more; (x) 650 N or more; (xi) 700 N or more; (xii) 750 N or more; (xiii) 800 N or more; (xiv) 850 N or more, according to the surface Impact Threshold Test with 180 grit abrasive.

Embodiment 65. The glass-based article of embodiment 64, wherein the strengthened glass-based substrate has a survival rate of 100% or less when impacted on one of the first and second major surfaces with a force of 900 N or less according to the surface Impact Threshold Test with 180 grit abrasive.

Embodiment 66. The glass-based article of any one of embodiments 1-45, wherein the strengthened glass-based substrate can survive an edge-impact of: (i) more than 300 N; (ii) 400 N or more; (iii) 450 N or more, or an edge-impact of (i) more than 0.68 J; (ii) 0.97 J or more; (iii) 1.28 J or more.

Embodiment 67. The glass-based article of embodiment 66, wherein the strengthened glass-based substrate can survive an edge-impact of less than 500 N, or an edge-impact of less than 1.58 J.

Embodiment 68. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover substrate disposed over the display,
wherein at least one of a portion of the housing or the cover substrate comprises the glass-based article of any one of embodiments 1-45, or 61-67.

What is claimed is:
1. A glass-based article comprising:
a first surface and a second surface opposing the first surface defining a thickness (t) in a range of 0.1 mm and 2 mm; and a stress profile extending along the thickness (t) according to a mathematical formula that is a function of the thickness, wherein all points of the mathematical formula for stress profile in a first thickness range from about 0·t up to 0.020·t and greater than 0.98·t comprises a tangent with a slope of from about −200 MPa/micrometer to about −25 MPa/micrometer or about 25 MPa/micrometer to about 200 MPa/micrometer, wherein all points of the mathematical formula for stress profile in a second thickness range from 0.035·t to less than 0.965·t comprise a tangent with a slope of from about −15 MPa/micrometer to about 15 MPa/micrometer, wherein the mathematical formula for stress profile along the span of the second thickness range forms a power-law function having a power exponent, wherein the power exponent is from about 1.2 to about 3.2, and wherein the stress profile comprises a surface compressive stress of from about 300 MPa to about 1100 MPa and a maximum central tension of 50 MPa or more.

2. The glass-based article of claim 1, wherein the stress profile comprises a depth of compression ranging from about 0.1·t to 0.25·t.

3. The glass-based article of claim 1, further comprising a maximum central tension that is less than or equal to 80 MPa.

4. The glass-based article of claim 1, wherein all points of the stress profile in the second thickness range comprise a tangent having a slope of from about −2 MPa/micrometer to about 2 MPa/micrometer.

5. The glass-based article of claim 3, wherein the first thickness range extends from about 0.02·t up to 0.025·t and greater than 0.975·t to 0.98·t, and all points of the mathematical formula for stress profile in the extended first thickness range comprises a tangent with a slope of from about −200 MPa/micrometer to about −25 MPa/micrometer or about 25 MPa/micrometer to about 200 MPa/micrometer.

6. The glass-based article of claim 5, wherein the first thickness range further extends from about 0.025·t up to 0.035·t and greater than 0.965·t up to about 0.975·t, and all points of the mathematical formula for stress profile in the further extension of the first thickness range comprises a tangent with a slope of from about −200 MPa/micrometer to about −25 MPa/micrometer or about 25 MPa/micrometer to about 200 MPa/micrometer.

7. The glass-based article of claim 2, wherein the thickness (t) is less than or equal to 1 mm, the surface compressive stress is greater than or equal to 500 MPa, and the depth of compression is greater than or equal to 0.14·t.

8. The glass-based article of claim 2, further comprising a potassium depth of layer that extends over the first thickness range.

9. The glass-based article of claim 2, wherein at least one of:
(i) the Knoop Scratch Lateral Cracking Threshold of the strengthened glass-based substrate is greater than 10 N and is less than 16 N;
(ii) the strengthened glass-based substrate has a survival rate of from 40% to 100%, when impacted on one of the first and second major surfaces with a force of 400 N or more according to the surface Impact Threshold Test with 180 grit abrasive; and
(iii) the strengthened glass-based substrate can survive an edge-impact of from more than 300 N to less than 500 N, or an edge-impact of from more than 0.68 J to less than 1.58 J according to the edge Impact Threshold Test with 30 grit abrasive.

10. A glass-based article comprising:
a center plane, wherein the center plane comprises from about 2 to about 20 mol-% $Li_2O$;
a maximum central tension of 50 MPa or more, and
a stress profile extending along the thickness (t) according to a mathematical formula that is a function of the thickness, wherein all points of the mathematical formula for stress profile in a first thickness range from about 0·t up to 0.020·t and greater than 0.98·t comprises a tangent with a slope of from about −200 MPa/micrometer to about −25 MPa/micrometer or about 25 MPa/micrometer to about 200 MPa/micrometer, wherein a mathematical formula for stress profile along the span of a second thickness range, extending from 0.035·t to less than 0.965·t, forms a power-law function having a power exponent, wherein the power exponent is from about 1.2 to about 3.4, wherein the stress profile comprises a depth of compression ranging from about 0.05·t to 0.25·t.

11. The glass-based article of claim 10, wherein the stress profile comprises a surface compressive stress of from about 300 MPa to about 1100 MPa.

12. The glass-based article of claim 10, further comprising a maximum central tension that is less than or equal to 80 MPa.

13. The glass-based article of claim 11, further comprising a first surface and a second surface opposing the first surface defining a thickness (t) in a range of 0.1 mm to 1 mm, wherein the surface compressive stress is greater than or equal to 500 MPa, and the depth of compression is greater than or equal to 0.14·t.

14. The glass-based article of claim 11, wherein the glass-based article comprises a composition comprising about 0.5 mol % to about 10 mol % $P_2O_5$.

15. The glass-based article of claim 11, wherein the center plane further comprises a composition comprising from about 0.5 mol % to about 20 mol % $Na_2O$.

16. The glass-based article of claim 11, further comprising a potassium depth of layer that extends over the first thickness range.

17. The glass-based article of claim 11, wherein the surface compressive stress ranges from about 690 MPa to 1100 MPa.

18. The glass-based article of claim 10, wherein all points of the stress profile in the second thickness range comprise a tangent having a slope of from about −2 MPa/micrometer to about 2 MPa/micrometer.

19. The glass-based article of claim 10, wherein the first thickness range extends from about 0.02·t up to 0.025·t and greater than 0.975·t to 0.98·t, and all points of the mathematical formula for stress profile in the extended first thickness range comprises a tangent with a slope of from about −200 MPa/micrometer to about −25 MPa/micrometer or about 25 MPa/micrometer to about 200 MPa/micrometer.

20. The glass-based article of claim 19, wherein the first thickness range further extends from about 0.025·t up to 0.035·t and greater than 0.965·t up to about 0.975·t, and all points of the mathematical formula for stress profile in the further extension of the first thickness range comprises a tangent with a slope of from about −200 MPa/micrometer to about −25 MPa/micrometer or about 25 MPa/micrometer to about 200 MPa/micrometer.

* * * * *